United States Patent
Uemura

(10) Patent No.: US 8,488,371 B2
(45) Date of Patent: Jul. 16, 2013

(54) STATIC RANDOM ACCESS MEMORY

(75) Inventor: Taiki Uemura, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 171 days.

(21) Appl. No.: 13/213,559

(22) Filed: Aug. 19, 2011

(65) Prior Publication Data

US 2012/0155152 A1  Jun. 21, 2012

(30) Foreign Application Priority Data

Dec. 17, 2010  (JP) .................................. 2010-282420

(51) Int. Cl.
*G11C 11/00* (2006.01)

(52) U.S. Cl.
USPC ............................. 365/154; 257/903; 365/156

(58) Field of Classification Search
None
See application file for complete search history.

(56) References Cited

U.S. PATENT DOCUMENTS

| 6,781,869 B2* | 8/2004 | Ohbayashi et al. ........... 365/154 |
| 7,079,413 B2* | 7/2006 | Tsukamoto et al. .......... 365/154 |
| 7,502,275 B2* | 3/2009 | Nii et al. ...................... 365/226 |

FOREIGN PATENT DOCUMENTS

| JP | 11-017134 A | 1/1999 |
| JP | 2000-048564 A | 2/2000 |

OTHER PUBLICATIONS

Ibe et al., Chapter 6 entitled "Reliable Memory Cell Design for Environmental Radiation-Induced Failures in SRAM," from Low Power and Reliable SRAM Memory Cell and Array Design, Springer-Verlag, 2011, pp. 89-124.*

* cited by examiner

*Primary Examiner* — Alexander Sofocleous
(74) *Attorney, Agent, or Firm* — Fujitsu Patent Center

(57) ABSTRACT

In a random access memory, one of a first conductivity type well constituting a first bit in one column group and another first conductivity type well constituting a second bit selected simultaneously to the first bit in an adjacent column group, is isolated from a common well of the first conductivity type by providing a deep well of a second conductivity type, such that the area of the deep well of the second conductivity type does not exceed the area of one column group.

17 Claims, 36 Drawing Sheets

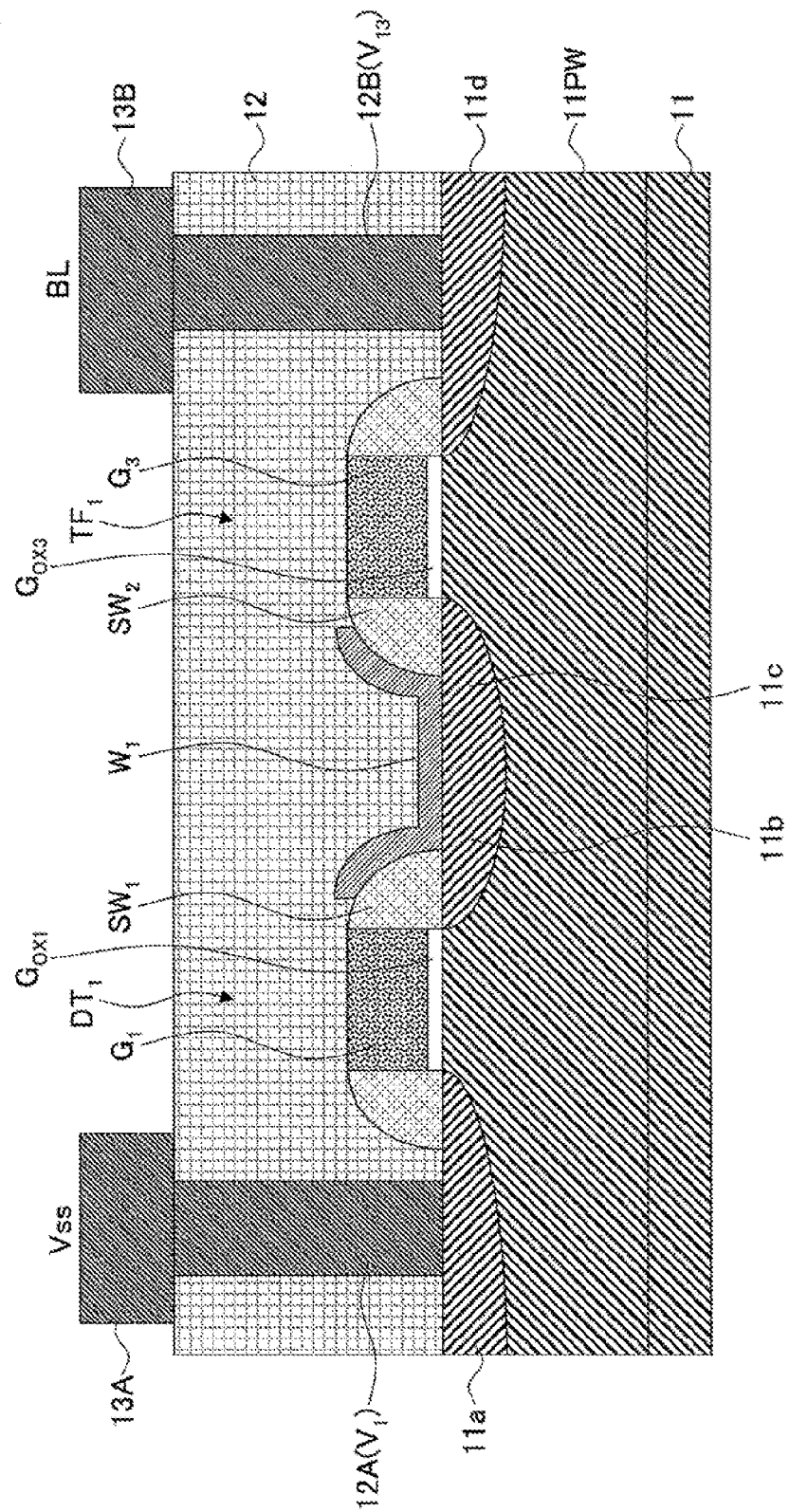

FIG.6A

| | CS$_1$ BL(04) | CS$_2$ BL(08) | CS$_3$ BL(12) | CS$_4$ BL(16) | CS$_5$ BL(20) | CS$_6$ BL(24) | CS$_7$ BL(28) | CS$_8$ BL(32) | Parity A |
|---|---|---|---|---|---|---|---|---|---|
| WL(01) | 1 | 0 | 1 | 0 | 1 | 0 | 0 | 0 | 1 |
| WL(02) | 1 | 1 | 1 | 0 | 0 | 0 | 1 | 1 | 1 |
| WL(03) | 1 | 0 | 0 | 0 | 1 | 0 | 0 | 1 | 1 |
| WL(04) | 0 | 0 | 1 | 0 | 0 | 1 | 0 | 0 | 0 |
| WL(05) | 0 | 1 | 1 | 1 | 1 | 1 | 1 | 0 | 1 |
| WL(06) | 0 | 0 | 1 | 0 | 0 | 0 | 0 | 1 | 0 |
| WL(07) | 1 | 0 | 0 | 0 | 1 | 0 | 0 | 0 | 1 |
| WL(08) | 1 | 0 | 1 | 1 | 1 | 0 | 1 | 0 | 0 |
| Parity B | 1 | 0 | 1 | | | | | | |

FIG.6B

|  | CS₁ BL(04) | CS₂ BL(08) | CS₃ BL(12) | CS₄ BL(16) | CS₅ BL(20) | CS₆ BL(24) | CS₇ BL(28) | CS₈ BL(32) | Parity A |
|---|---|---|---|---|---|---|---|---|---|
| WL(01) | (0) | 0 | 1 | 0 | 1 | 0 | 0 | 0 | 1 ←error |
| WL(02) | 1 | 1 | 1 | 0 | 0 | 0 | 1 | 1 | 1 |
| WL(03) | 1 | 0 | 0 | 0 | 1 | 0 | 0 | 1 | 1 |
| WL(04) | 0 | 0 | 1 | 0 | 0 | 1 | 1 | 0 | 1 |
| WL(05) | 0 | 1 | 1 | 1 | 1 | 0 | 1 | 0 | 0 |
| WL(06) | 0 | 0 | 0 | 0 | 0 | 0 | 0 | 1 | 1 |
| WL(07) | 1 | 0 | 0 | 0 | 1 | 0 | 0 | 1 | 0 |
| WL(08) | 1 | 0 | 1 | 1 | 1 | 0 | 1 | 0 | 1 |
| Parity B | 1 ←error | 0 | 0 | 1 | 1 | 0 | 1 | 0 | 0 |

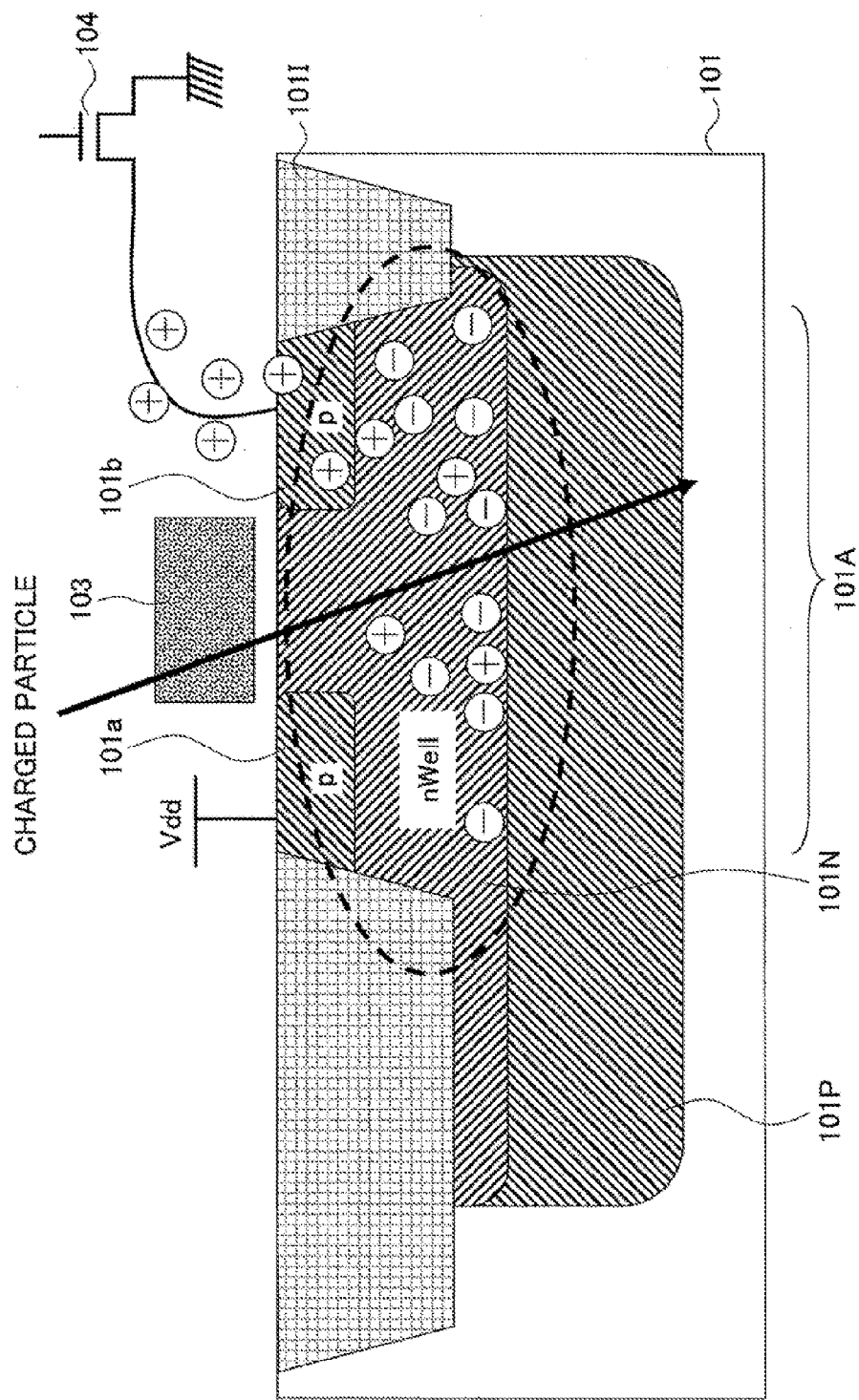

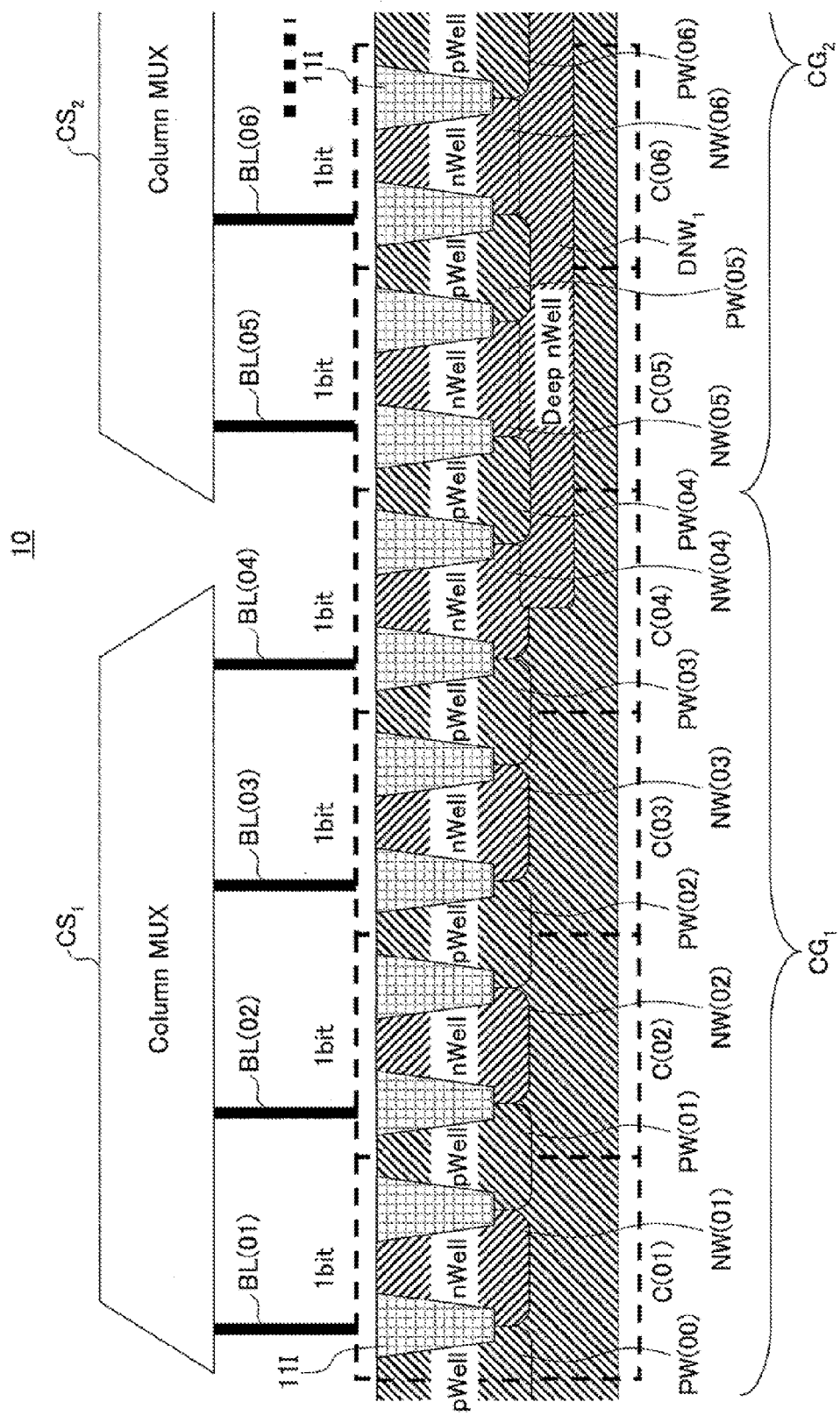

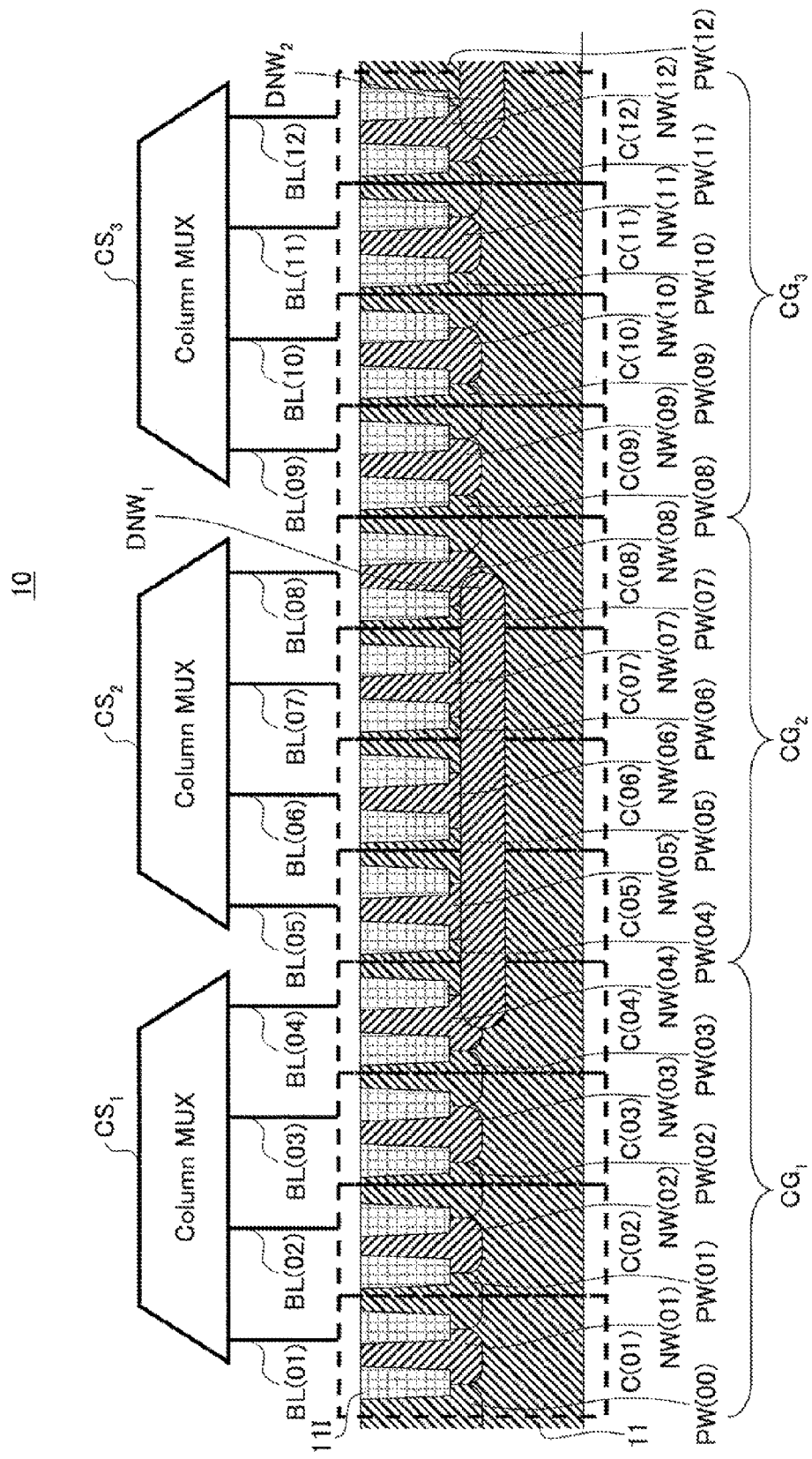

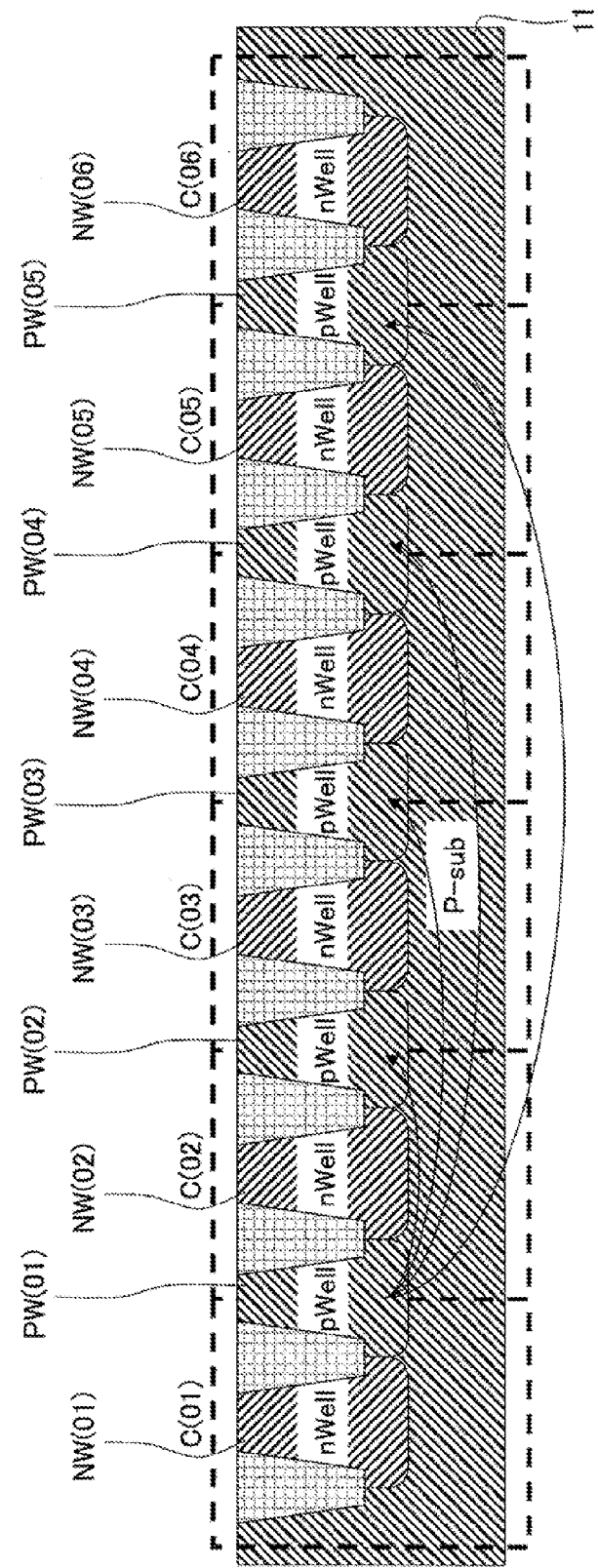

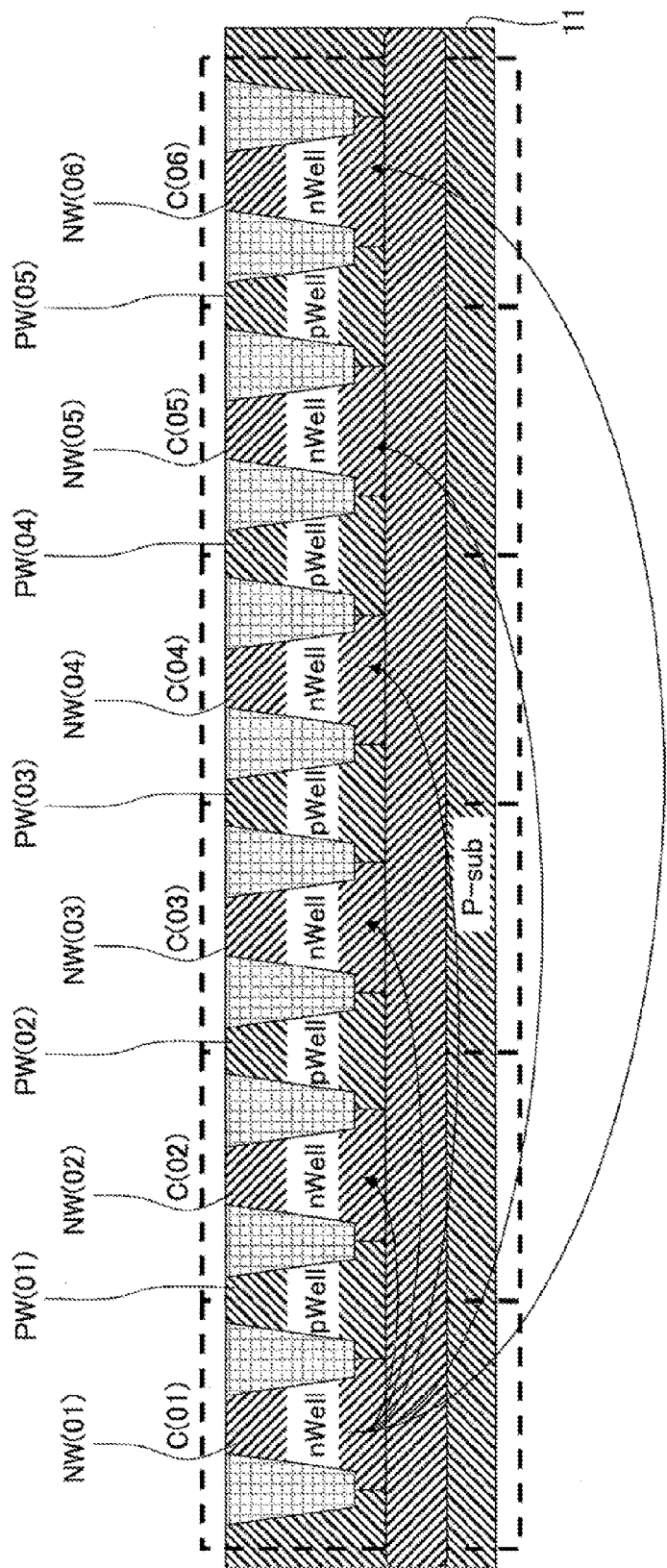

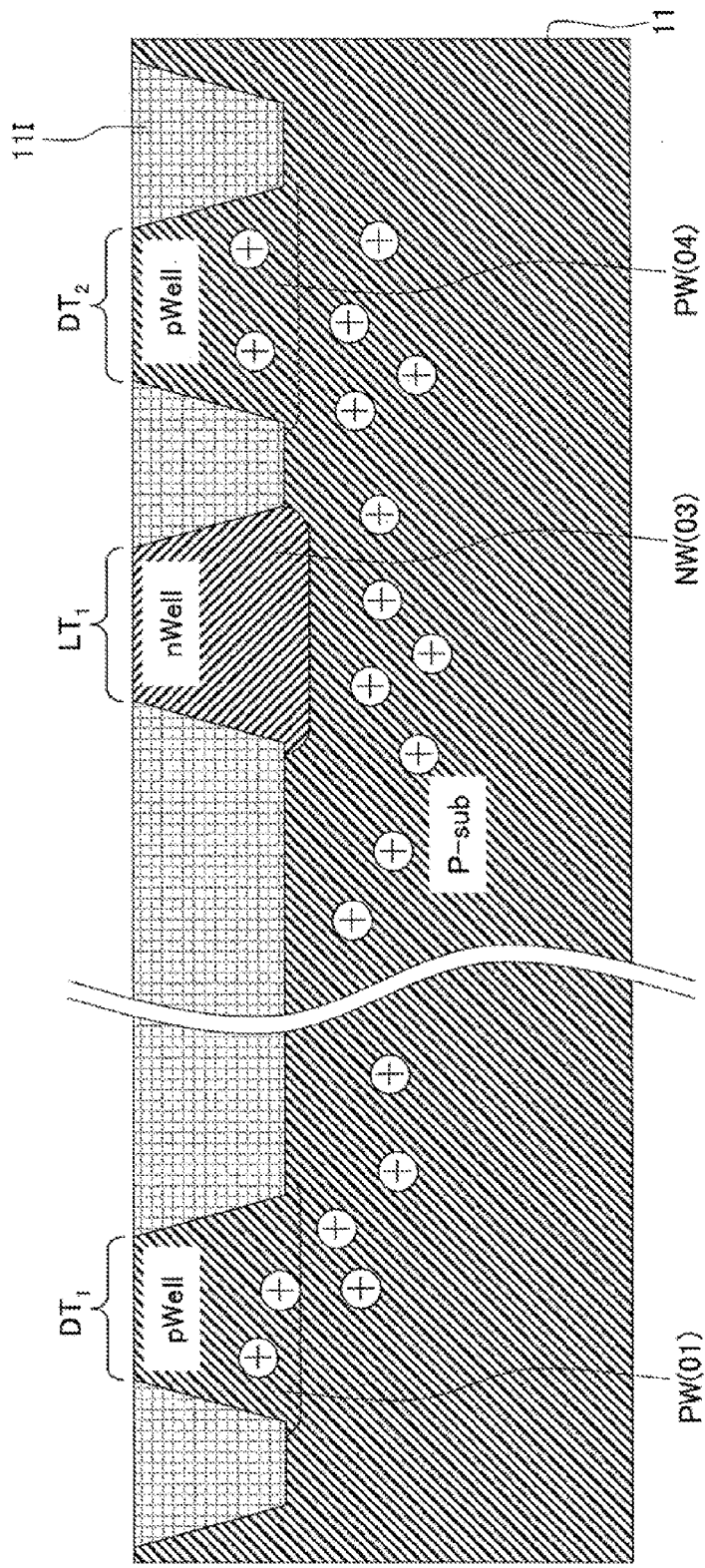

FIG.12

| A0 | A1 | E0 | E1 | E2 | E3 |
|----|----|----|----|----|----|
| 0  | 0  | 0  | 0  | 0  | 1  |
| 1  | 0  | 0  | 0  | 1  | 0  |
| 0  | 1  | 0  | 1  | 0  | 0  |
| 1  | 1  | 1  | 0  | 0  | 0  |

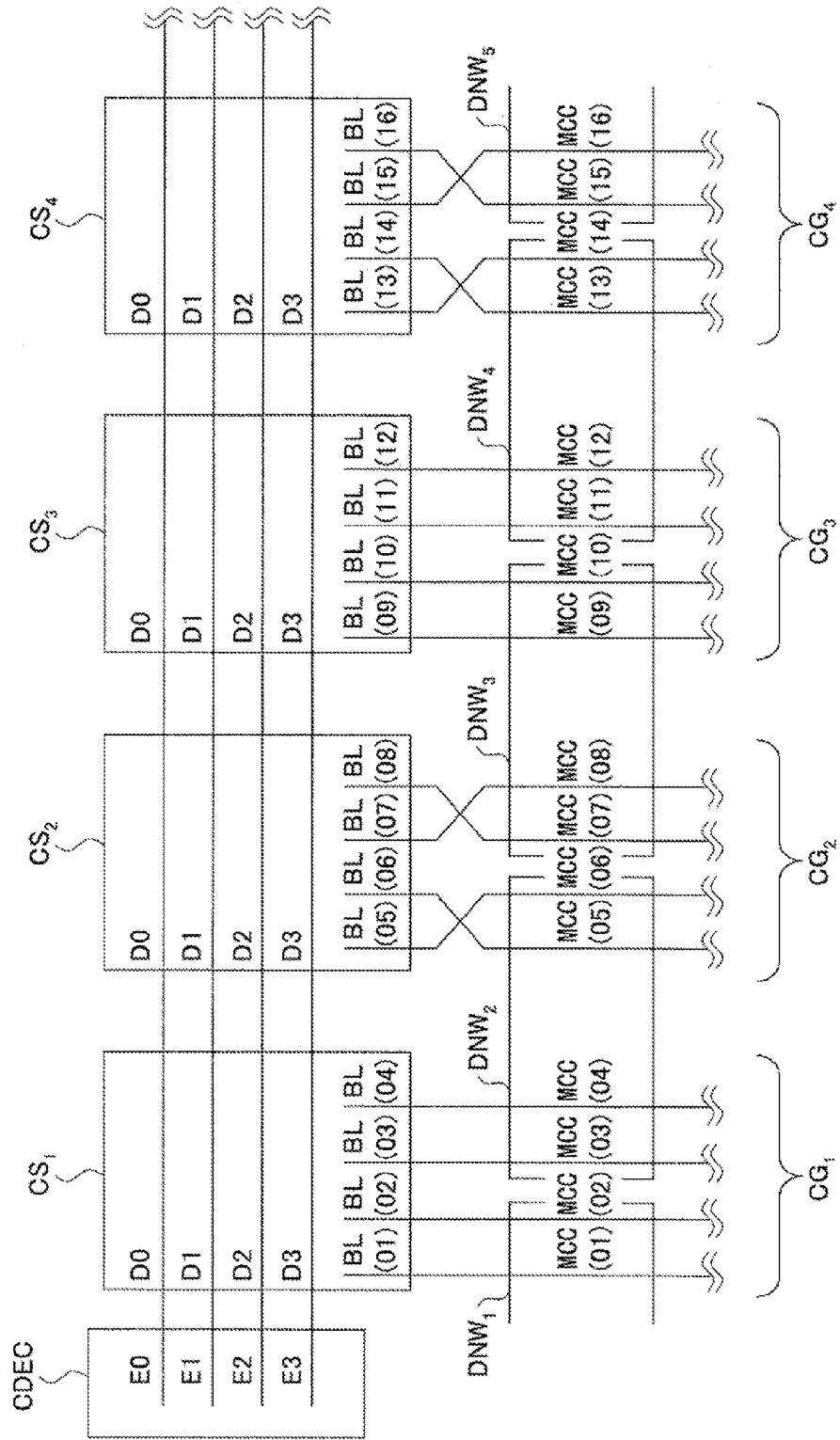

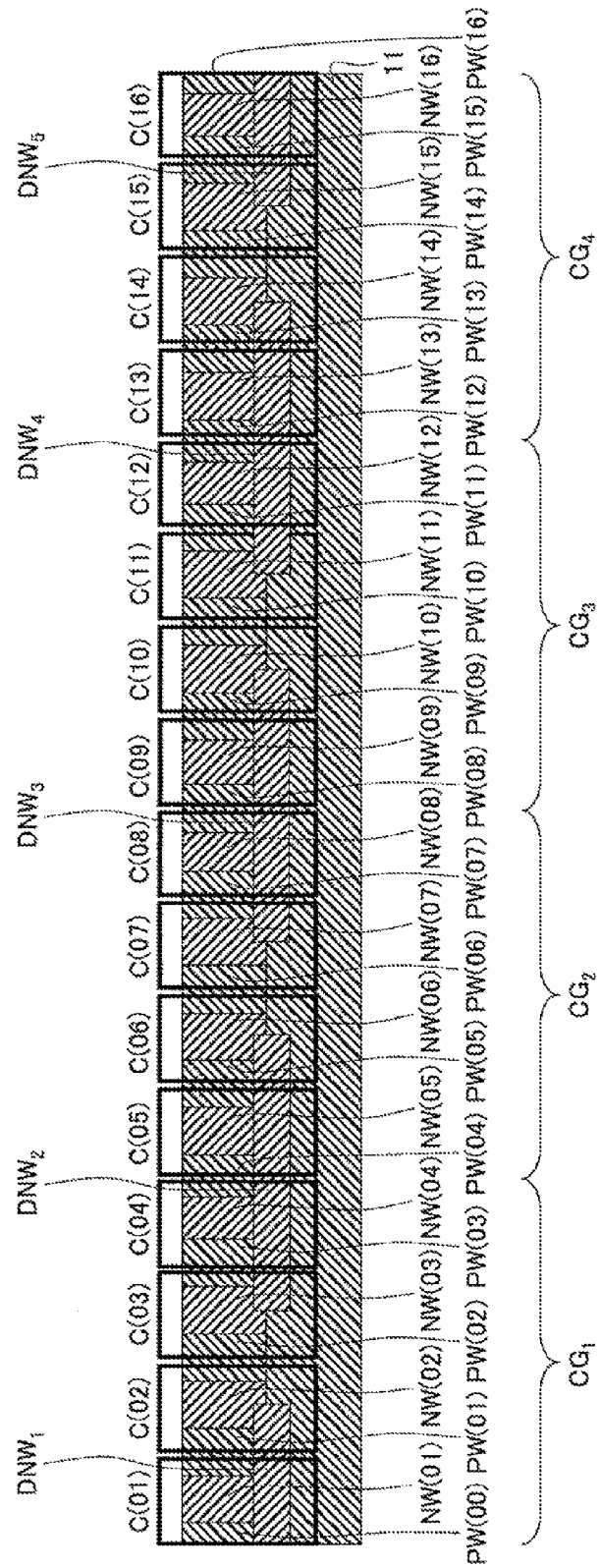

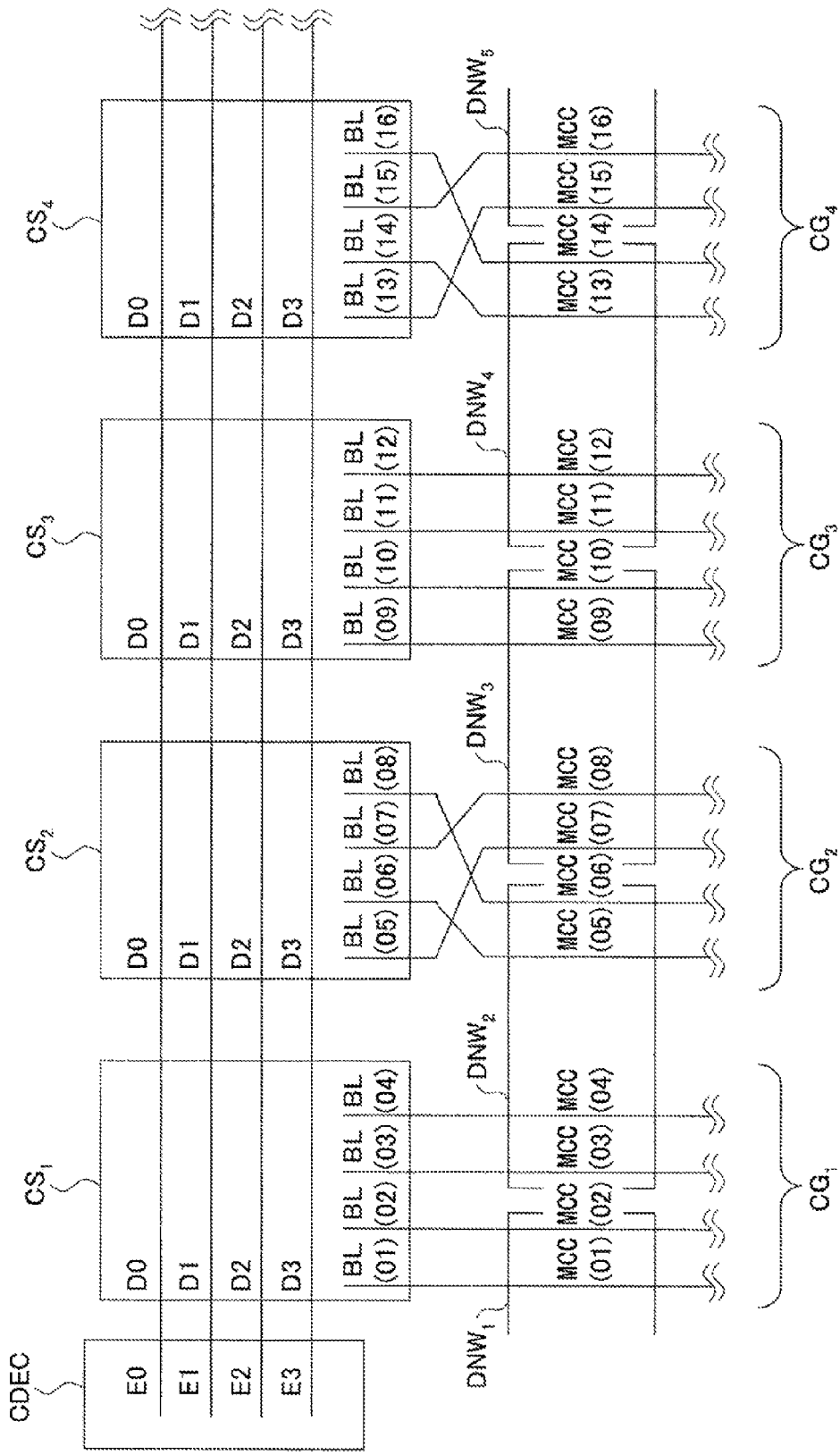

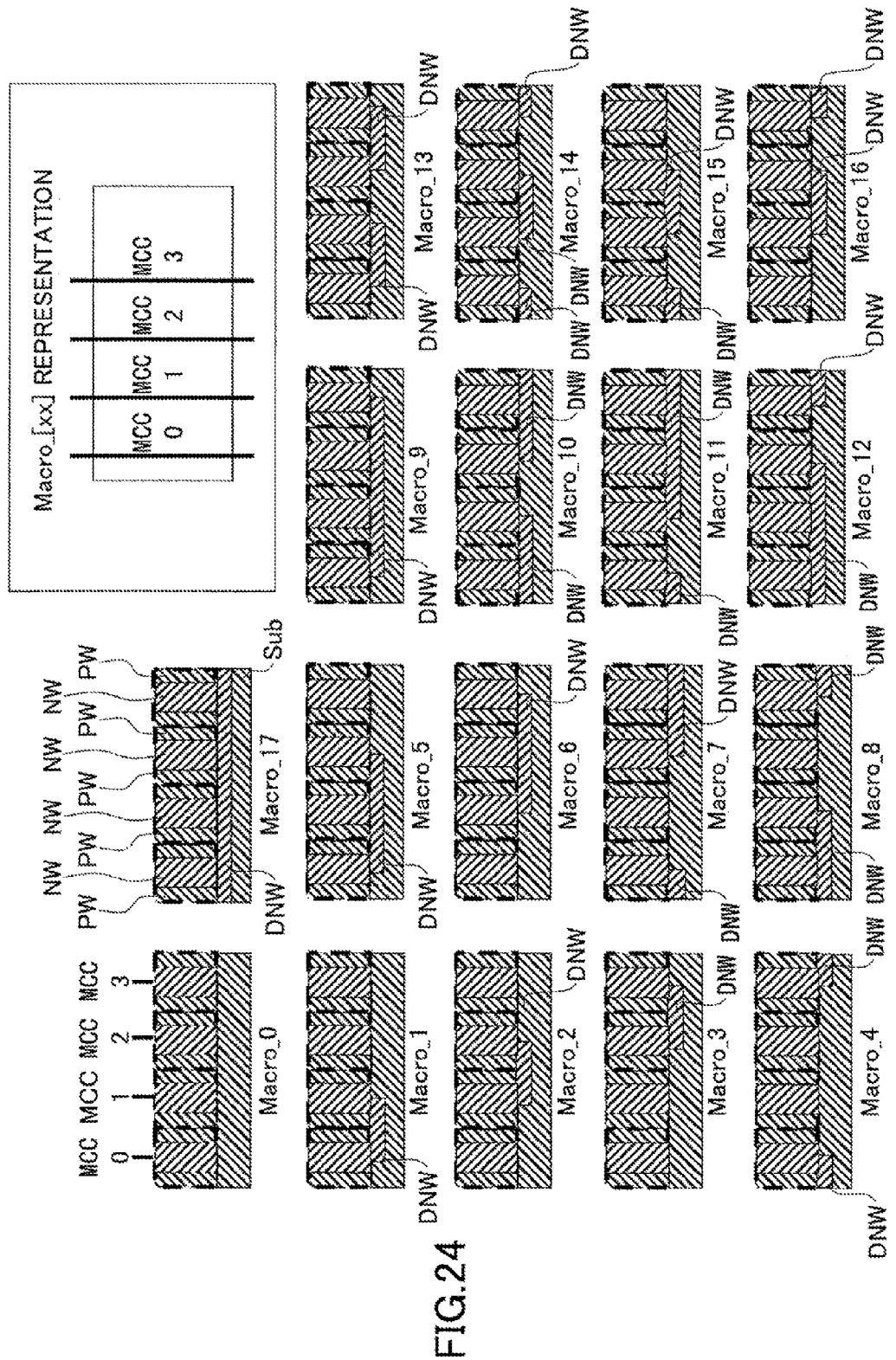

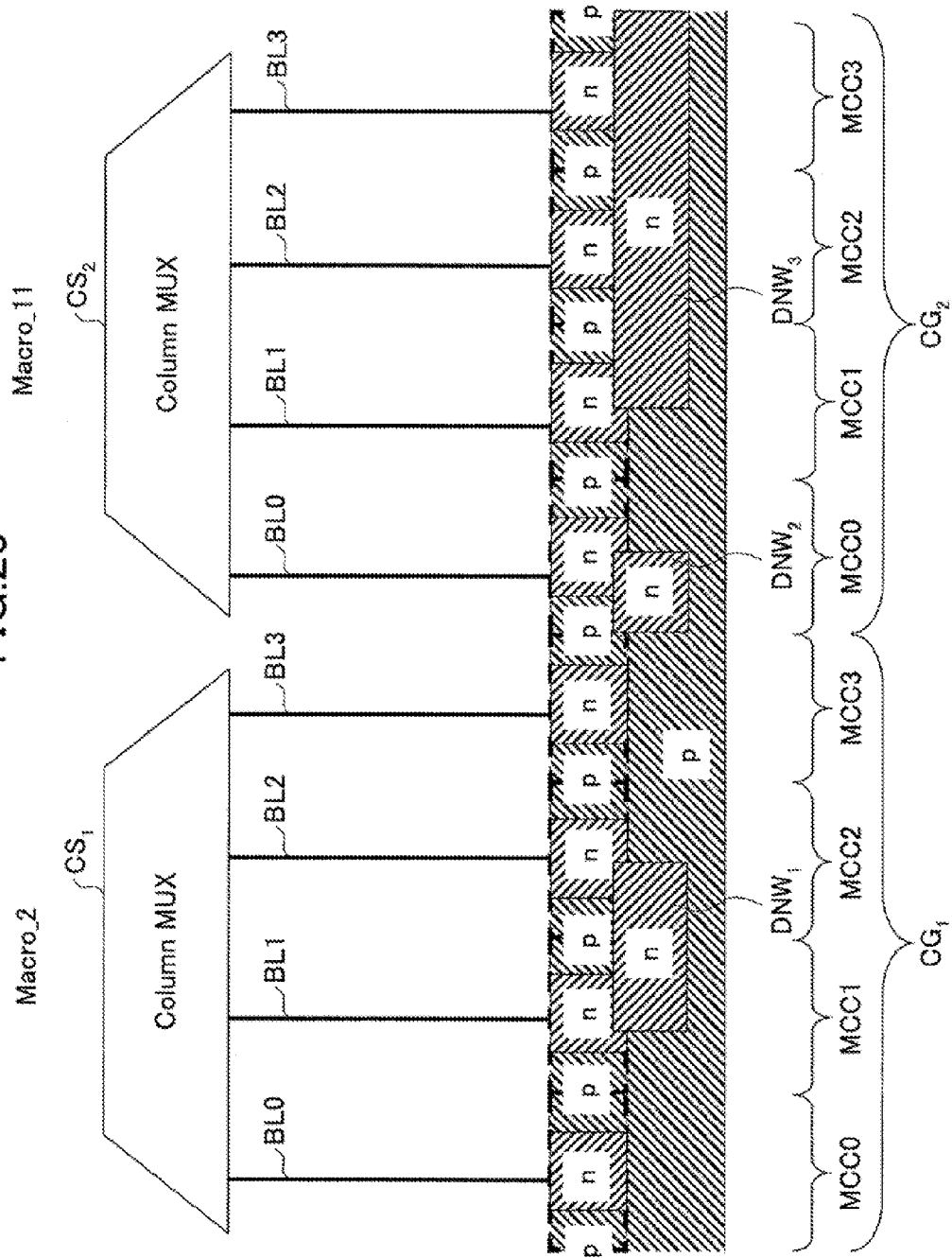

| COMBINATION | MCC0 | MCC1 | MCC2 | MCC3 |
|---|---|---|---|---|
| WIRE0 | BL0 | BL1 | BL2 | BL3 |
| WIRE1 | BL0 | BL1 | BL3 | BL2 |
| WIRE2 | BL0 | BL2 | BL1 | BL3 |
| WIRE3 | BL0 | BL2 | BL3 | BL1 |
| WIRE4 | BL0 | BL3 | BL1 | BL2 |
| WIRE5 | BL0 | BL3 | BL2 | BL1 |
| WIRE6 | BL1 | BL0 | BL2 | BL3 |
| WIRE7 | BL1 | BL0 | BL3 | BL2 |
| WIRE8 | BL1 | BL2 | BL0 | BL3 |
| WIRE9 | BL1 | BL2 | BL3 | BL0 |
| WIRE10 | BL1 | BL3 | BL0 | BL2 |
| WIRE11 | BL1 | BL3 | BL2 | BL0 |
| WIRE12 | BL2 | BL0 | BL1 | BL3 |
| WIRE13 | BL2 | BL0 | BL3 | BL1 |
| WIRE14 | BL2 | BL1 | BL0 | BL3 |
| WIRE15 | BL2 | BL1 | BL3 | BL0 |
| WIRE16 | BL2 | BL3 | BL0 | BL1 |
| WIRE17 | BL2 | BL3 | BL1 | BL0 |
| WIRE18 | BL3 | BL0 | BL1 | BL2 |
| WIRE19 | BL3 | BL0 | BL2 | BL1 |
| WIRE20 | BL3 | BL1 | BL0 | BL2 |
| WIRE21 | BL3 | BL1 | BL2 | BL0 |
| WIRE22 | BL3 | BL2 | BL0 | BL1 |
| WIRE23 | BL3 | BL2 | BL1 | BL0 |

FIG.26

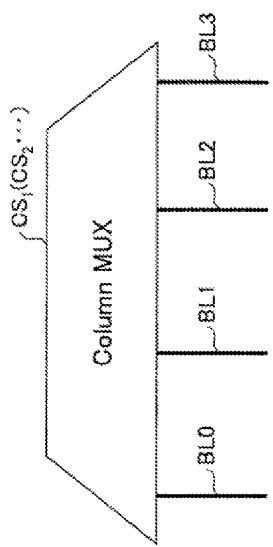

STATIC RANDOM ACCESS MEMORY

CROSS-REFERENCE TO RELATED APPLICATIONS

This application is based upon and claims the benefit of priority of the prior Japanese Patent Application 2010-282420, filed on Dec. 17, 2010, the entire contents of which are hereby incorporated herein by reference.

FIELD

The embodiments described herein relate to semiconductor devices.

BACKGROUND

A static random access memory (referred to hereinafter as SRAM) is a high-speed semiconductor memory device including a transfer transistor selected by a word line and two CMOS inverters forming together a flip-flop circuit. SRAMs are used extensively in various high-speed logic circuit devices together with high-speed logic devices such as a CMOS circuit.

PRIOR ART REFERENCES

Patent References

Patent Reference 1 Japanese Laid-Open Patent Application 11-17134
Patent Reference 2 Japanese Laid-Open Patent Publication 2000-48564

SUMMARY

In an aspect, a random access memory is configured such that one of a first conductivity type well constituting a first bit in one column group and another first conductivity type well constituting a second bit selected simultaneously to the first bit in an adjacent column group, is isolated from a common well of the first conductivity type by providing a deep well of a second conductivity type, such that the area of the deep well of the second conductivity type does not exceed the area of one column group.

Additional objects and advantages of the embodiment will be set forth in part in the description which follows, and in part will be obvious from the description, or may be learned by practice of the disclosures. The object and advantages of the disclosures will be realized and attained by means of the elements and combinations particularly pointed out in the appended claims.

It is to be understood that both the foregoing general description and the following detailed description are exemplary and explanatory only and are not restrictive of the disclosures, as claimed.

BRIEF DESCRIPTION OF DRAWINGS

FIG. 2B is a cross-sectional diagram of FIG. 2A taken along a line A-A' thereof;
FIG. 6A is a first diagram explaining the principle of the error check and correction circuit in the construction of FIG. 5;
FIG. 6B is a second diagram explaining the principle of the error check and correction circuit in the construction of FIG. 5;
FIG. 7 is a diagram explaining a general example of a soft error;
FIG. 8A is a cross-sectional diagram taken along a line C-C' of FIG. 4;
FIG. 8B is a diagram showing the cross-section of FIG. 8A over a larger area;
FIG. 9A is a cross-sectional diagram explaining the problems in a comparative example of the first embodiment;
FIG. 9B is a cross-sectional diagram explaining the problems in another comparative example of the first embodiment;
FIG. 10 is a cross-sectional diagram explaining the mechanism of occurrence of the problems in the comparative example of FIG. 9A;
FIG. 12 is a diagram showing an example of the truth table used with the circuit diagram of FIG. 11;
FIG. 21A is a block diagram explaining the selection of the memory cell column according to the fifth embodiment;
FIG. 21B is a cross-sectional view diagram showing the construction of an SRAM according to a fifth embodiment;
FIG. 21C is a diagram showing a modification of the fifth embodiment;
FIG. 24 is a cross-sectional diagram showing an eighth embodiment;

FIG. 25 is a cross-sectional diagram showing an example of the eighth embodiment; and FIG. 26 is a diagram showing examples of various bit line selection with a selection circuit of the eighth embodiment.

DESCRIPTION OF EMBODIMENT

Figure 1:
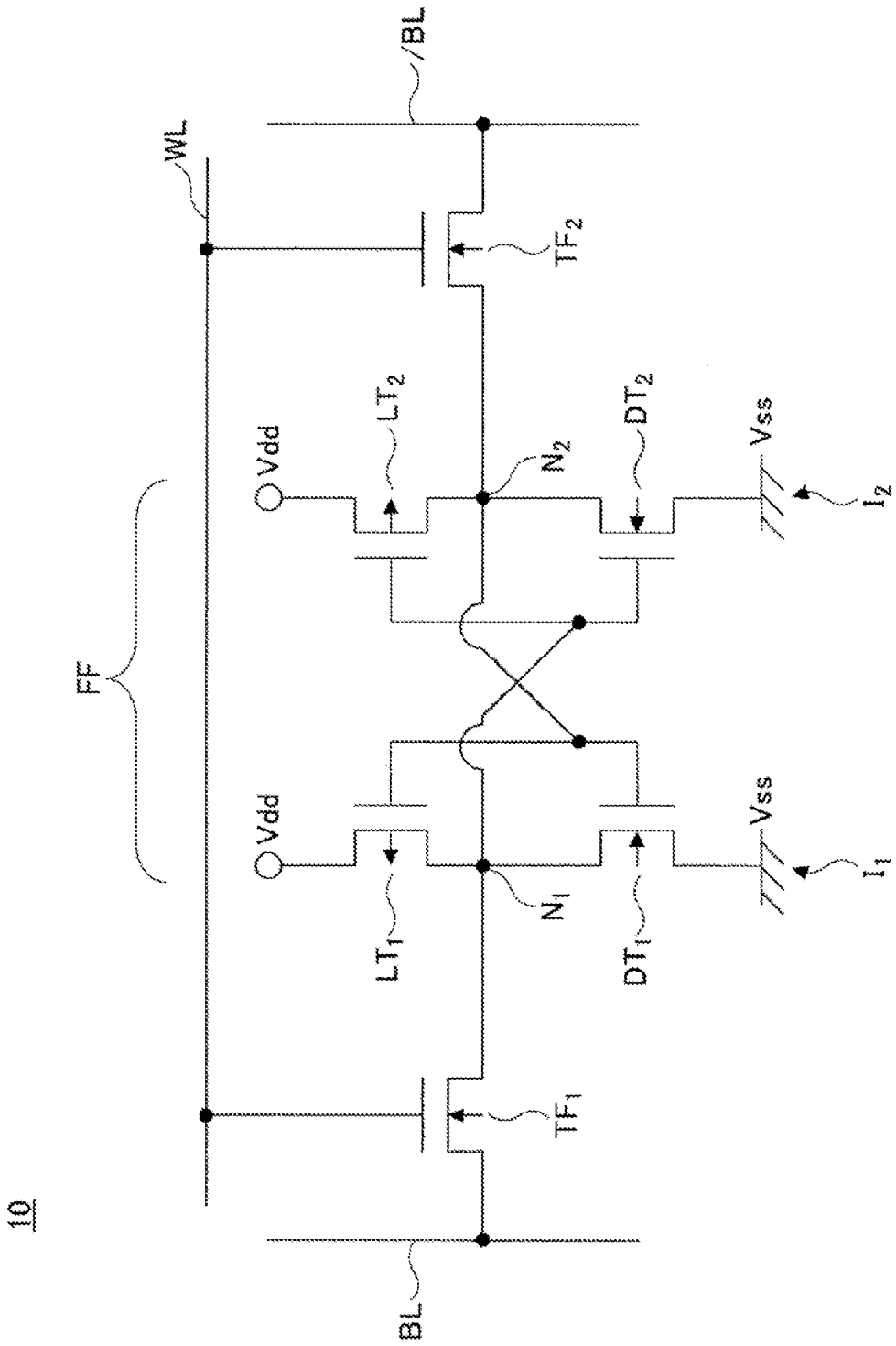
FIG. 1 is an equivalent circuit diagram showing an SRAM according to a first embodiment.

Embodiments that describe the best mode for carrying out the present disclosures are explained next with reference to the drawings.

Generally, an SRAM includes a plurality of memory cells in the form of two-dimensional memory cell array such that the memory cells are arranged in a word line direction, or row direction, and further in a bit line direction, or column direction. In each of these memory cells, there are formed two p-channel MOS transistors respectively constituting the foregoing two CMOS inverters in an n-type well extending in the memory cell array in the column direction. Further, two n-channel MOS transistors respectively constituting the foregoing two CMOS inverters and additional two n-channel MOS transistors respectively constituting transfer transistors, are formed in a pair of p-type wells formed parallel to and adjacent to the n-type well at respective sides thereof while using only a half well region in each of the foregoing p-type wells.

The memory cells in the memory cell array are organized in the form of column groups each formed of a bundle of memory cell columns, wherein each of the memory cell columns is formed of a group of memory cells aligned in the column direction and connected commonly to a bit line for that column. In the memory cell array, the column groups are repeated a number of times in the row direction. Each of the column groups is provided with a column selection circuit supplied with a part of the address data selects a specific memory cell column.

Further, the SRAM includes a word line selection circuit supplied with a part of the address data and selects a specific word line. As a result of selection of a specific word line, a specific memory cell in a specific memory cell column is selected, and writing or reading of one-bit data is conducted to or from the selected memory cell.

In such SRAMs in which the memory cell array is thus organized into a number of column groups, writing or reading of one-bit data is conducted to or from each of such column groups. Further, writing or reading of data of plurality of bits is conducted simultaneously to and from a plurality of column groups.

In an example of reading a memory cell array in which there are 64 column groups each including 4 bits, reading of one bit data is made simultaneously from the first memory cell column of the first column group, the first memory cell column of the second column group, the first memory cell column of the third column group, . . . . As a result, reading of 64-bit data is made simultaneously over these pluralities of column groups.

In such an SRAM, there is occasionally caused so-called "soft error" by external radiation particles, or the like. When a soft error occurs, there may be caused logic inversion or reversal of data for example in the selected memory cell of the first memory cell column of the first column group as a result of the energy of the incident particles.

In such a case, there is a possibility that similar logic inversion of data is caused also in other memory cells of the same column group by the energy of the incident radiation particles. However, these other memory cells in the same column group are not selected currently, and thus, the reading results of the SRAM are not affected by the soft errors in other memory cells of the same column group. Thus, as long as the effect of the foregoing radiation does not propagate to other column groups, there should be only one bit error in the 64 bit data thus read out from the memory cell array. In such a case, it is possible to correct the error by using an ordinary ECC (error checking and correction) circuit.

However, it was discovered, in the investigation that constitutes the foundation of the embodiments described herein, that, in the case of recent SRAMs of very high integration density, the effect of soft error in one column group can propagate to adjacent column groups, and thus, there can be a case in which two bits of error may be included for example in the 64-bit data read out from the SRAM. For example, there may be caused a 1-bit error in the first bit of the first column group and another 1-bit error in the second bit of the second column group that are selected at the same time.

While such error of two bits or more can be corrected by providing a larger number of redundant bits (parity bits) in the ECC circuit, such an approach would invite poor SRAM area efficiency and results in increase of cost of the SRAMs.

First Embodiment

FIG. 1 is an equivalent circuit diagram of one memory cell of an SRAM 10 according to a first embodiment.

Referring to FIG. 1, the SRAM 10 includes a first CMOS inverter $I_1$ in which a first load transistor $LT_1$ of a p-channel MOS transistor and a first driver transistor $DT_1$ of an n-channel MOS transistor are connected in series, and a second CMOS inverter $I_2$ in which a second load transistor $LT_2$ of a p-channel MOS transistor and a second driver transistor $LD_2$ of an n-channel MOS transistor are connected in series. The first CMOS inverter $I_1$ and the second CMOS inverter $I_2$ form together a flip-flop circuit FF, wherein a node $N_1$ connecting the first load transistor $LT_1$ and the first driver transistor $DT_1$ with each other, is connected to a first bit line BL via a first transfer transistor $TF_1$, which is formed of an n-channel MOS transistor and controlled by a word line WL. Similarly, a node $N_2$ in which the second load transistor $LT_2$ and the second driver transistor $DT_2$ are connected with each other, is connected to a complementary bit line /BL of the first bit line via a second transfer transistor $TF_2$ of an n-channel MOS transistor.

Figure 2A:
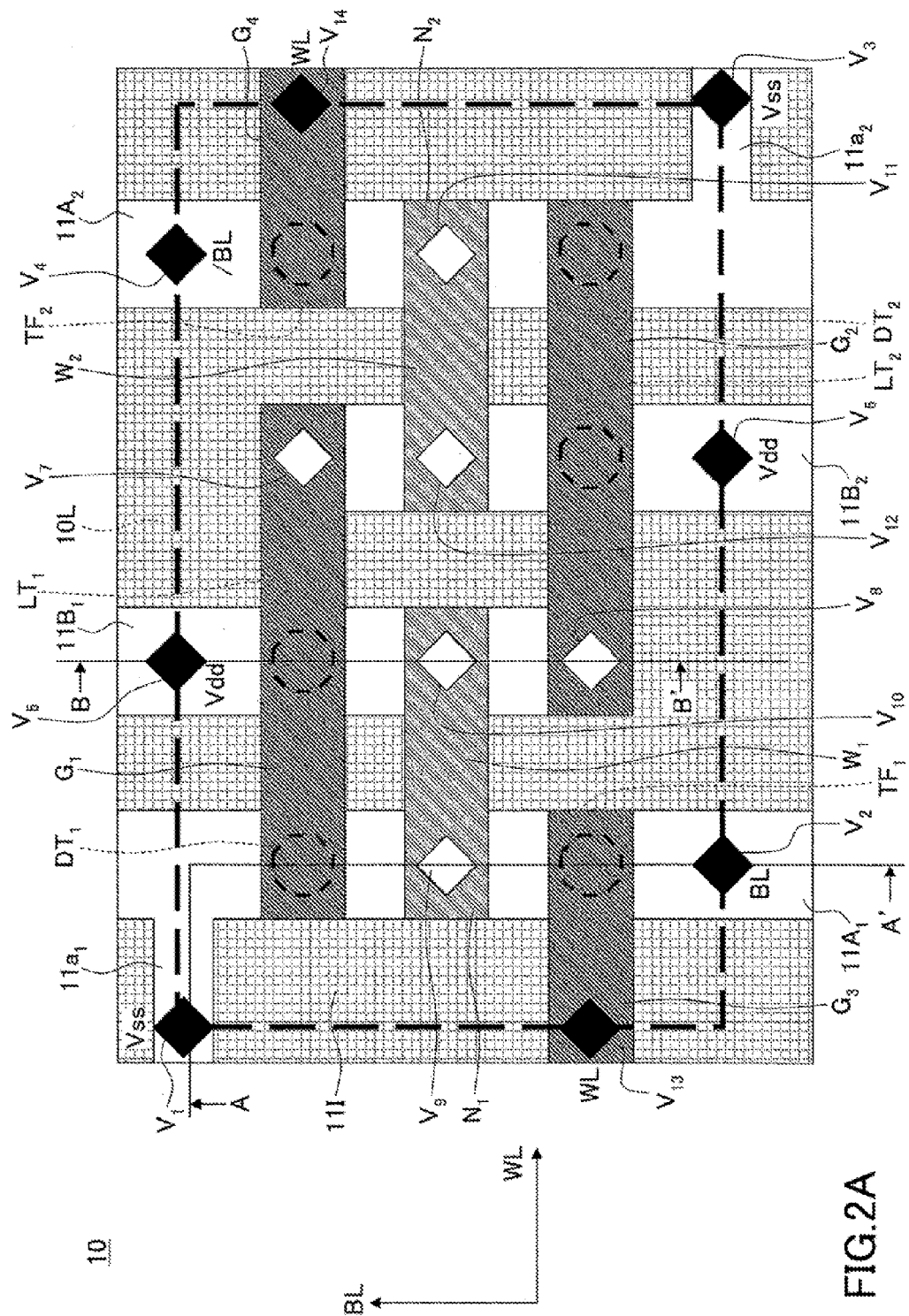
FIG. 2A is a plan view diagram showing the construction of one memory cell corresponding to FIG. 1.
Figure 2C:
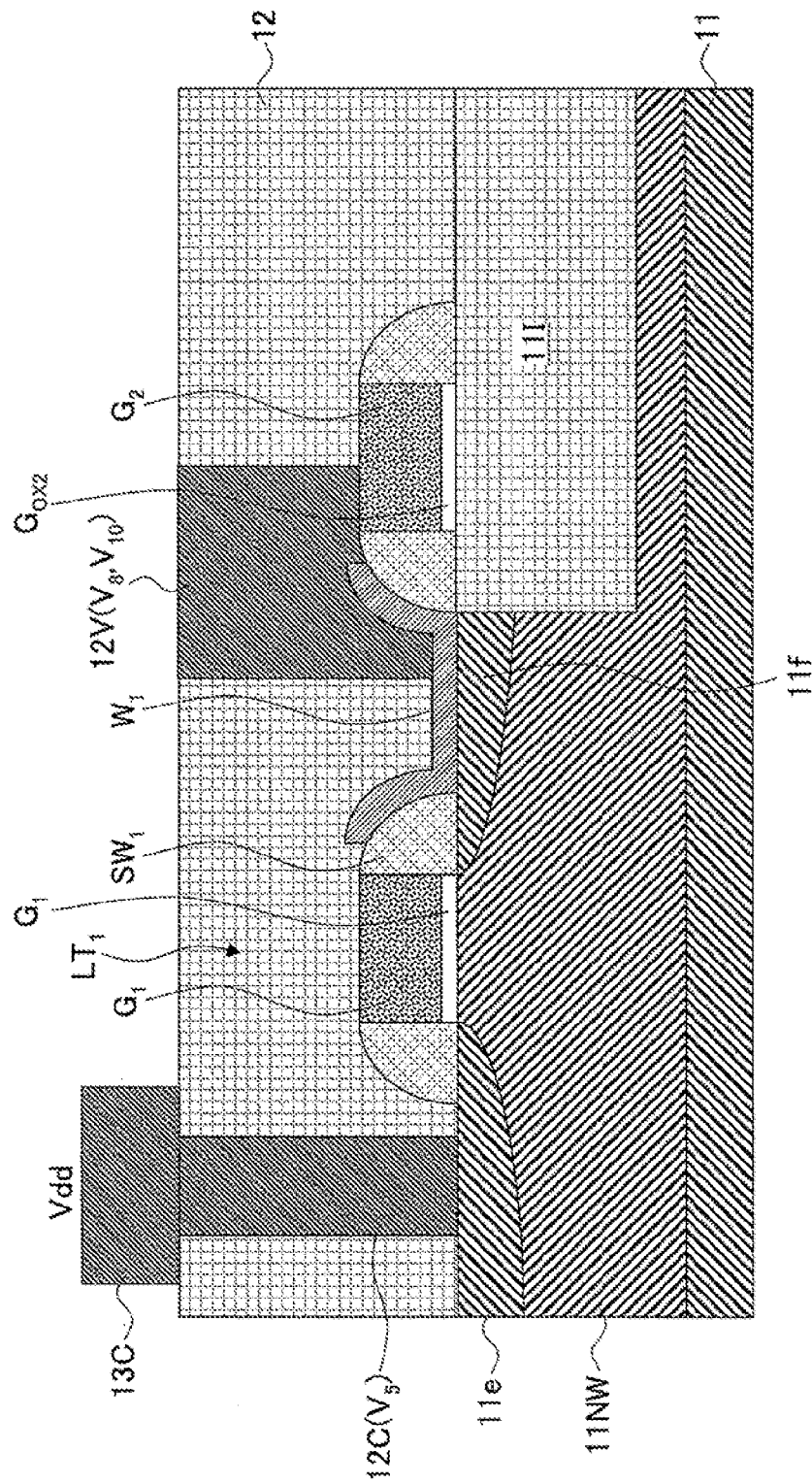
FIG. 2C is a cross-sectional diagram of FIG. 2A taken along a line B-B' thereof.

FIG. 2A is a plan view diagram showing a layout 10L of one memory cell of the SRAM 10 of FIG. 1, while FIGS. 2B and 2C are cross-sectional diagrams taken along a line A-A' and a line B-B' of FIG. 2A respectively.

Referring to FIG. 2A, the SRAM 10 is formed on a p-type silicon substrate 11 formed with an STI type device isolation region 11I, wherein the device isolation region 11I defines first and second p-type active regions $11A_1$ and $11A_2$ therein such that the first and second p-type active regions $11A_1$ and $11A_2$ extend over the p-type silicon substrate 11 in a bit line direction BL, and hence in the column direction, continuously with mutual separation and with a mutually parallel relationship. Further, in the device isolation region 11I, there are formed third and fourth active regions $11B_1$ and $11B_2$ of n-type parallel with each other between the first and second active regions $11A_1$ and $11A_2$ of p-type, such that the third and fourth active regions $11B_1$ and $11B_2$ extend in the bit line direction BL for a limited length and such that the n-type active region $11B_1$ is located between the p-type active region $11A_1$ and the n-type active region $11B_2$ and the n-type active region $11B_2$ is located between the p-type active region $11A_2$ and the n-type active region $11B_1$.

In FIG. 2A, a broken line represents the boundary of a single memory cell, wherein it will be seen that there is formed a power contact $V_1$ supplied with a first supply voltage Vss in the active region $11A_1$ in the vicinity of the intersection of the boundaries of the memory cells and that there is formed another bit line contact $V_2$ for connection to a bit line BL in correspondence to another intersection. Further, on the active region $11A_2$, there is provided a power contact $V_3$ supplied with the supply voltage Vss at a location in point symmetry with regard to the power contact $V_1$, and there is further provided a bit line contact $V_4$ for connection to a bit line /BL complementary to the bit line BL at a location in point symmetry to the bit line contact $V_2$. Here, it should be noted that the via-contact $V_1$ is formed in an extension part $11a_1$ extending from the active region $11A_1$ in the left direction and is shared with a memory cell at the left side of the drawing. Similarly, it should be noted that the via-contact $V_3$ is formed in an extension part $11a_2$ extending from the active region $11A_2$ in the right direction and is shared with a memory cell at the right side of the drawing.

Further, there is formed a power contact $V_5$ supplied with a second supply voltage Vdd in correspondence to the intersection of the boundaries of the memory cells, and there is further formed a power contact $V_6$ in the active region $11B_2$ supplied with the supply voltage Vdd at a location in point symmetry to the power contact $V_5$.

On the active region $11A_1$, it can be seen that the driver transistor $DT_1$ and the transfer transistor $TF_1$ are formed consecutively between the power contact $V_1$ and the bit line contact $V_2$, and a gate electrode $G_1$ of the driver transistor $DT_1$ extends across the active region $11B_1$ in the word line direction and hence in the row direction, toward the active region $11B_2$, wherein the gate electrode $G_1$ is connected to the edge of the active region $11B_2$ by a via-contact $V_7$. Thereby, the load transistor $LT_1$ is formed at the intersection of the active region $11B_1$ and the gate electrode $G_1$.

Similarly, on the active region $11A_2$, it can be seen that the driver transistor $DT_2$ and the transfer transistor $TF_2$ are formed consecutively between the power contact $V_3$ and the bit line contact $V_4$, and a gate electrode $G_2$ of the driver transistor $DT_2$ extends across the active region $11B_2$ in the word line direction and hence in the row direction, toward the active region $11B_1$, wherein the gate electrode $G_2$ is connected to the edge of the active region $11B_1$ by a via-contact $V_8$. Thereby, the load transistor $LT_2$ is formed at the intersection of the active region $11B_2$ and the gate electrode $G_2$.

Further, in the active region $11A_1$ and the active region $11B_1$, it should be noted that there is formed a via-contact $V_9$ between the transistors $DT_1$ and $TF_1$ wherein the via-contact $V_9$ is connected to a via-contact $V_{10}$, which is formed beside the via-contact $V_8$ at the side opposite the power contact $V_5$ with regard to the transistor $LT_1$ in the active region $11B_1$ by way of a local interconnection pattern $W_1$ corresponding to the node N. With this, the load transistor $LT_1$ and the driver transistor $DT_1$ are connected in series between the power contact $V_5$ supplied with the supply voltage Vdd and the power contact $V_1$ supplied with the supply voltage Vss.

Similarly, in the active region $11A_2$ and the active region $11B_2$, it should be noted that there is formed a via-contact $V_{11}$ between the transistors $DT_2$ and $TF_2$ wherein the via-contact $V_{11}$ is connected to a via-contact $V_{12}$, which is formed beside the via-contact $V_7$ at the side opposite the power contact $V_6$ with regard to the transistor $LT_2$ in the active region $11B_2$ by way of a local interconnection pattern $W_2$ corresponding to the node $N_2$. With this, the load transistor $LT_2$ and the driver transistor $DT_2$ are connected in series between the power contact $V_6$ supplied with the supply voltage Vdd and the power contact $V_3$ supplied with the supply voltage Vss.

Further, a gate electrode $G_3$ of the transfer transistor $TF_1$ extends in the word line direction WL and hence in the row direction away from the active region $11B_1$ and is connected to the word line WL at the boundary of the memory cells by a word line contact $V_{13}$. Further, a gate electrode $G_4$ of the transfer transistor $TF_2$ extends in the word line direction WL and hence in the row direction away from the active region $11B_2$ and is connected to the word line WL at the boundary of the memory cells by a word line contact $V_{14}$.

In the equivalent circuit diagram of FIG. 1, it should be noted that the load transistors $LT_1$ and $LT_2$ are p-channel MOS transistors and are formed in the n-type well of the silicon substrate 11, while the driver transistors $DT_1$ and $DT_2$ and the transfer transistors $TF_1$ and $TF_2$ are n-channel MOS transistors and are formed in the p-type well of the silicon substrate 11.

In FIG. 2A, it should be noted further that the via-contacts $V_7$-$V_{12}$ depicted by a blank pattern represent the via-contacts that connect the wiring layer corresponding to the gate electrodes $G_1$-$G_3$ to the respective active regions, while the via-contacts $V_1$-$V_6$, $V_{13}$ and $V_{14}$ depicted by a black pattern represent the via-contacts for connection to the interconnection layer of further upper layer, and thus the interconnection layer in which the word line WL and the bit line BL are formed. The local interconnection pattern $W_1$ may be formed directly on the active regions $11A_1$ and $11B_1$. Similarly, the local interconnection pattern $W_2$ may be formed directly on the active regions $11A_2$ and $11B_2$.

FIG. 2B represents the cross-sectional diagram of the SRAM 10 taken along the line A-A'.

Referring to the cross-section of FIG. 2B, it can be seen that there is formed a p-type well 11PW in the upper part of the p-type silicon substrate 11 and the gate electrode $G_1$ of the driver transistor $DT_1$ is formed over the p-type silicon substrate 11 via a gate insulation film $Gox_1$. Further, in the p-type well 11PW, there are formed a source region 11a of n-type and a drain region 11b of n-type respectively at the left side and right side of the gate electrode G. Similarly, over the p-type silicon substrate 11, the gate electrode $G_3$ of the transfer transistor $TF_1$ is formed via a gate insulation film $Gox_3$, wherein there are formed a source region 11c of n-type and a drain region 11d of n-type in the p-type well respectively at the left side and right side of the gate electrode $G_3$. Here, it should be noted that the drain region 11b and the source region 11c are formed by a single n-type diffusion region.

Further, between the gate electrode $G_1$ and the gate electrode $G_3$, it can be seen that the local interconnection pattern $W_2$ is formed in electrical contact with the drain region 11b and the source region 11c while covering the sidewall insulation film $SW_2$ of the gate electrode $G_2$ and the sidewall insulation film $SW_2$ of the gate electrode $G_3$ partially.

Further, on the silicon substrate 11, there is formed an interlayer insulation film 12 covering the gate electrodes $G_2$ and $G_3$, wherein the interlayer insulation film 12 is formed with a via-plug 12A constituting the via-contact $V_2$ in contact with the interconnection pattern 13A that carries the supply voltage Vss, and there is further formed a via-plug 12B constituting the via-contact $V_{13}$ in contact with the interconnection pattern that constitutes the bit line BL.

FIG. 2C represents the cross-sectional diagram of the SRAM 10 taken along the line B-B'.

Referring to FIG. 2C, it can be seen that there is formed an n-type well 11NW in the upper part of the p-type silicon substrate in the cross-section along the line B-B', and the load transistor $LT_1$ is formed in the n-type well 11NW.

More specifically, in the cross-section of FIG. 2C, it can be seen that the gate electrode $G_1$ of FIG. 2B extends together with the gate insulation film $Gox_1$ to constitute the gate electrode of the load transistor $LT_1$, and there are formed a source region $11e$ of p-type and a drain region $11f$ of p-type in the n-type well $11NW$ respectively at the left side and the right side of the gate electrode G.

Further, in the cross-section of FIG. 2C, it can be seen that there extend a polysilicon pattern constituting the gate electrode $G_2$ of the load transistor $LT_2$ on the device isolation film 11I together with the underlying gate oxide film $Gox_2$, wherein the local interconnection pattern $W_1$ extending from the cross-section of FIG. 2B makes a contact with the p-type drain region $11f$. With this, the source region $11b$ and the drain region $11c$ of n-type are connected electrically to the source region $11f$ of p-type.

Further, with the cross-section of FIG. 2C, it can be seen that the gate electrode $G_1$ and the polysilicon pattern $G_2$ are similarly covered with the interlayer insulation film 12, and the interlayer insulation film 12 is formed with a common via-plug 12V in correspondence to the via-contacts $V_{10}$ and $V_8$, wherein the via plug 12V connects the local interconnection pattern $W_1$ to the polysilicon pattern $G_2$ electrically.

Further, on the interlayer insulation film 12, there is formed an interconnection pattern 13C carrying the supply voltage Vdd, wherein the interconnection pattern 13C is connected to the p-type source region $11e$ electrically by the via-plug 12C formed in the interlayer insulation film 12 in correspondence to the via-contact $V_5$.

Further, the transistors $DT_2$, $TF_2$ and $LT_2$ have similar cross-sectional structures and the description thereof will be omitted.

Further, over the silicon substrate 11, the interlayer insulation film 12 is formed so as to cover the gate electrode $G_2$, and there is formed a via-plug 12C constituting the via-contact $V_5$ in the interlayer insulation film 12 in contact with the interconnection pattern 13C that carries the supply voltage Vdd.

Figure 3:
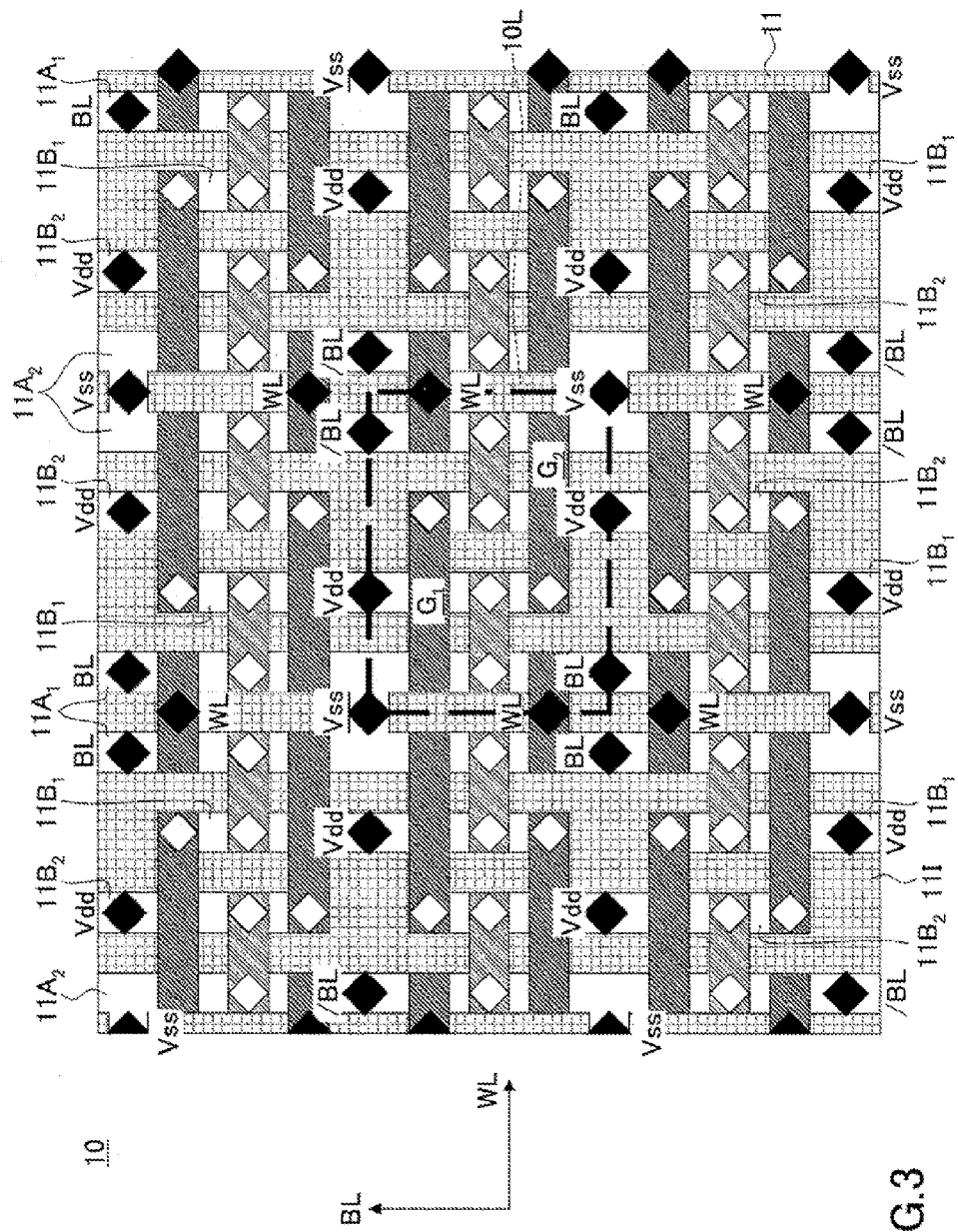
FIG. 3 is a plan view diagram showing a memory cell array of the SRAM according to the first embodiment.

FIG. 3 is a plan view diagram representing the memory cell array of the SRAM 10 in which the memory cell 10L of FIGS. 2A-2C is repeated to form a row and column formation.

Referring to FIG. 3, it can be seen that the memory cell 10L of FIGS. 2A-2C, represented by a broken line, is formed repeatedly over the surface of the silicon substrate in which the active regions are formed by the device isolation region 11I while inverting the vertical direction and the lateral direction in each repetition. Further, it can be seen that the active regions $11A_2$ and $11A_2$ extend in the bit line direction BL continuously through a number of memory cells, while the active regions $11B_2$ and $11B_2$ have a length or size of two memory cells in the row direction, or word line direction WL and are repeated alternately in the bit line direction.

Figure 4:
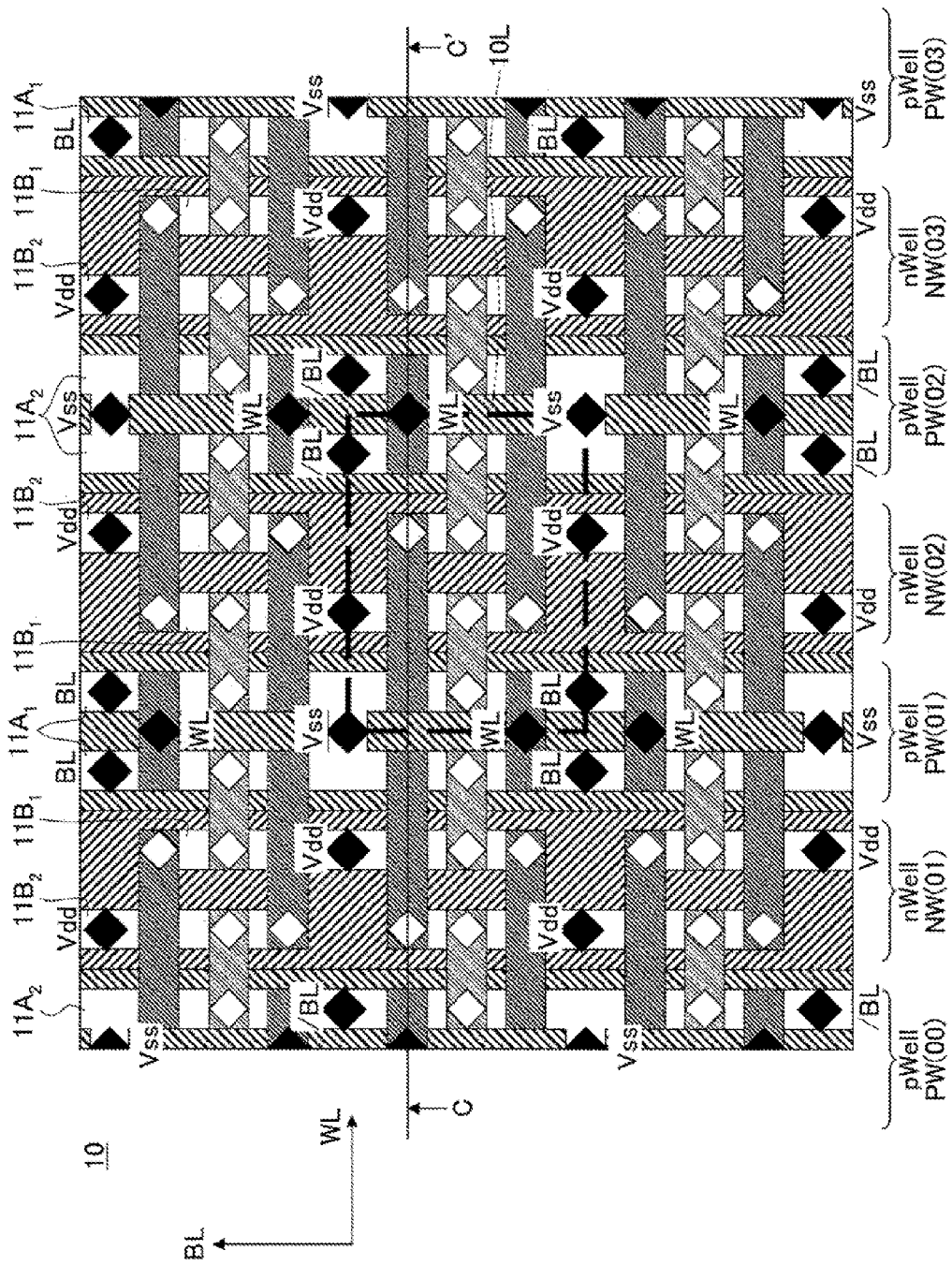
FIG. 4 is a diagram showing the array of n-type wells and p-type wells lying underneath the plan view of FIG. 3.

FIG. 4 is a diagram in which the device isolation film 11I is removed from the plan view of FIG. 3 such that the p-type wells PW(00), PW(01), PW(02), PW(03) . . . and the n-type well NW(01), NW(02), NW(03) . . . underneath are exposed. Here, it should be noted that the p-type wells PW(00), PW(01), PW(03) . . . correspond to the p-type well 11PW of FIG. 2B, while the n-type wells NW(01), NW(02), NW(03) . . . correspond to the n-type well 11NW of FIG. 2C.

Referring to FIG. 4, it can be seen that, in the memory cell 10L of FIGS. 2A-2C, the active regions $11B_1$ and $11B_2$ for the load transistors $LT_1$ and $LT_2$ of a p-channel MOS transistor are formed in the n-type well NW(02) of the silicon substrate 11, and the active region $11A_1$ for the transfer transistor $TF_1$ and the driver transistor $DT_1$ of an n-channel MOS transistor is formed in the p-type well PW(01) of the silicon substrate 11. Further, the active region $11A_2$ for the transfer transistor $TF_2$ and the driver transistor $DT_2$ of an n-channel MOS transistor is formed in the p-type well PW(02) of the silicon substrate 11.

Each well extends continuously in the bit line direction BL, and these p-type wells and n-type wells are repeated alternately in the word line direction WL.

Here, it should be noted that the left half part of the p-type well PW(00) is used by the next memory cell at the immediately left of the memory cell 10L, and the right half part of the p-type well PW(03) is used by the next memory cell at the immediately right of the memory cell 10L.

Figure 5:
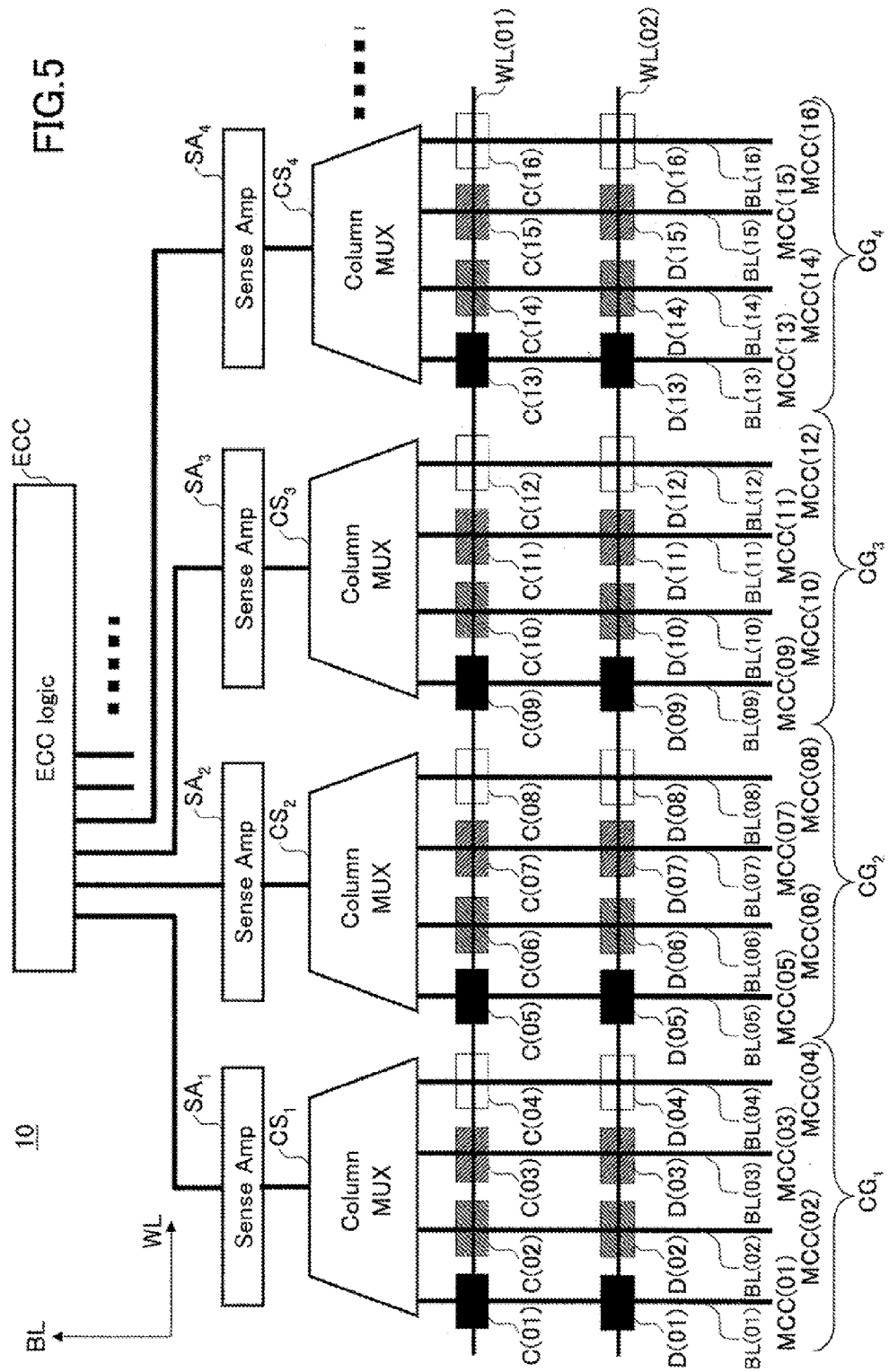
FIG. 5 is a diagram showing an electric construction of the SRAM according to the first embodiment.

FIG. 5 represents the error correction construction used in the SRAM 10 of the present embodiment for avoiding propagation of so-called soft error.

Referring to FIG. 5, C(01)-C(16) and D(01)-D(16) represent a series of memory cells that are selected by the word line WL(01) or WL(02) in the memory cell array depicted in FIGS. 3 and 4.

In the present embodiment, these memory cells are organized into a plurality of memory cell columns MCC(01), MCC(02) . . . each aligned in the column direction and connected commonly to a corresponding bit line BL(01), BL(02) . . . , wherein a plurality of memory cell columns, four in the illustrated example, are bundled together and there are formed a plurality of column groups $CG_1$, $CG_2$, $CG_3$, $CG_4$ . . . repeated over the entire memory cell array in the word line direction WL. For example, four memory cell columns MCC(01)-MCC(04) corresponding respectively to the bit lines BL(01)-BL(04) constitute a column group $CG_1$, four memory cell columns MCC(05)-MCC(08) corresponding respectively to the bit lines BL(05)-BL(08) constitute another column group $CG_2$ adjacent to the column group $CG_1$, four memory cell columns MCC(09)-MCC(12) corresponding respectively to the bit lines BL(09)-BL(12) constitute another column group $CG_3$ adjacent to the column group $CG_2$, and four memory cell columns MCC(13)-MCC(16) corresponding respectively to the bit lines BL(13)-BL(16) constitute another column group $CG_2$ adjacent to the column group $CG_3$. In FIG. 5, each of the bit lines BL(0)-BL(16) includes a bit line BL and a complementary bit line /BL as explained with reference to FIG. 1. Representation of the bit line /BL is omitted.

Further, in the construction of FIG. 5, there are provided a plurality of column selection circuits $CS_1$, $CS_2$, $CS_3$, $CS_4$ . . . respectively in correspondence to the plurality of column groups $CG_1$, $CG_2$, $CG_3$, $CG_4$, wherein each of the column selection circuits $CS_1$, $CS_2$, $CS_3$, $CS_4$ . . . selects a single memory cell column from a column group corresponding thereto and supplies the voltage signal thus read out upon the bit line corresponding to that memory cell column to a corresponding sense amplifier $SA_1$, $SA_2$, $SA_2$, $SA_4$ . . . .

In the example in which the memory cells C(01), C(02), C(03) . . . C(16) are already selected by the word line WL(01) and the column selection circuit $CS_1$ has selected the memory cell column MCC(01) corresponding to the bit line BL(01), the column selection circuit $CS_S$ has selected the memory cell column MCC(05) corresponding to the bit line BL(05), the column selection circuit $CS_3$ has selected the memory cell column MCC(09) corresponding to the bit line BL(09) and the column selection circuit $CS_4$ has selected the memory cell column MCC(13) corresponding to the bit line BL(13), the voltage signals representing the logic states of the memory cells C(01), C(05), C(09) and C(13) are read out upon the corresponding bit lines and are supplied to the corresponding sense amplifiers $SA_1$, $SA_2$, $SA_3$ and $SA_4$ respectively via the column selection circuits $CS_1$, $CS_2$, $CS_3$ and $CS_4$.

As usual, the sense amplifiers $SA_1$, $SA_2$, $SA_3$ and $SA_4$ read out the information from the supplied voltage signal by judging the logic states of the respective memory cells.

In the construction of FIG. 5, the data of the memory cells thus read out are supplied to the error checking and correction circuit (ECC logic) ECC wherein detection and correction of the soft error is performed as represented in FIGS. 6A and 6B by carrying out a parity check in the bit line direction and in the word line direction.

FIGS. 6A and 6B are diagrams explaining the principle of the foregoing error checking and correction circuit ECC. Therein, FIG. 6A represents the case where there is no error in the memory cell array of the SRAM while FIG. 6B represents the case in which there exits one-bit error in a memory cell array region including eight rows and eight columns.

Referring to FIG. 6A, there are formed column selection circuits $CS_2$-$CS_8$ respectively in correspondence to the first through eighth column groups each having a size of four bits, and there are selected the bit lines BL(04), BL(08), BL(12) . . . BL(32) simultaneously by the respective column selection circuits.

In the ECC logic, there are provided a parity bit A for each of the word lines, and the ECC logic is constructed such that a total of the values read out from the eight memory cells that are selected by a single word line becomes an even number when the parity bit A is added.

Further, in the ECC logic, there are provided a parity bit B for each of the bit lines, and the ECC logic is constructed such that a total of the values read out from eight memory cells that are selected consecutively by a single bit line becomes an even number when the parity bit B is added.

Thus, by reading the data for each of the word lines WL(01)-WL(08) and the parity bit B by selecting the bit lines BL(04), BL(08), BL(12) . . . BL(32) and further the parity bit A, there is obtained a matrix for read out data as represented in FIG. 6A or FIG. 6B.

In the case of FIG. 6A in which there is no error, it can be seen that the total of the values read out from the memory cells selected by a single word line becomes an even number when the parity bit A is added. Further, it can be seen that the total of the values read out from the memory cells selected on a single bit line becomes an even number when the parity bit B is added.

On the other hand, in the case of FIG. 6B in which there is an error in the memory cell that is selected by the word line WL(01) and the bit line (04) as represented by a reversal of the data value, it will be noted that the total of the data read out from the memory cells selected by the word line WL(01) becomes an odd number even when the parity bit A is added. With this, it is detected that there is an error in any of the memory cells on the word line WL(01). Further, the total of the data from the memory cells selected by the bit line BL(01) becomes an odd number even when the parity bit B is added. From this, it is detected that there is an error in the memory cells on the bit line BL(04). From this, it is determined that the erroneous cell is the memory cell that is selected by the word line WL(01) and the bit line BL(04) and correction of the error is conducted by changing the data "0" to data "1".

In such an SRAM 10, there occasionally is caused a soft error due to the influence of external radiation, or the like, and thus, the foregoing error checking and correction circuit ECC is used for detection and correction of such a soft error.

FIG. 7 is a diagram explaining schematically the soft error that is caused in a general p-channel MOS transistor.

Referring to FIG. 7, there is formed a device region 101A in a silicon substrate 101 by a device isolation region 1011, and there is formed an n-type well 101N in the silicon substrate 101 in correspondence to the device region 101A. Further, in order to isolate the n-type well 101N electrically, there is formed a p-type well 101P in the silicon substrate 101. Often, the p-type well 101P may be provided by the silicon substrate 101 itself.

On the silicon substrate 101, there is formed a gate electrode 103 of polysilicon, or the like, via a gate insulation film not illustrated, and there is formed a source region 101a of p-type at one side, a left side in the illustrated example, of the gate electrode 103 in the device isolation region 101A, and a drain region 101b of p-type is formed at the opposite side.

Now, in the case there came in a charged particle such as an alpha particle as represented in FIG. 7 by an arrow in the state in which the p-channel MOS transistor is operational and a supply voltage Vdd is applied to the source region 101a and the drain region 101b is grounded by other transistor such as an n-channel MOS transistor 104, there is caused excitation of electron-hole pairs in the n-type well 101N by the energy of the charged particle. Here, the holes thus excited are dissipated to the ground from the drain region 101b via the n-channel MOS transistor 104, and thus, there arises a situation in which only the electrons remain in the n-type well 101N.

The electrons remained in the n-type well 101N act to lower the potential level thereof, and as a result, there can be a situation in which a drain current flows from the drain region 101a to the drain region 101b as a result of conduction of a parasitic bipolar transistor formed by the n-type well 101N, the p-type source region 101a and the p-type drain region 101b.

When conduction of such a parasitic bipolar transistor occurs in the p-channel MOS transistor $LT_1$ or $LT_2$ of the memory cell 10L, the state of the flip-flop circuit FF is inverted and the data held by the memory cell 10L is inverted also.

Similar inversion of stored data by the charged particles can occur also in the n-channel MOS transistor constituting the driver transistor $LT_1$ or $LT_2$ of FIG. 1.

FIGS. 8A and 8B represent the cross-section of the SRAM 10 taken along a line C-C' of FIG. 4. In the drawings, those parts explained before are designated by the same reference numerals and the description thereof will be omitted. FIG. 8B is a cross-sectional diagram representing the same structure of FIG. 8A over a wider range. In FIGS. 8A and 8B, illustration of the structures such as the gate electrode of the transistors formed on the silicon substrate is omitted for the sake of simplicity.

Referring to FIG. 8A, the memory cells C(01)-C(06) correspond to the memory cells C(01)-C(06) of FIG. 5 noted previously, and the column selection circuits $CS_1$ and $CS_2$ correspond respectively to the column selection circuit $CS_1$ and $CS_2$ of FIG. 6. In FIG. 8B representing wider area, there are further represented a column selection circuit $CS_3$, the bit lines BL(09)-BL(12) corresponding thereto and further a column group $CG_3$ corresponding to the memory cell column connected to the foregoing bit lines.

Referring to FIG. 8A, it can be seen that there are formed p-type wells PW(01)-PW(05) for the n-channel MOS transistors $DT_1$ and IF or $DT_2$ and $TF_2$ and n-type wells NW(01)-NW(06) for the p-channel MOS transistors $LT_1$ and $LT_2$ in the silicon substrate alternately and repeatedly, wherein it can be seen that, in the memory cell columns included in the column group corresponding to the column selection circuit $CS_2$, there is formed a deep n-type well $DNW_1$ underneath the respective p-type wells PW(04), PW(05), PW(06) . . . .

By forming such a deep n-type well underneath the column group corresponding to the column selection circuit $CS_2$, it becomes possible to block the propagation of the effect of the charged particle that has impinged into a p-type well of the column group corresponding to the column selection circuit $CS_1$, such as the p-type well PW(01), to other p-type wells PW(04) or PW(05) by the p-n junction formed between the silicon substrate 11 and the deep n-type well DNW.

Thereby, with the construction of the present embodiment, it should be noted that the deep n-type wells $DNW_1$, $DNW_2$, . . . are formed with a size not exceeding a length or size of one column group in the word line direction WL. The foregoing construction of the present embodiment may be represented in a different way in that there is formed a continuous deep n-type well underneath the p-type wells PW(00), PW(02) . . . and there are formed cuts, in other word the region where the deep n-type well is not formed, in the deep n-type well repeatedly in correspondence to the odd number column groups $CG_1$, $CG_3$, $CG_5$ . . . with a length or size corresponding to a one column group in the word line direction WL. Because each of the wells PW(00)-PW(12) and NW(01)-NW(11), $DNW_1$ and $DNW_2$ extend in the same length in the bit line direction BL in the construction of FIGS. 8A and 8B, it should be noted that the lateral length or size of the wells in the drawings can be regarded as corresponding to the area of the wells.

More specifically, the deep n-type well $DNW_1$ is formed with an area corresponding substantially to the area of one column group as represented in the cross-sectional diagram of FIG. 8B depicting a larger area, and thus, the deep n-type well $DNW_1$ does not extend from the part underneath the column group of the column selection circuit $CS_2$ to the part underneath the column group of the column selection circuit $CS_1$ continuously or does not cover the part underneath the column group of the column selection circuit $CS_1$ entirely. Further, it should be noted that the cut formed between the deep n-type well $DNW_1$ and the deep n-type well $DNW_2$ adjacent thereto is formed to have an area substantially equal to the area of one column group.

Because of this, the n-type well NW(01) of the memory cell C(01) is not connected electrically to the n-type well NW(05) of the memory cell C(05) selected simultaneously via the deep n-type well $DNW_1$, and the propagation of influence of the charged particles incident to the n-type well NW(01) to the n-type well NW(04) or NW(05) is blocked.

Further, the p-type well PW(01) of the memory cell C(01), for example, is not connected electrically to the p-type well PW(05) of the memory cell C(05) selected simultaneously, and the propagation of influence of the charged particle incident to the p-type well PW(01) to the p-type well PW(05) is likewise blocked.

On the contrary, in the case the deep n-type well DNW is not formed at all as in the case of a comparative example of FIG. 9A, the influence of the incident charged particles in the p-type well PW(01) may propagate not only to the p-type wells PW(02) and PW(03) of the same column group but also to the p-type wells PW(04) and PW(05) of the adjacent column group by a mechanism similar to the one explained with reference to FIG. 10.

Referring to FIG. 10, when there is caused excitation of the electron-hole pairs in the p-type well PW(01) by the charged particles and the holes alone have remained, it will be noted that the remaining holes may reach the p-type well PW(04) via the silicon substrate 11 of p-type and cause an increase of potential level therein. When this occurs, there may be caused conduction of a parasitic bipolar transistor formed by the driver transistor DT1 or DT2, which is an n-channel MOS transistor formed in the p-type well PW(0). When such conduction takes place, the data held in the memory cell of the SRAM undergoes logic inversion.

Further, when the deep n-type well DNW is formed continuously from an n-type well of a column group and a p-type well of an adjacent column group as in the case of another comparative example represented by FIG. 9B, the influence of the soft error caused by the incident charged particles in the n-type well NW(01) may propagate to the n-type well of the adjacent column group, such as the n-type well NW(05) or NW(06), and there is a possibility that the load transistor $LT_1$ or $LT_2$ of a p-channel MOS transistor formed in these n-type well undergoes conduction. When this occurs, the data held in the memory cell would experience logic inversion.

When there occurs a soft error in two, mutually adjacent column groups, it becomes necessary to carry out error correction of two bits in the error checking and correction circuit ECC explained with reference to FIG. 5 and FIGS. 6A and 6B. However, such two-bit error correction is undesirable for an SRAM in view of poor area efficiency.

According to the present embodiment, in which the deep n-type well is formed in any of the first and second column groups that are adjacent with each other with a size not exceeding the size or length of one column group, it becomes possible to block the conduction between the p-type wells of mutually adjacent column groups or between the n-type wells of mutually adjacent column groups. Thus, even when there has been caused a soft error in one of the two memory cell columns of two mutually adjacent column groups and the two memory cell columns are selected simultaneously, the present embodiment can successfully suppress the propagation of soft error to other memory cell columns of the other column groups. Thus, according to the present embodiment, it becomes possible to correct the error while using the error checking and correction circuit ECC of one bit even in such a case.

It should be noted that, in the case the charged particles have hit one memory cell of a certain column group, other memory cells of the same column group are not selected by the column selection circuits $CS_1$-$CS_3$, and thus, reading of data from these memory cells is not affected. The errors caused by these other memory cells can be corrected by the error checking and correction circuit ECC of FIG. 5 at the point these memory cells are selected.

The present embodiment is particularly useful in highly miniaturized SRAMs in which the active regions $11A_1$, $11A_2$, $11B_1$ and $11B_2$ are formed with a design rule of 45 nm or less.

Meanwhile, in such a construction, it will be noted that it is not possible to avoid the conduction caused between the p-type well or n-type well of the memory cell C(01) of the column group $CG_1$ and the corresponding p-type well or n-type well of the memory cell C(09) of the column group $CG_3$ while jumping the intermediate column group $CG_2$. However, the memory cell C(09) is provided with a distance of one column group away from the memory cell C(01) in such a construction, and thus, there is no substantial chance that the soft error propagates to the memory cell C(09) when the memory cell C(09) is selected simultaneously to the memory cell C(01), even in such a case in which the SRAM is miniaturized as is expected in this embodiment.

Figure 8C:
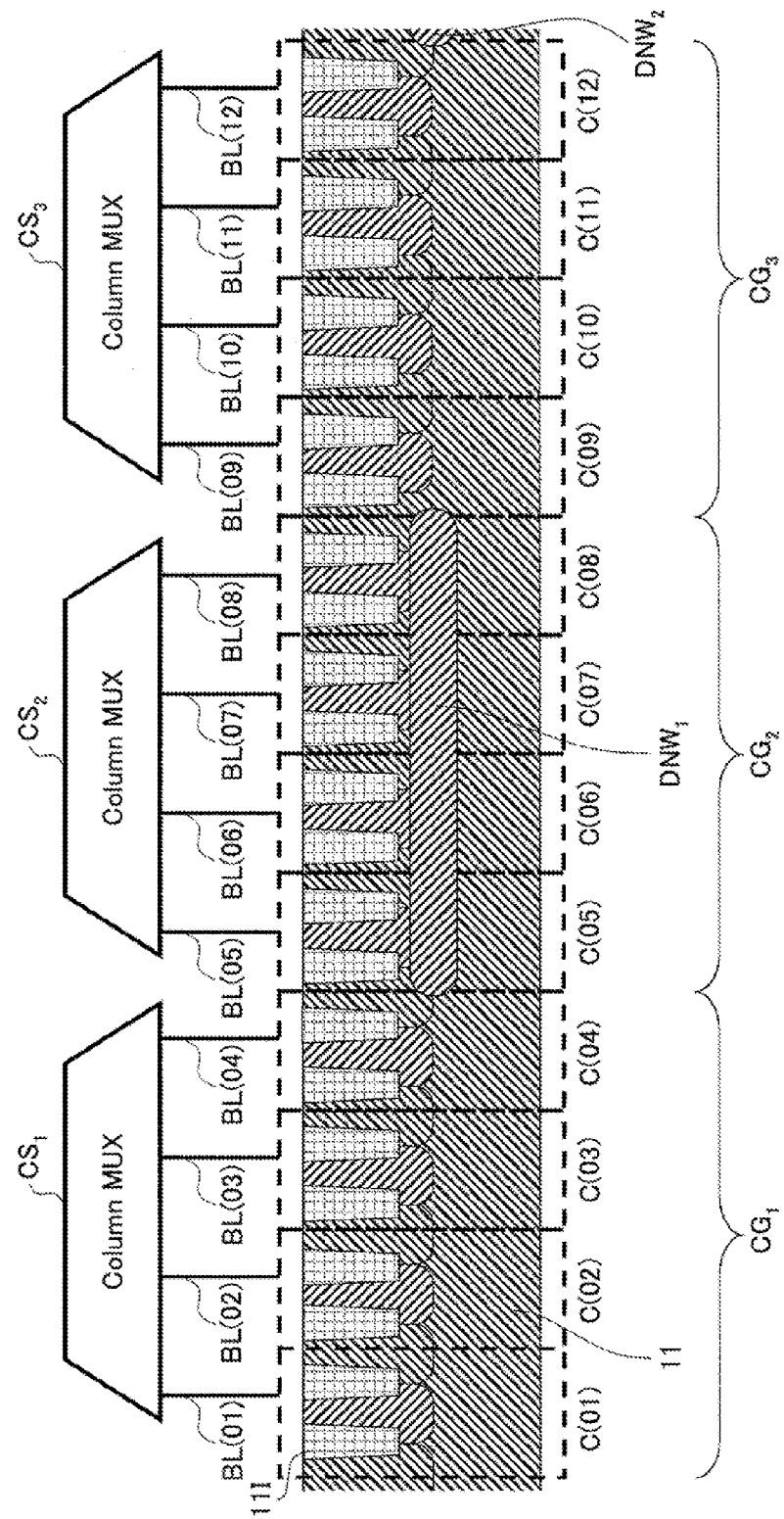
FIG. 8C is a diagram showing a modification FIG. 8B.

Further, in the present embodiment, it is possible to form the deep n-type wells $DNW_1$, $DNW_2$ . . . such that the respective edges thereof coincide with the edges of the corresponding column group as represented in FIG. 8C.

Figure 11:
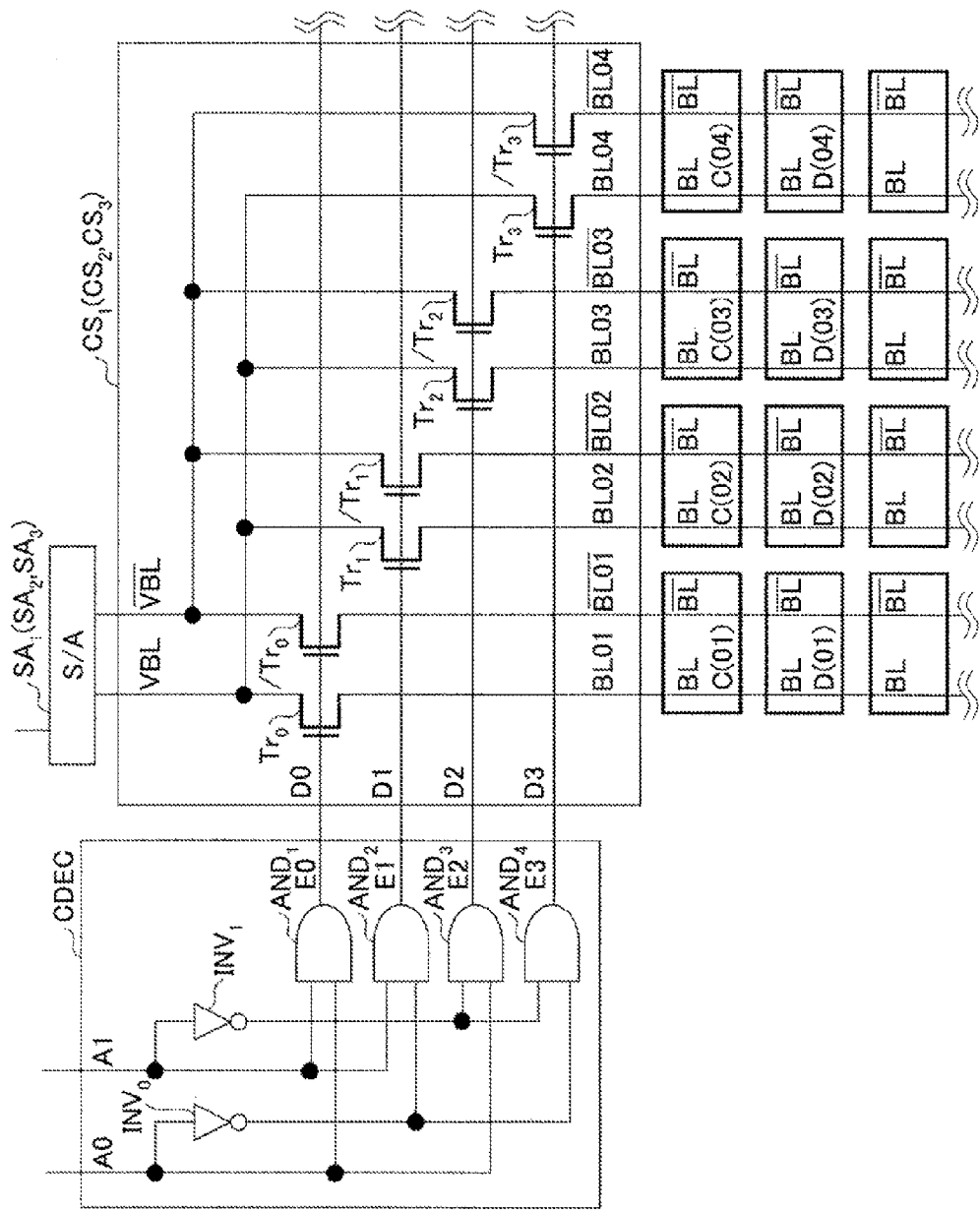
FIG. 11 is a diagram showing the construction of a column selection circuit used with the first embodiment.

FIG. 11 is a circuit diagram showing the construction of the column selection circuit $CS_1$ of FIGS. 8A-8C. Here, it should be noted that the construction of the column selection circuit $CS_1$ is identical to the construction of the column selection circuits $CS_2$ and $CS_3$, and the description of the column selection circuits $CS_2$ and $CS_3$ will be omitted.

Referring to FIG. 11, the column selection circuit $CS_1$ includes transistors $Tr_0$, $/Tr_0$, $Tr_1$, $/Tr_1$, $Tr_2$, $/Tr_2$, $Tr_3$, $/Tr_3$ respectively connecting the bit lines BL01, /BL01, BL02, /BL02, BL03, /BL03, BL04, /BL04 to common bit lines VBL and /VBL, wherein the transistors $Tr_0$, $/Tr_0$, $Tr_1$, $/Tr_1$, $Tr_2$, $/Tr_2$, $Tr_3$ and $/Tr_3$ are supplied with selection signals E0-E3 respectively via lines D0-D3 from a column decoder CDEC, the column decoder CDEC being supplied with a part of the address data such as address data A0 and A1. There, the bit lines BL01 and /BL01 are selected in the event the selection signal E0 on the line D0 is in a logic high state, wherein the bit lines BL01 and /BL01 are connected to the sense amplifier $SA_1$ via the transistors $T_0$ and $/T_0$ and further via the common bit lines VBL and /VBL. Similarly, the column selection circuit $CS_1$ connects, in the event the selection signal E1 on the line D1 is in a logic high state, the bit lines BL02 and /BL02 to the sense amplifier $SA_1$ via the transistors $Tr_1$ and $/Tr_1$ and via the common bit lines VBL and /VBL, while in the event the selection signal E2 on the line D2 is in a logic high state, the column selection circuit $CS_1$ connects the bit lines BL03 and /BL03 to the sense amplifier $SA_1$ via the respective transistors $Tr_2$ and $/Tr_2$ and further via the common bit lines VBL and /VBL. Further, the column selection circuit $CS_1$ connects the bit lines BL04 and /BL04 to the sense amplifier $SA_1$ via the transistors $Tr_3$ and $/Tr_3$ and via the common bit lines VBL and /VBL in the event the selection signal E3 on the line D3 is in a logic high state.

With regard to the column decoder, it will be noted that the column decoder includes an AND circuit $AND_1$ supplied with address data A0 in one input terminal and address data A1 in the other input terminal, an AND circuit $AND_2$ supplied with the address data A0 in one input terminal via an inverter $INV_0$ and the address data A1 in another input terminal, an AND circuit $AND_S$ supplied with address data A0 in one input terminal and address data A1 in the other input terminal via an inverter $INV_1$, another AND circuit $AND_4$ supplied with the address data A0 in one input terminal via the inverter $INV_0$ and the address data A1 in another input terminal via an inverter $INV_1$, and produces the selection signals E0-E4 in response to the combination of the input data A0 and A1 as represented in the truth table of FIG. 12.

With such a construction, it becomes possible to select one of the four bit lines BL01-BL04, and hence the memory cell column corresponding thereto, by the column selection circuit $CS_1$ in response to the combination of the incoming address data A0 and A1.

In the event there occurred a soft error in the memory cell C(01) in the present embodiment, there is a possibility that a similar soft error is caused in the memory cells C(02)-C(04) belonging to the same column group. However, these memory cells are not selected by the column selection circuit $CS_1$, and thus, the data thus read out from the SRAM does not include an error. Further, in the event in which these memory cells are selected, the error can be corrected by using the error checking and correction circuit ECC similarly to the case of the memory cell column corresponding to the bit line BL(01).

In FIG. 11, it should be noted that the bit lines BL01, BL02, BL03 and BL04 correspond respectively to the bit lines BL(01), BL(02), BL(03) and BL(04) of FIG. 5.

Figure 13:
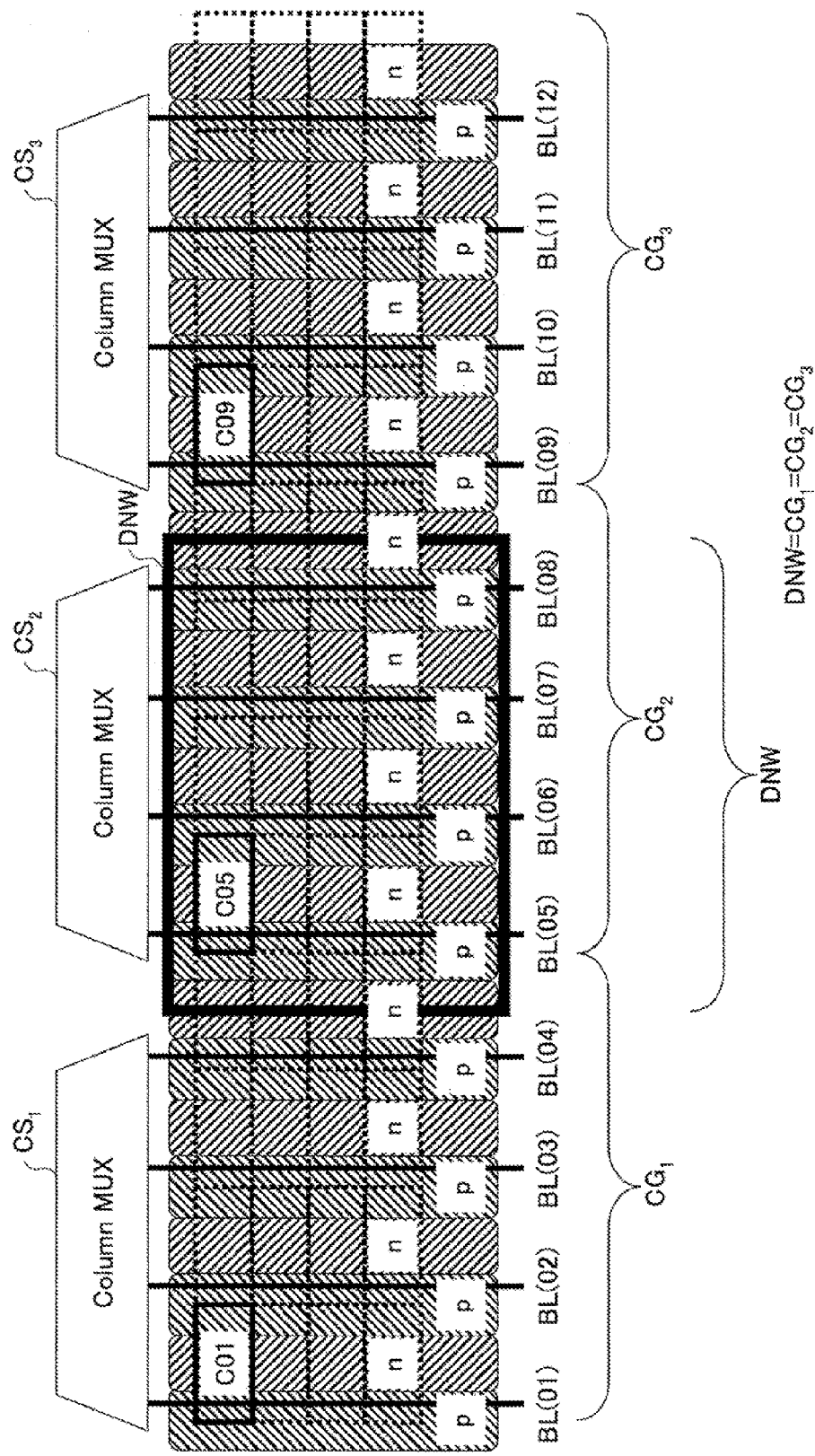
FIG. 13 is a plan view diagram showing the relationship between the size of the deep n-type well in the row direction and the size of the column group in the row direction in the first embodiment.

FIG. 13 is a plan view diagram explaining the relationship between the size of the deep n-type well DNW as measured in the row direction, or word line direction WL, and the size of the column groups as measured also in the row direction, or word line direction WL. Here, FIG. 13 shows the bit lines BL(01)-BL(12), and in correspondence to this, there are represented the column selection circuits $CS_1$, $CS_2$ and $CS_3$. In conformity with FIG. 5, FIG. 13 also designates the column group for the bit lines B(01)-BL(04) as $CG_1$ in correspondence to the column selection circuit $CS_1$, the column group for the bit lines B(05)-BL(08) as $CG_2$ in correspondence to the column selection circuit $CS_2$, and the column group for the bit lines B(09)-BL(12) as $CG_3$ in correspondence to the column selection circuit $CS_3$.

Referring to FIG. 13, the deep well $DNW_1$ of FIGS. 8A and 8B is formed with an area or size in the row direction equal to that of one column group as marked up by a thick line in correspondence to the column group $CG_2$, and because of this, the p-well constituting the memory cell $C_{05}$, for example, is isolated from the memory cells $C_{01}$ and $C_{09}$ that are selected simultaneously, by the foregoing deep n-type well DNW.

Further, because the area or size of the deep n-type well DNW in the row direction does not exceed the area or the size of one column group in the row direction, the n-type well of the memory cell $C_{09}$, for example, does not conduct, via the foregoing deep n-type well DNW, with the n-type well of the memory cell $C_{05}$ that is selected simultaneously.

As explained already, the size of the p-type wells and n-type wells in the bit line direction is the same in the plan view diagram of FIG. 13, and the like, and thus, the length of the bracket illustrated in the drawing in the row direction or in the word line direction corresponds to the area of the corresponding column group or the area of the well DNW.

Figure 14:
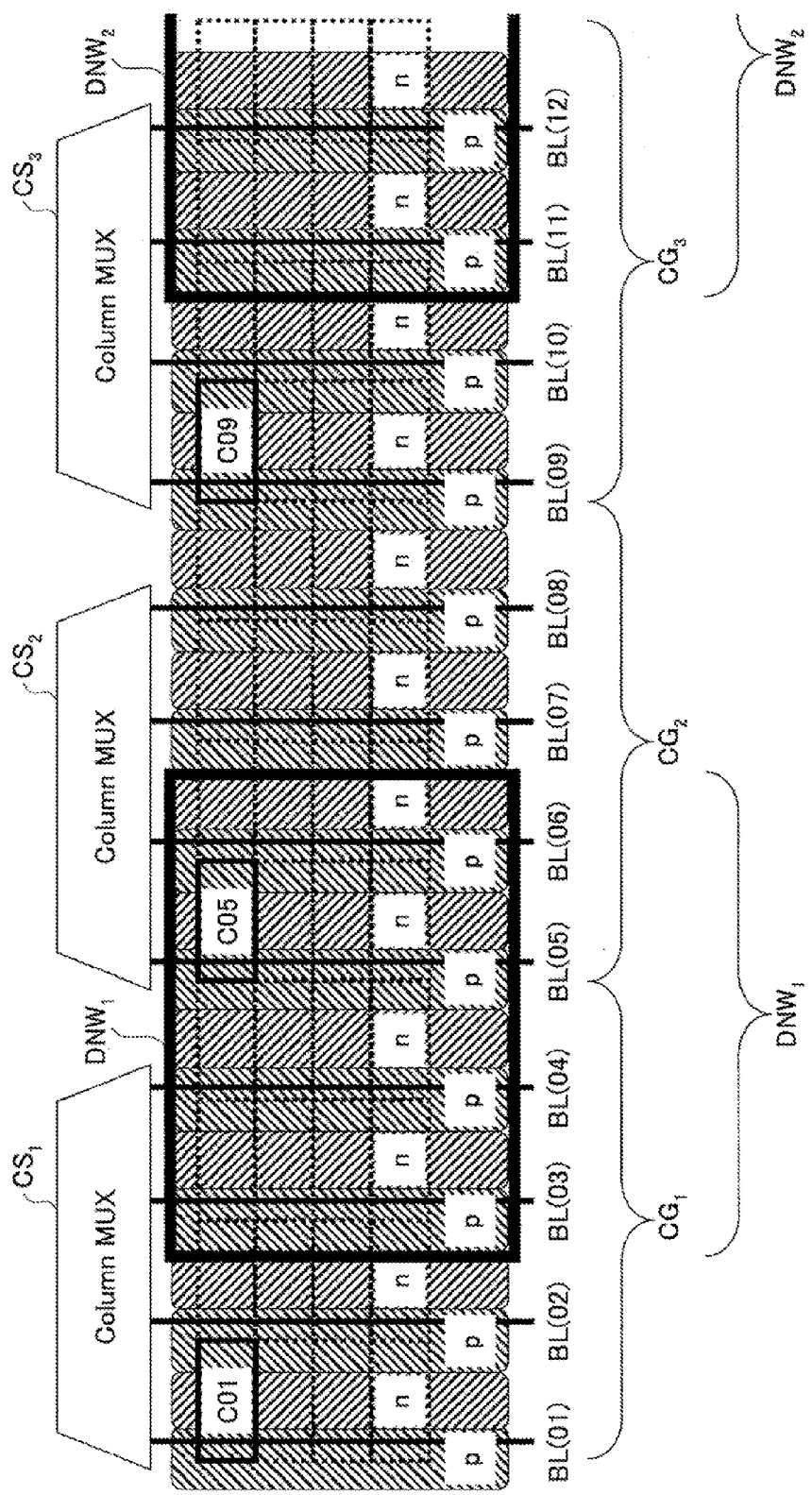
FIG. 14 is a plan view diagram showing another modification of the first embodiment.

Further, from the foregoing explanation, it will be understood that, as long as the size of the deep n-type well DNW in the row direction does not exceed the size of a column group in the row direction, it is not necessary to provide the deep n-type well DNW coincident to any column group such as the column group $CG_2$ in the example of FIG. 13, but it is possible to provide the deep n-type well DNW with an arbitrary offset as represented in a modification of FIG. 14.

In the embodiment of FIG. 13, and also in the modification of FIG. 14, it should be noted that one deep n-type well $DNW_1$ and the next n-type deep n-type well $DNW_2$ are disposed such that the distance therebetween does not exceed a distance corresponding to one column group, in other words, such that there is not formed a blank, or the region where the deep n-type well is not formed, with a size exceeding the size of one column group in the row direction.

Meanwhile, in the present embodiment, it may be noted from FIG. 8B, that there may be caused an exceptional propagation of soft error when a charged particle hits the p-type well PW(03) of the memory cell C(04) located at the edge of the memory cell column $CG_1$ and when the memory cell C(08) is selected at the same time. In such a case, the variation of potential caused in the p-type well PW(03) may affect the p-type well PW(08) of the memory cell C(08) via the p-type silicon substrate 11. Similarly, in the event a charged particle hits the n-type well NW(04) of the memory cell C(04) and the memory cell C(08) is selected at the same time to the memory cell C(04), there may be caused similar exceptional propagation of soft error such that the variation of potential caused in the n-type well NW(04) is propagated to the n-type well NW(08) of the memory cell C(08) via the deep n-type well $DNW_1$. Similar exceptional propagation of soft error can occur also in the embodiment of FIG. 8C.

In spite of the foregoing, the influence of the charged particle incident to other wells is effectively blocked with the present embodiment, and the SRAM 10 has much improved soft error resistance as compared with the construction of FIG. 9A or 9B in which the deep n-type well DNW is not formed at all or the deep n-type well is formed continuously underneath the memory cell array.

The construction capable of disconnecting the propagation path of such exceptional soft errors will be explained in relation to the embodiments below.

Second Embodiment

Figure 15:
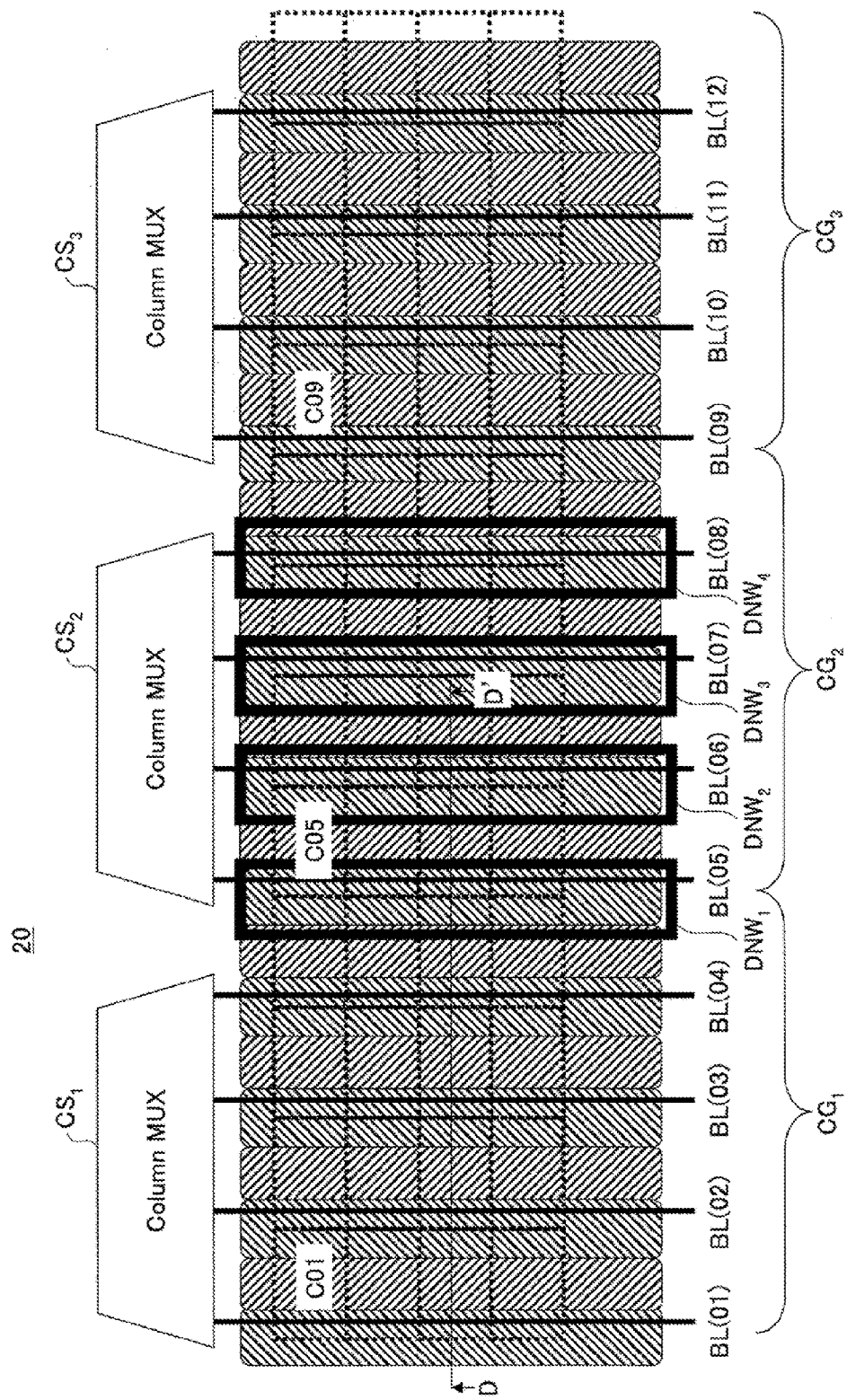
FIG. 15 is a plan view diagram showing an SRAM according to a second embodiment.
Figure 16:
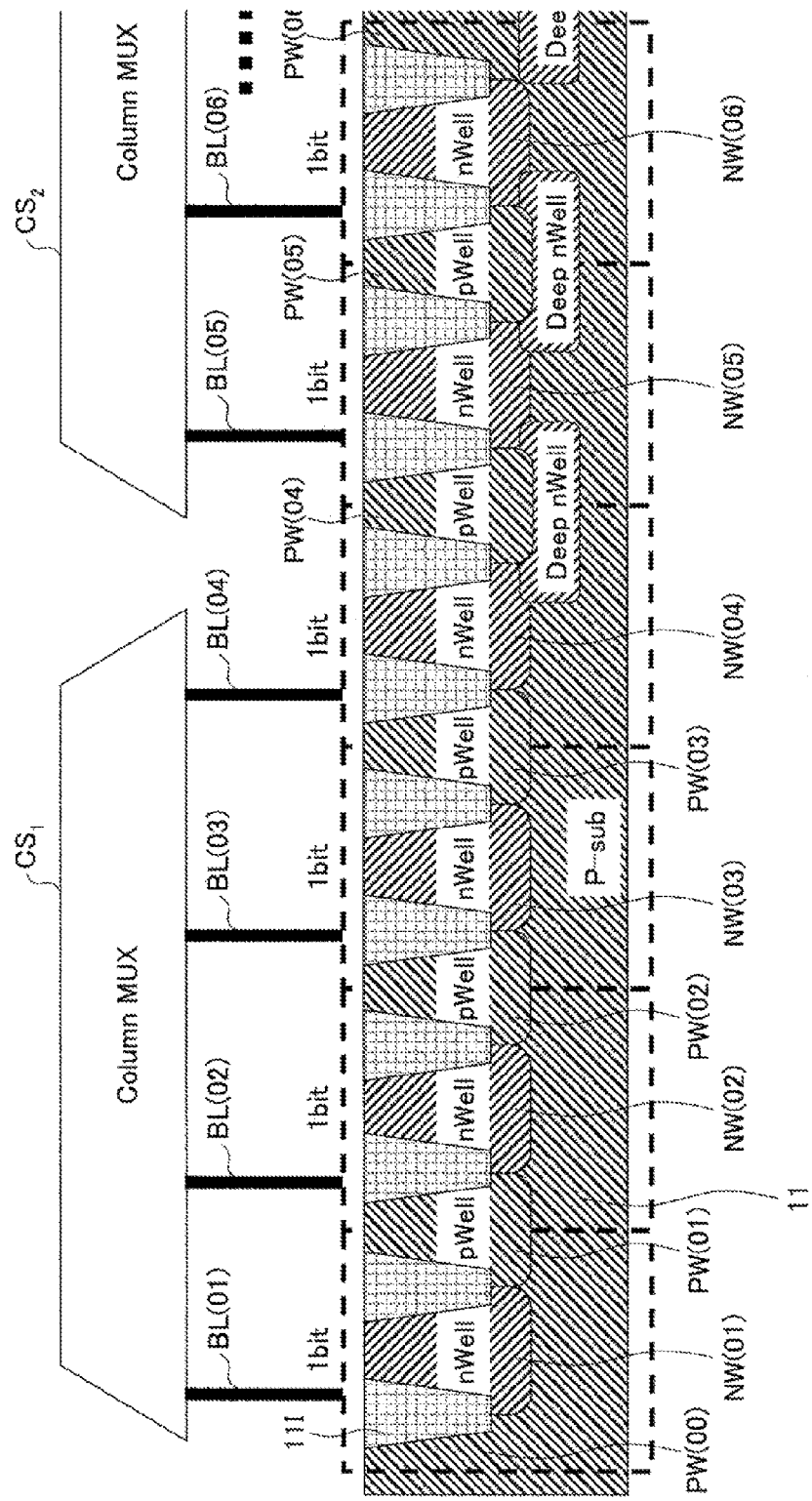
FIG. 16 is a cross-sectional diagram taken along a line D-D' of FIG. 15.

FIGS. 15 and 16 are respectively a plan view diagram and a cross-sectional diagram representing an SRAM 20 according to a second embodiment. In the drawings, those parts explained before are designated by the same reference numerals and the description thereof will be omitted. It should be noted that the cross-sectional diagram of FIG. 16 represents the cross-section taken along a line D-D' of FIG. 15. In FIG. 16, too, illustration of the gate electrodes, and the like, on the silicon substrate 11 will be omitted similarly to the case of FIGS. 8A-8C.

Referring to FIGS. 15 and 16, it can be seen that there are formed deep n-type wells $DNW_1$, $DNW_2$, $DNW_3$ and $DNW_4$ with mutual separation such that the deep n-type wells $DNW_1$, $DNW_2$, $DNW_3$ and $DNW_4$ are formed exclusively under the p-type wells of the column group $CG_2$ in correspondence to the bit lines BL(05)-BL(08), and hence the column selection circuit $CS_2$, each with a width covering only the p-type well corresponding thereto.

With such a construction, each of the p-type wells such as the p-type wells PW(04), PW(05), PW(06) . . . , is isolated from the silicon substrate 11 by any of the deep n-type wells $DNW_1$, $DNW_2$, $DNW_3$ and $DNW_4$ in each of the column groups $CG_2$, $CG_4$, . . . that are formed alternately. Further, because these deep n-type wells $DNW_1$, $DNW_2$, $DNW_3$ and $DNW_4$ are also isolated from each other, there occurs no problem of propagation of soft error via the p-type silicon substrate or the deep n-type well contrary to the case explained with reference to FIGS. 9A and 9B.

In the preceding embodiment, there are cases in which exceptional propagation of soft error is allowed as explained with reference to FIGS. 8B and 8C, while in the present embodiment, it is possible to disconnect such exceptional propagation path of the soft error.

It should be noted that such mutually separated deep n-type wells $DNW_1$, $DNW_2$, $DNW_3$ and $DNW_4$ are not limited to the column groups $CG_2$, $CG_4$, . . . that appear alternately but can be formed to all of the column groups $CG_1$, $CG_2$, $CG_3$ . . . , and hence to the entire memory cell array.

Third Embodiment

Figure 17:
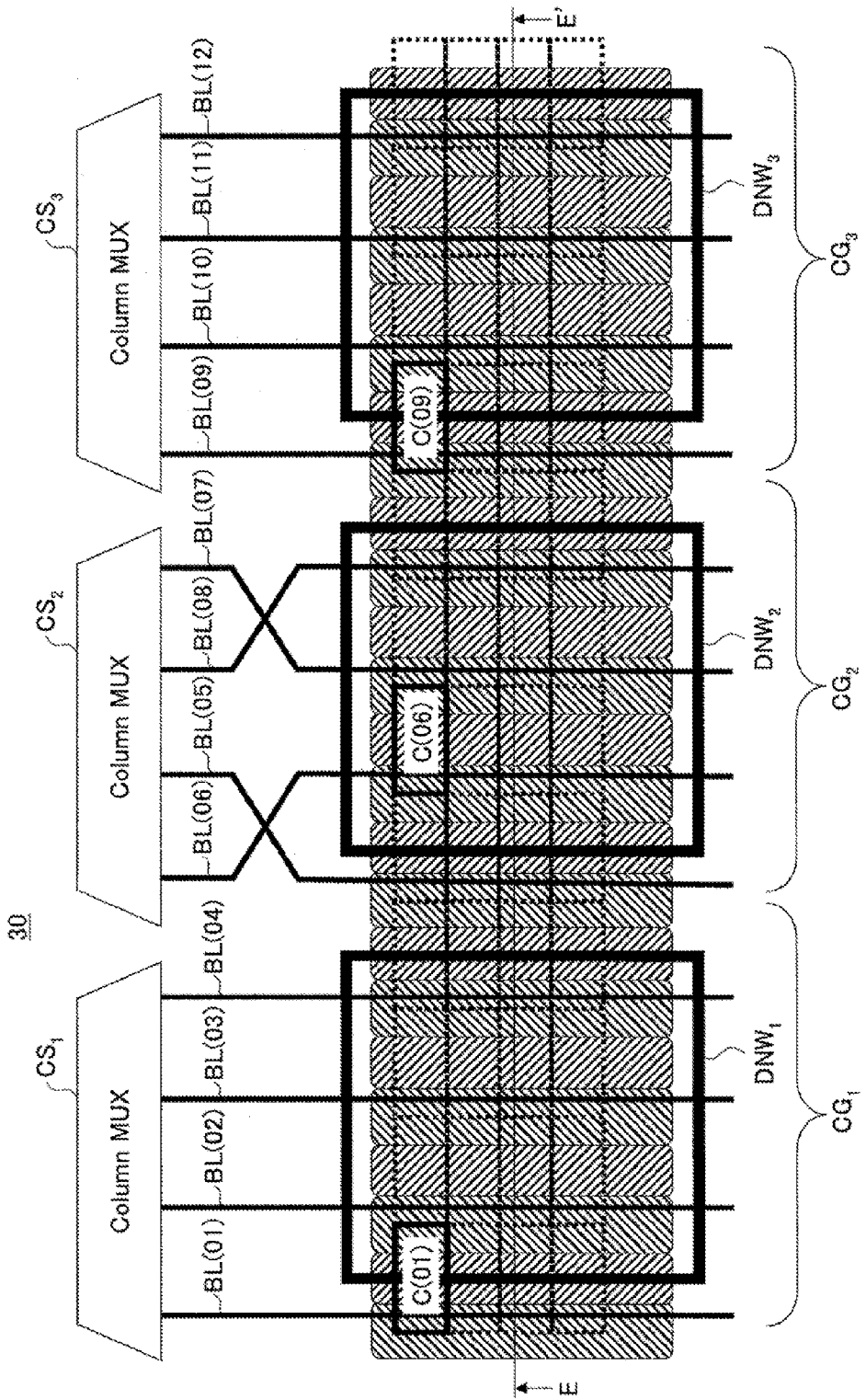
FIG. 17 is a plan view diagram showing the construction of an SRAM according to a third embodiment.
Figure 18:
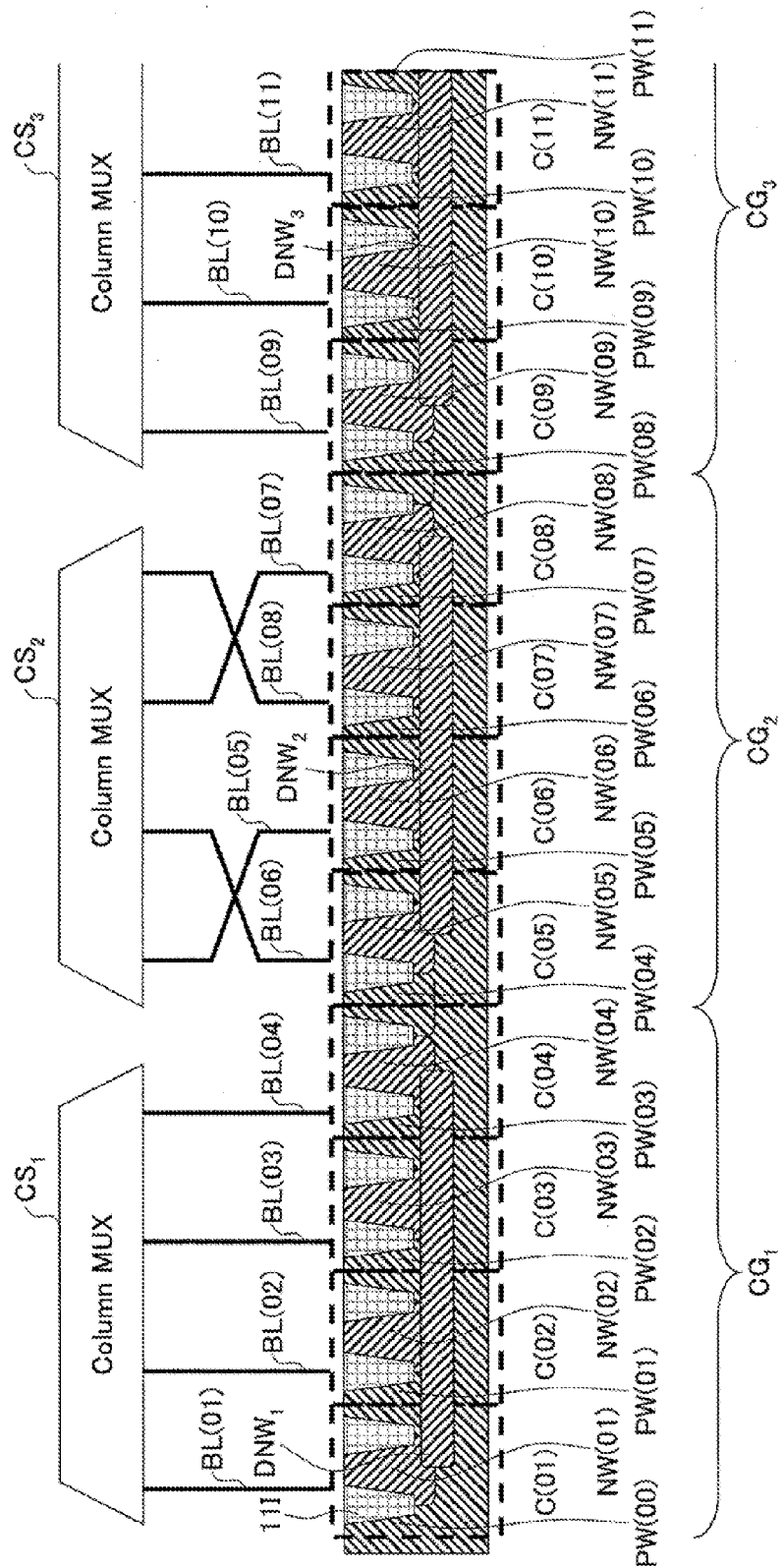
FIG. 18 is a cross-sectional diagram taken along a line E-E' of FIG. 17.

FIGS. 17 and 18 show the construction of an SRAM 30 according to a third embodiment. In FIGS. 17 and 18, those parts explained before are designated by the same reference numerals and the description thereof will be omitted. In FIG. 18, too, illustration of the gate electrodes, and the like, on the silicon substrate 11 will be omitted similarly to the case of FIGS. 8A-8C.

Referring to FIGS. 17 and 18, there are formed deep n-type wells $DNW_1$-$DNW_3$, each having a size of three cell columns, or a size in which the size of one cell column is subtracted from the size of one column group, in the row direction, such that the deep n-type wells $DNW_1$-$DNW_3$ are formed respectively in correspondence to the column groups $CG_1$, $CG_2$ and $CG_3$, and with a separation corresponding to one memory cell. Further, with the present embodiment, the column selection circuit $CS_2$ is configured such that, when the bit line BL(05) is selected, the memory cell column including the memory cell C(06) is selected also, and such that, when the bit line BL(06) is selected, the memory cell column that includes the memory cell C(05) is selected also.

On the other hand, the column selection circuit $CS_1$ and the column selection circuit $CS_3$ are configured such that, when the bit line BL(05) is selected by the column selection circuit $CS_2$, the bit line BL(01) and the bit line BL(09) are selected also, and with this, the memory cell column including the memory cell C(01) and the memory cell column including the memory cell C(09) are selected also.

By configuring the column selection circuits $CS_1$-$CS_3$ as such, the p-type well of the memory cell C(06) is isolated from the p-type silicon substrate 11 when the memory cell C(01) is selected in the construction of FIG. 18 and when the memory cell C(06) is selected at the same time, by the existence of the deep n-type well $DNW_2$, and thus, there occurs no propagation of soft error between the memory cells C(01) and C(06). Further, in the case the memory cell C(02) is selected in FIG. 18, the memory cell C(05) is selected at the same time, and thus, the p-type well of the memory cell C(02) is completely isolated form the silicon substrate 11 by the deep n-type well $DNW_1$. Thus, there occurs no propagation of soft error between the memory cells C(02) and C(05). In the present embodiment, it is necessary that each of the deep n-type wells $DNW_1$-$DNW_3$ has a width of two cell columns or more, or a width in which the size of two cell columns is subtracted from one column group, in the row direction.

Figure 19:
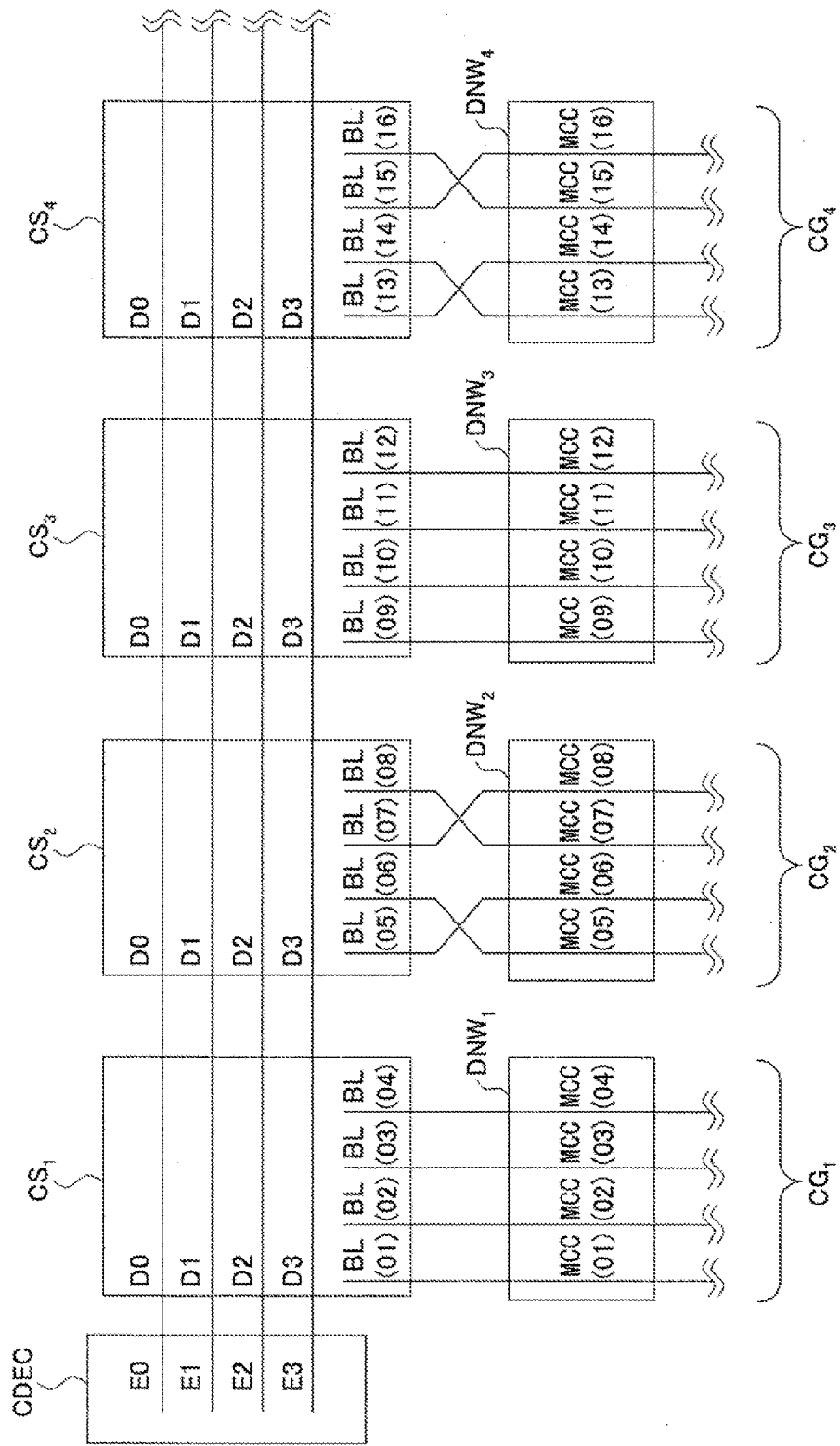
FIG. 19 is a block diagram explaining the selection of the memory cell column according to the third embodiment.

FIG. 19 is a block diagram showing the construction of the SRAM 30 while including the column selection circuit $CS_4$ and the corresponding column group $CG_4$.

Referring to FIG. 19, the column groups $CG_1$-$CG_4$ correspond to the column selection circuits $CS_1$-$CS_4$ respectively, wherein it will be noted that, in a series of column selection circuits appearing alternately starting from the column selection circuit $CS_2$, and hence in the column selection circuits $CS_2$, $CS_4$, . . . , the first bit line and the next bit line are switched with each other and the last bit line and the bit line immediately before are switched with each other at the time of the bit line selection. For example, in the column selection circuit $CS_2$, the bit line BL(05) and the bit line BL(06) are switched with each other and the bit line BL(08) and the bit line BL(07) are switched with each other. Likewise, the bit line BL(13) and the bit line BL(14) are switched with each other and the bit line BL(16) and the bit line BL(15) are switched with each other in the column selection circuit $CS_4$.

It should be noted that such a construction is provided in view of the fact that one memory cell is formed of one n-type well and two half wells of p-type that are provided at both lateral sides of the n-type well in the cross-sectional structure of FIG. 18, or the like. For example, the memory cell C(01) is formed of the n-type well NW(01), the p-type well PW(00) shared by the memory cell at the left side and the p-type well PW(01) shared by the memory cell C(02) at the right side. Thus, when the p-type well located at the outer edge as viewed from the deep n-type well, such as the memory cell C(01) that includes the p-type well PW(00), is selected for the column group $CG_1$ among the memory cells at the edge of the deep n-type well, the present embodiment avoids simultaneous selection of usual memory cell C(05) of the adjacent column group $CG_2$ but selects the memory cell C(06), which is located at an inner side of and next to the memory cell C(05) as viewed from the deep n-type well $DWN_2$ of the column group $CG_2$. With this, the conduction between the p-type well PW(00) and the p-type well PW(04) located at the outer edges is successfully avoided.

Similarly, in the event of selecting the memory cell C(04) of the column group $CG_1$ that includes the p-type memory cell PW(04), the p-type memory cell being located at the outer edge as viewed from the deep n-type well $DNW_1$, the present embodiment avoids the selection of the usual memory cell C(08) of the adjacent column group CG$_2$ but selects the memory cell C(07) at the inner side of and next to the memory cell C(08) as viewed from the column group CG$_2$. With this, conduction between the p-type wells PW(04) and PW(08) at the outer edges is avoided.

As a result, the bit line BL(05) is connected to the memory cell column MCC(06) that includes the memory cell C(06) and the bit line BL(06) is connected to the memory cell column MC(05) that includes the memory cell C(05) in the column selection circuit CS$_2$ or CS$_4$. Further, the bit line BL(08) is connected to the memory cell column MCC(07) that includes the memory cell C(07) and the bit line BL(07) is selected to the memory cell column MCC(08) that includes the memory cell C(08). Further, the bit line BL(13) is connected to the memory cell column MCC(14) that includes the memory cell C(14) and the bit line BL(14) is selected to the memory cell column MCC(13) that includes the memory cell C(13). Further, the bit line BL(16) is connected to the memory cell column MCC(15) that includes the memory cell C(15) and the bit line BL(15) is selected to the memory cell column MCC(16) that includes the memory cell C(16).

Contrary to this, in the column selection circuit CS$_1$, the bit line BL(01) is connected to the memory cell column MCC(01) that includes the memory cell C(01) and the bit line BL(02) is connected to the memory cell column MCC(02) that includes the memory cell C(02), and the bit line BL(03) is connected to the memory cell column MCC(03) that includes the memory cell C(03) and the bit line BL(04) is connected to the memory cell column MCC(04) that includes the memory cell C(04). Further, with regard to the column selection circuit CS$_3$, the bit line BL(09) is connected to the memory cell column MCC(09) that includes the memory cell C(09) and the bit line BL(10) is connected to the memory cell column MCC(10) that includes the memory cell C(10), and the bit line BL(11) is connected to the memory cell column MCC(11) that includes the memory cell C(11) and the bit line BL(12) is connected to the memory cell column MCC(12) that includes the memory cell C(12).

In the present embodiment, it should be noted that, in the event the memory cell column MCC(01) that includes the memory cell C(01) is selected in the column group CG$_1$ by the column selection circuit CS$_1$, the memory cell column MCC(06) that includes the memory cell C(06) is selected in the next column group CG$_2$. Further, in the next column group CG$_3$, the memory cell column MCC(09) that includes the memory cell C(09) is selected, while in the next column group CG$_4$, the column group MCC(14) that includes the memory cell C(14) is selected.

In this case, any of the p-type well and the n-type well constituting the memory cell C(06) is isolated from the p-type well or n-type well that constitutes the memory cell C(01) or from the p-type well or n-type well that constitutes the memory cell C(09) by the deep n-type well DNW$_2$, and thus, incidence of charged particles occurred in any of the memory cells does not affect other memory cells.

Similarly, it should be noted that, in the event the memory cell column MCC(02) that includes the memory cell C(02) is selected in the column group CG$_1$ by the column selection circuit CS$_1$, the memory cell column MCC(05) that includes the memory cell C(05) is selected in the next column group CG$_2$. Further, in the next column group CG$_3$, the memory cell column MCC(10) that includes the memory cell C(10) is selected, while in the next column group CG$_4$, the column group MCC(13) that includes the memory cell C(13) is selected.

In this case, any of the p-type well and the n-type well constituting the memory cell C(05) is isolated from the p-type well or n-type well that constitutes the memory cell C(02) or from the p-type well or n-type well that constitutes the memory cell C(13) by the deep n-type well DNW$_1$ or DNW$_3$, and thus, incidence of charged particles occurred in any of the memory cells does not affect other memory cells.

Similarly, it should be noted that, in the event the memory cell column MCC(03) that includes the memory cell C(03) is selected in the column group CG$_1$ by the column selection circuit CS$_1$, the memory cell column MCC(08) that includes the memory cell C(08) is selected in the next column group CG$_2$. Further, in the next column group CG$_3$, the memory cell column MCC(11) that includes the memory cell C(11) is selected, while in the next column group CG$_4$, the column group MCC(16) that includes the memory cell C(16) is selected.

In this case, any of the p-type well and the n-type well constituting the memory cell C(08) is isolated from the p-type well or n-type well that constitutes the memory cell C(03) or from the p-type well or n-type well that constitutes the memory cell C(11) by the deep n-type well DNW$_1$, DNW$_2$ and DNW$_3$, and thus, incidence of charged particles occurred in any of the memory cells does not affect other memory cells.

Similarly, it should be noted that, in the event the memory cell column MCC(04) that includes the memory cell C(04) is selected in the column group CG$_1$ by the column selection circuit CS$_1$, the memory cell column MCC(07) that includes the memory cell C(07) is selected in the next column group CG$_2$. Further, in the next column group CG$_2$, the memory cell column MCC(12) that includes the memory cell C(12) is selected, while in the next column group CG$_4$, the column group MCC(15) that includes the memory cell C(15) is selected.

In this case, any of the p-type well and the n-type well constituting the memory cell C(07) is isolated from the p-type well or n-type well that constitutes the memory cell C(04) or from the p-type well or n-type well that constitutes the memory cell C(12) by the deep n-type well DNW$_1$, DNW$_2$ and DNW$_2$, and thus, incidence of charged particles occurred in any of the memory cells does not affect other memory cells.

Thus, with the SRAM 30 of the present embodiment, the propagation paths of soft error via the p-type silicon substrate 11 are completely blocked by the deep n-type wells DNW$_1$, DNW$_2$ . . . , and the propagation paths of soft error through the deep n-type wells DNW$_1$, DNW$_2$ . . . are also blocked completely. Thus, with the SRAM 30 of this embodiment, resistance against soft error is improved further as compared with the first embodiment.

In FIG. 19, it should be noted that the memory cell columns MCC(01)-MCC(16) represent a part of the memory cell array depicted in FIG. 3 or FIG. 4.

Further, as can be seen from the cross-sectional diagram of FIG. 18, there exists a cut, in other words the region not formed with the deep n-type well, between a deep n-type well, such as the deep n-type well DNW$_1$, and an adjacent deep n-type well, such as the deep n-type well DNW$_2$, with a size of one memory cell. Because of existence of such a cut, the constraints with regard to the precision at the time of formation of the deep n-type well DNW$_1$-DNW$_3$ by ion implantation process are relaxed, and it becomes possible to improve the yield at the time of production of the semiconductor device that includes the SRAM as compared with the second embodiment.

Fourth Embodiment

Figure 20A:
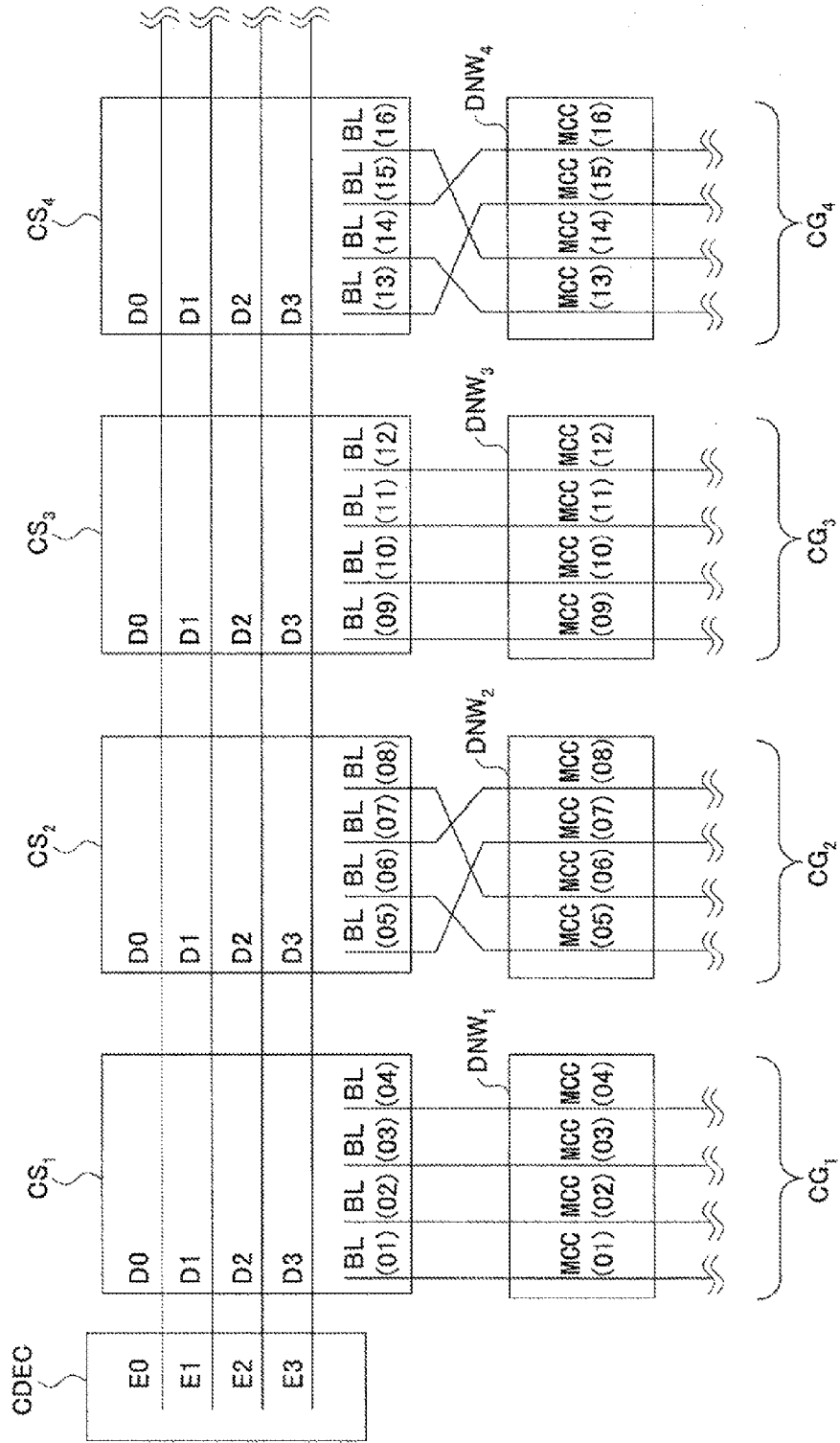
FIG. 20A is a block diagram explaining the selection of the memory cell column according to a fourth embodiment.
Figure 20B:
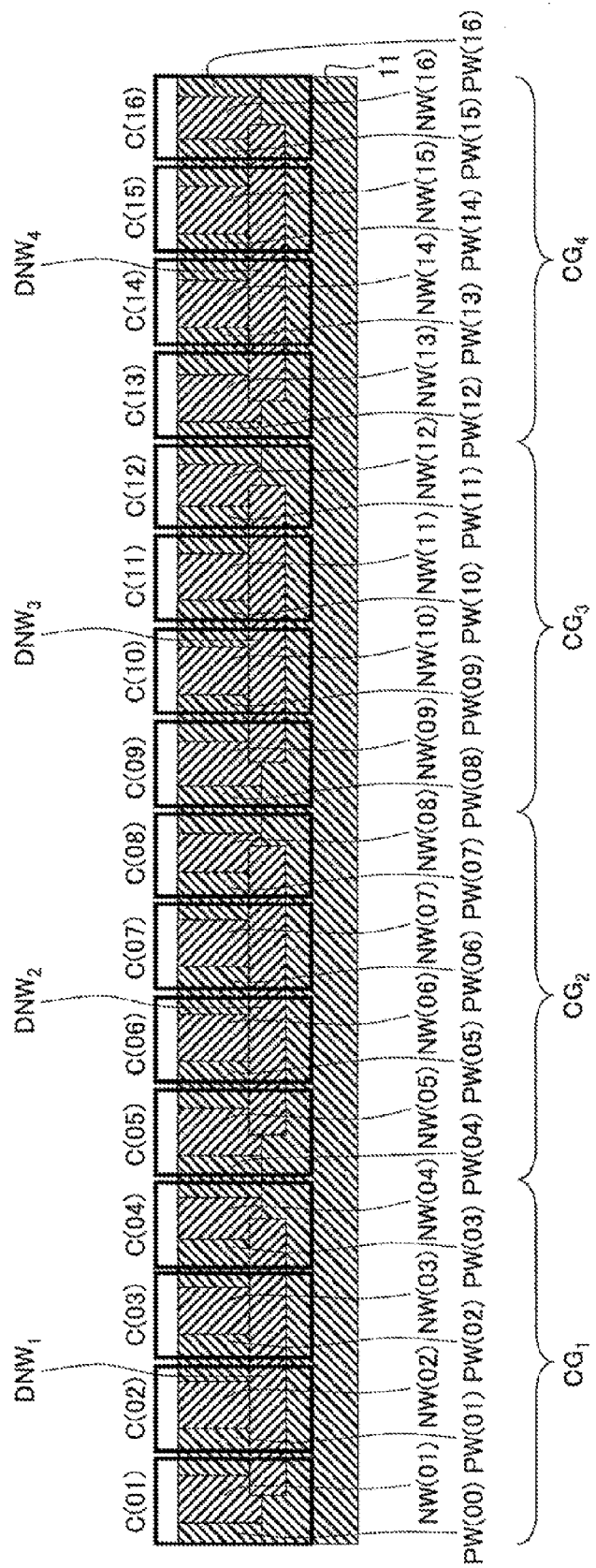
FIG. 20B is a cross-sectional view diagram showing the construction of an SRAM according to the fourth embodiment.

FIGS. 20A and 20B represent the construction of an SRAM 40 according to a fourth embodiment in which the construction of the column selection circuit of the third embodiment is modified. It should be noted that FIG. 20A represents the circuit diagram for the memory cell column selection similar to that of FIG. 19, while FIG. 20B represents the deep-n-type wells $DNW_1$ and $DNW_2$ used with the present embodiment. In the cross-section of FIG. 20B, too, illustration of the gate electrodes, and the like, on the silicon substrate 11 will be omitted similarly to the case of FIGS. 8A-8C.

Here, it should be noted that FIG. 20B is a diagram identical to the cross-sectional diagram of the third embodiment noted previously, except that, for the sake of simplicity, only the p-type wells PW(00)-PW(16), n-type wells NW(01)-NW (16), the deep n-type wells $DNW_1$ and $DNW_2$ and the memory cells C(01)-C(16) are represented schematically. Illustration of the device isolation structure 11I is omitted.

Referring to FIG. 20A, it should be noted that, in the event the memory cell column MCC(01) that includes the memory cell C(01) is selected in the column group $CG_1$ by the column selection circuit $CS_1$, the memory cell column MCC(06) that includes the memory cell C(06) is selected in the next column group $CG_2$ in the present embodiment. Further, in the next column group $CG_3$, the memory cell column MCC(09) that includes the memory cell C(09) is selected, while in the next column group $CG_4$, the column group MCC(15) that includes the memory cell C(15) is selected.

In this case, any of the p-type well and the n-type well constituting the memory cell C(07) is isolated from the p-type well or n-type well that constitutes the memory cell C(01) or from the p-type well or n-type well that constitutes the memory cell C(15) by the deep n-type well $DNW_1$, $DNW_2$ and $DNW_3$, and thus, incidence of charged particles occurred in any of the memory cells does not affect other memory cells.

Similarly, it should be noted that, in the event the memory cell column MCC(02) that includes the memory cell C(02) is selected in the column group $CG_1$ by the column selection circuit $CS_1$, the memory cell column MCC(05) that includes the memory cell C(05) is selected in the next column group $CG_2$. Further, in the next column group $CG_3$, the memory cell column MCC(09) that includes the memory cell C(09) is selected, while in the next column group $CG_4$, the column group MCC(13) that includes the memory cell C(13) is selected.

In this case, any of the p-type well and the n-type well constituting the memory cell C(05) is isolated from the p-type well or n-type well that constitutes the memory cell C(02) or from the p-type well or n-type well that constitutes the memory cell C(13) by the deep n-type well $DNW_1$, $DNW_2$ and $DNW_3$, and thus, incidence of charged particles occurred in any of the memory cells does not affect other memory cells.

Similarly, it should be noted that, in the event the memory cell column MCC(03) that includes the memory cell C(03) is selected in the column group $CG_1$ by the column selection circuit $CS_1$, the memory cell column MCC(08) that includes the memory cell C(08) is selected in the next column group $CG_2$. Further, in the next column group $CG_3$, the memory cell column MCC(11) that includes the memory cell C(11) is selected, while in the next column group $CG_4$, the column group MCC(16) that includes the memory cell C(16) is selected.

In this case, any of the p-type well and the n-type well constituting the memory cell C(08) is isolated from the p-type well or n-type well that constitutes the memory cell C(03) or from the p-type well or n-type well that constitutes the memory cell C(11) by the deep n-type well $DNW_1$, $DNW_2$ and $DNW_3$, and thus, incidence of charged particles occurred in any of the memory cells does not affect other memory cells.

Similarly, it should be noted that, in the event the memory cell column MCC(04) that includes the memory cell C(04) is selected in the column group $CG_1$ by the column selection circuit $CS_1$, the memory cell column MCC(06) that includes the memory cell C(06) is selected in the next column group $CG_2$. Further, in the next column group $CG_3$, the memory cell column MCC(12) that includes the memory cell C(12) is selected, while in the next column group $CG_4$, the column group MCC(14) that includes the memory cell C(14) is selected.

In this case, any of the p-type well and the n-type well constituting the memory cell C(06) is isolated from the p-type well or n-type well that constitutes the memory cell C(04) or from the p-type well or n-type well that constitutes the memory cell C(12) by the deep n-type well $DNW_1$, $DNW_2$ and $DNW_3$, and thus, incidence of charged particles occurred in any of the memory cells does not affect other memory cells.

Thus, with the SRAM 40 of the present embodiment, too, the propagation path of soft error via the p-type silicon substrate 11 is completely disconnected by the deep n-type wells $DNW_2$, $DNW_2$ ..., and the propagation path of soft error via the deep n-type wells $DNW_1$, $DNW_2$ ... are also disconnected completely. Thus, with the SRAM 40 of this embodiment, resistance against soft error is improved further as compared with the first embodiment.

Further, as can be seen from the cross-sectional diagram of FIG. 20B, there exists a cut, in other words the region not formed with the deep n-type well, between a deep n-type well, such as the deep n-type well $DNW_1$, and an adjacent deep n-type well, such as the deep n-type well $DNW_2$, with a size of one memory cell. Because of existence of such a cut, the constraints with regard to the precision at the time of formation of the deep n-type well $DNW_1$-$DNW_3$ by ion implantation process are relaxed, and it becomes possible to improve the yield at the time of the semiconductor device that includes the SRAM as compared with the second embodiment.

Fifth Embodiment

FIGS. 21A and 21B show the construction of an SRAM 50 according to a fifth embodiment. It should be noted that FIG. 21A represents the circuit diagram for the memory cell column selection similar to that of FIG. 19, while FIG. 21B represents the deep n-type wells $DNW_1$ and $DNW_2$ used with the present embodiment. In the cross-section of FIG. 21B, too, illustration of the gate electrodes, and the like, on the silicon substrate 11 will be omitted similarly to the case of FIGS. 8A-8C.

Referring to the cross-sectional diagram of FIG. 21B at first, each of the deep n-type wells $DNW_1$-$DNW_5$ has a size of three cells in the row direction also in the present embodiment and is formed with a mutual separation of one memory cell, wherein it can be seen that the deep n-type wells $DNW_1$-$DNW_5$ are shifted with regard to the respective column group in the word line direction by two memory cells.

In the present embodiment, the column selection circuit identical to that of FIG. 19 is used as represented in FIG. 21A, wherein, in each of the column selection circuits that appears alternately starting from the column selection circuit $CS_2$, and thus in the column selection circuits $CS_2$, $CS_4$, ..., it will be noted that the first bit line and the next bit line are switched at the time of bit line selection. Further, the last bit line and the bit line immediately before the last bit line are switched. For example, in the column selection circuit $CS_2$, the bit line BL(05) and the bit line BL(06) are switched with each other and the bit line BL(08) and the bit line BL(07) are switched with each other. Likewise, the bit line BL(13) and the bit line BL(14) are switched with each other and the bit line BL(16) and the bit line BL(15) are switched with each other in the column selection circuit $CS_4$.

Thus, in the event the memory cell column MCC(01) that includes the memory cell C(01) is selected in the column group $CG_1$ by the column selection circuit $CS_1$, it will be noted that the memory cell column MCC(06) that includes the memory cell C(06) is selected in the next column group $CG_2$. Further, in the next column group $CG_3$, the memory cell column MCC(09) that includes the memory cell C(09) is selected, while in the next column group $CG_4$, the column group MCC(14) that includes the memory cell C(14) is selected.

In this case, any of the p-type well and the n-type well constituting the memory cell C(06) is isolated from the p-type well or n-type well that constitutes the memory cell C(01) or from the p-type well or n-type well that constitutes the memory cell C(09) by the deep n-type well $DNW_2$, and thus, incidence of charged particles occurred in any of the memory cells does not affect other memory cells.

Similarly, it should be noted that, in the event the memory cell column MCC(02) that includes the memory cell C(02) is selected in the column group $CG_1$ by the column selection circuit $CS_1$, the memory cell column MCC(05) that includes the memory cell C(05) is selected in the next column group $CG_2$. Further, in the next column group $CG_3$, the memory cell column MCC(09) that includes the memory cell C(09) is selected, while in the next column group $CG_4$, the column group MCC(13) that includes the memory cell C(13) is selected.

In this case, any of the p-type well and the n-type well constituting the memory cell C(05) is isolated from the p-type well or n-type well that constitutes the memory cell C(02) or from the p-type well or n-type well that constitutes the memory cell C(13) by the deep n-type well $DNW_1$ or $DNW_3$, and thus, incidence of charged particles occurred in any of the memory cells does not affect other memory cells.

Similarly, it should be noted that, in the event the memory cell column MCC(03) that includes the memory cell C(03) is selected in the column group $CG_1$ by the column selection circuit $CS_1$, the memory cell column MCC(08) that includes the memory cell C(08) is selected in the next column group $CG_2$. Further, in the next column group $CG_3$, the memory cell column MCC(11) that includes the memory cell C(11) is selected, while in the next column group $CG_4$, the column group MCC(16) that includes the memory cell C(16) is selected.

In this case, any of the p-type well and the n-type well constituting the memory cell C(08) is isolated from the p-type well or n-type well that constitutes the memory cell C(03) or from the p-type well or n-type well that constitutes the memory cell C(11) by the deep n-type well $DNW_1$, $DNW_2$ and $DNW_3$, and thus, incidence of charged particles occurred in any of the memory cells does not affect other memory cells.

Similarly, it should be noted that, in the event the memory cell column MCC(04) that includes the memory cell C(04) is selected in the column group $CG_1$ by the column selection circuit $CS_1$, the memory cell column MCC(07) that includes the memory cell C(07) is selected in the next column group $CG_2$. Further, in the next column group $CG_3$, the memory cell column MCC(12) that includes the memory cell C(12) is selected, while in the next column group $CG_4$, the column group MCC(15) that includes the memory cell C(15) is selected.

In this case, any of the p-type well and the n-type well constituting the memory cell C(07) is isolated from the p-type well or n-type well that constitutes the memory cell C(04) or from the p-type well or n-type well that constitutes the memory cell C(12) by the deep n-type well $DNW_2$ or $DNW_4$, and thus, incidence of charged particles occurred in any of the memory cells does not affect other memory cells.

Thus, with the SRAM 50 of the present embodiment, too, the propagation path of soft error via the p-type silicon substrate 11 is completely disconnected by the deep n-type wells $DNW_1$, $DNW_2$ . . . and the propagation path of soft error via the deep n-type wells $DNW_1$, $DNW_2$ . . . is also disconnected completely, similarly to the case of the third embodiment. Thus, with the SRAM 50 of this embodiment, resistance against soft error is improved further as compared with the first embodiment.

Further, as can be seen from the cross-sectional diagram of FIG. 21B, there exists a cut, in other words the region not formed with the deep n-type well, between a deep n-type well, such as the deep n-type well $DNW_1$, and an adjacent deep n-type well, such as the deep n-type well $DNW_2$, with a size of one memory cell also in the present embodiment. Because of existence of such a cut, the constraints with regard to the precision at the time of formation of the deep n-type well $DNW_1$-$DNW_3$ by ion implantation process are relaxed, and it becomes possible to improve the yield at the time of production of the semiconductor device that includes the SRAM as compared with the second embodiment explained before Further, with the present embodiment, it is also possible to modify the selection of the memory cell column by the column selection circuits $CS_2$ and $CS_4$ as represented in FIG. 21C, which represents an SRAM 50A according to a modification of the present embodiment.

Sixth Embodiment

In the foregoing, explanation has been made for the case in which one column group includes four memory cell columns. However, the foregoing explanation holds also in the case in which the column group includes a large number of memory cell columns.

Figure 22A:
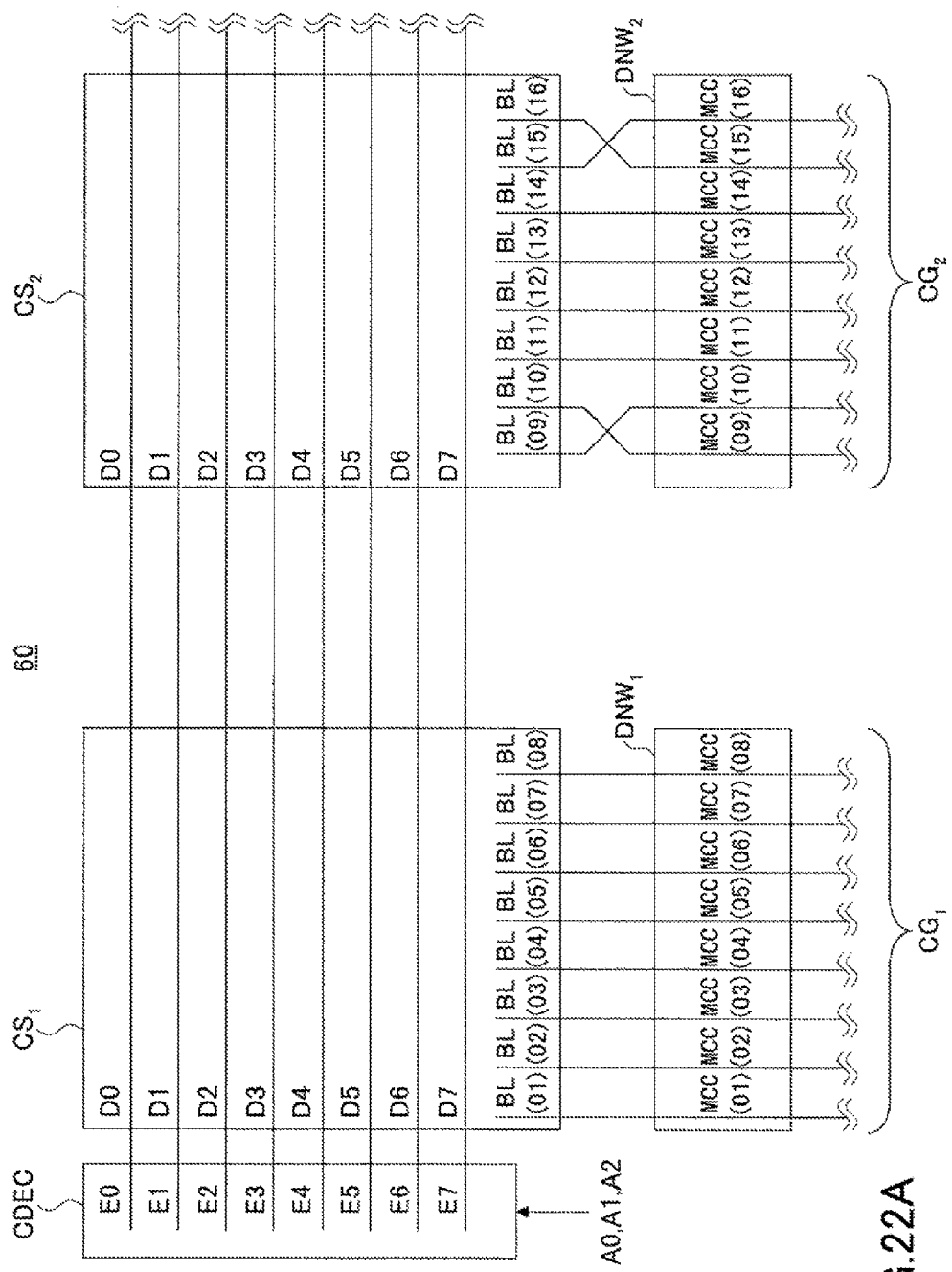
FIG. 22A is a diagram showing a modification of a sixth embodiment.

For example, FIG. 22A represents the block diagram of an SRAM 60 in which the construction of FIGS. 17 and 18 is expanded such that one column group includes eight memory cell columns, the column decoder CDEC produces selection signals E0-E7 in response to 3 bit address data A0, A1 and A2, and the column selection circuits $CS_1$, $CS_2$ . . . are activated by supplying a selection signal to one of eight lines D0-D8. In the example of FIG. 22A, the column group $CG_1$ includes eight memory cell columns MCC(01)-MCC(08) and the column group $CG_2$ includes eight memory cell columns MCC(09)-MCC(08). Further, with the SRAM 60 of FIG. 22A, each of the column groups $CG_1$, $CG_2$, $CG_3$, $CG_4$ . . . has a size of 8 cells in the row direction and each of the deep n-wells $DNW_1$-$DNW_4$ has a size of 6 cells in the row direction, wherein the n-type wells are formed repeatedly with an interval corresponding to the size of 2 cells in the row direction. In FIG. 22A, only the column selection circuits $CS_1$ and $CS_2$ and only the column groups $CG_1$ and $CG_2$ are represented.

With such a construction, too, the problem of propagation of soft error caused by conduction between the outermost p-type wells via the p-type silicon substrate 11 is eliminated by selecting, in the case the memory cell column MCC(01) located at the edge of the deep n-type well $DNW_1$ is selected in the column group $CG_1$, the memory cell column MCC(10) located at an inner side and next to the memory cell column MCC(09) as viewed from the deep n-type well $DNW_2$ of the column group $CG_2$, rather than the memory cell column MCC(09) which is normally selected in the adjacent column group $CG_2$.

Figure 22B:
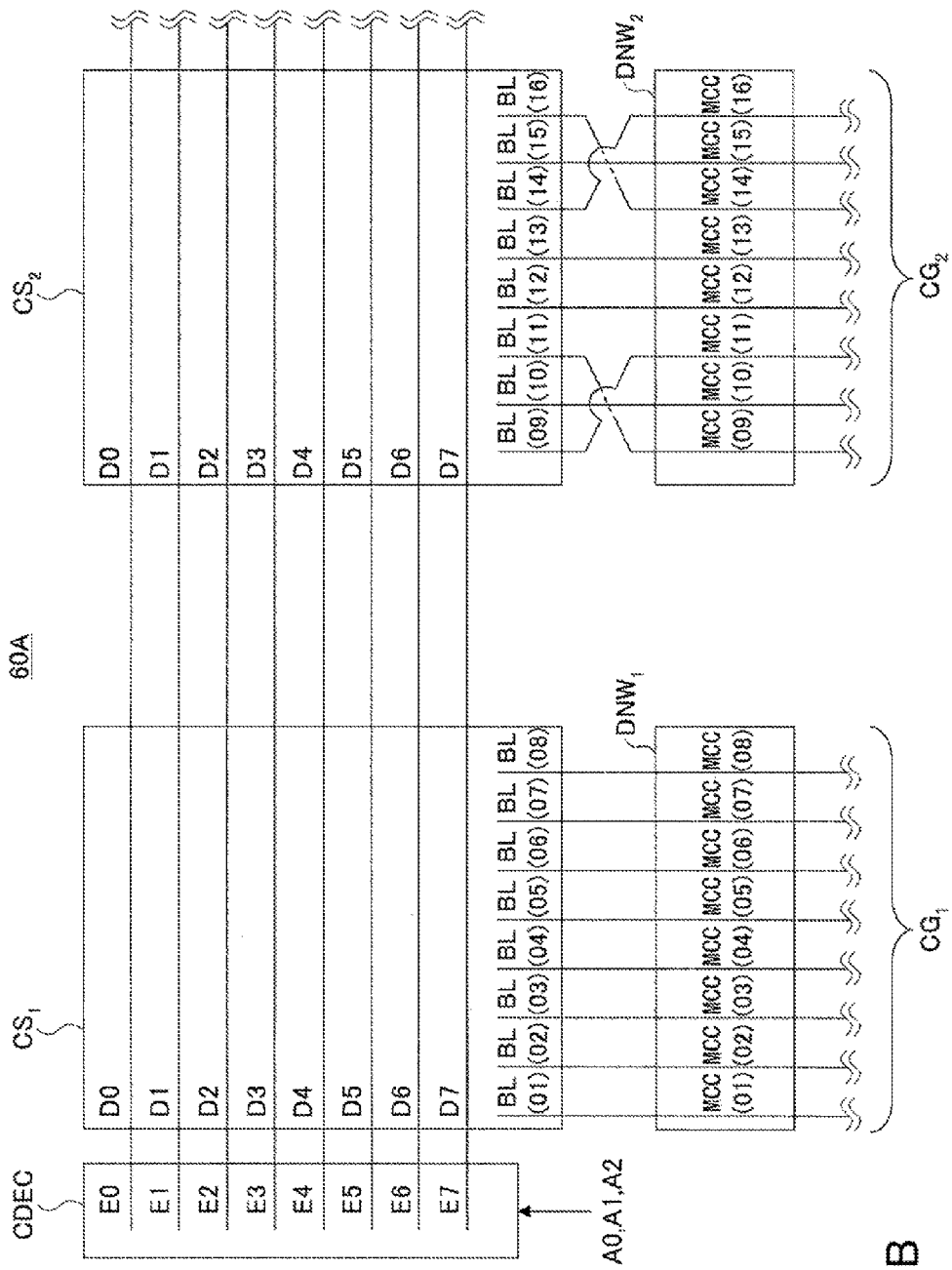
FIG. 22B is a diagram showing a modification of the sixth embodiment.

Further, with the SRAM of the present embodiment having the construction in which there are included more than four memory cell columns in one column group and in which the column selection circuit includes more than four bit lines in correspondence thereto, it is also effective, for avoiding the conduction between the memory cells located at respective ends of the mutually adjacent column groups, such as the memory cell C(01) of the column group $CG_1$ and the memory cell C(09) of the column group $CG_2$, to select an arbitrary memory cell column located at an inner side and next to one or more memory cell columns from both lateral edges of the deep n-type well $DNW_2$, such as the memory cell column MCC(11), which is located at the inner side and next to two memory cells from the lateral edge of the deep n-type $DNW_2$, as represented in a modification 60A of FIG. 22B.

Seventh Embodiment

FIG. 23B is a block diagram showing the construction of an SRAM 70 according to a seventh embodiment. In the drawings, those parts explained before are designated by the same reference numerals and the description thereof will be omitted.

Figure 23:
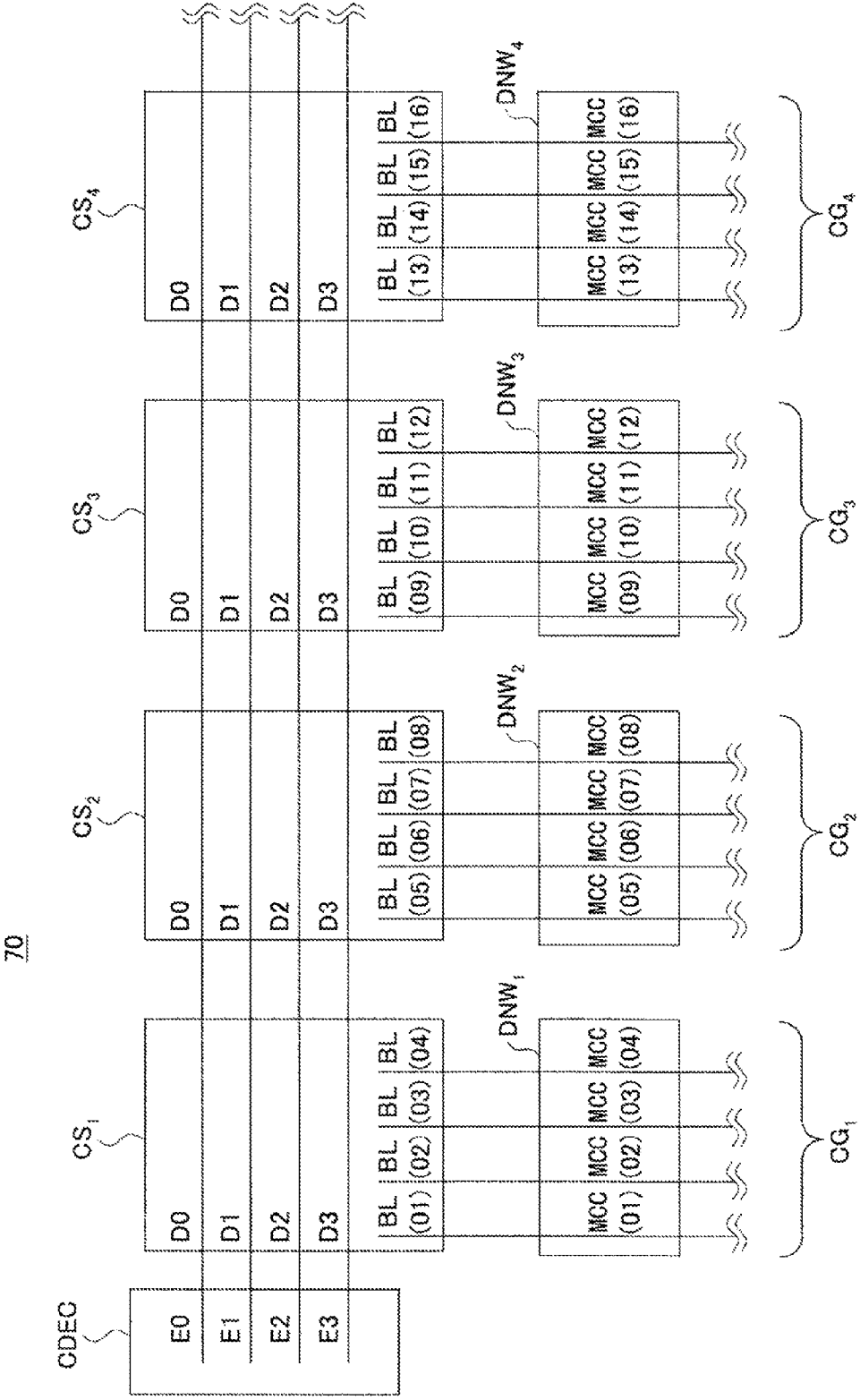
FIG. 23 is a diagram showing a modification of a seventh embodiment.

Referring to FIG. 23, the seventh embodiment is a modification of the third embodiment in that the memory cell column MCC(05) is selected in place of the memory cell column MCC(06) in the event the bit line BL(05) is selected in the column selection circuit $CS_2$ and the memory cell column MCC(06) is selected in place of the memory cell column MCC(05) in the event the bit line BL(06) is selected in the column selection circuit $CS_2$, and such that the memory cell column MC(13) is selected in place of the memory cell column MCC(14) in the event the bit line BL(13) is selected in the column selection circuit $CS_4$ and the memory cell column MCC(14) is selected in place of the memory cell column MCC(13) in the event the bit line BL(14) is selected in the column selection circuit $CS_4$.

In the case of such memory cell column selection, it is not possible to block the propagation of the exceptional soft error between the memory cell columns MCC(01) and MCC(05), or between the memory cell columns MCC(04) and MCC(08), between the memory cell columns MCC(09) and MCC(13), or between the memory cell columns MCC(12) and MCC(16) similarly to the case explained previously with reference to FIGS. 8B and 8C. In spite of the foregoing, the propagation of soft error between other memory cell columns is effectively blocked by the foregoing n-type deep wells $DNW_1$-$DNW_4$, and the SRAM 70 provides a soft error resistance much improved over the comparative examples explained with reference to FIG. 9A or 9B.

Eighth Embodiment

FIG. 24 is a cross-sectional diagram schematically representing the column groups of various constructions in which one or more deep n-type wells are formed underneath the p-type well and the n-type well of the memory cell array of FIG. 4.

In FIG. 24, it should be noted that Macro_0-Macro_17 represent the macro of various column groups while MCC0-MCC3 correspond respectively to any of the memory cell columns MCC(01)-MCC(04), MCC(05)-MCC(08), MCC(09)-MCC(12), MCC(13)-MCC(16) .... Further, MC0-MC3 correspond respectively to any of the memory cells C(01)-C(04), C(05)-C(08), C(09)-C(12), C(13)-C(16) ....

Further in FIG. 24, it should be noted that "sub" corresponds to the p-type silicon substrate 11, "PW" corresponds to any of the p-type wells PW(00)-PW(04), PW(05)-PW(08), PW(09)-PW(12) ..., "NW" corresponds to any of the n-type wells NW(01)-NW(04), NW(05)-NW(08), NW(09)-NW(12), and "DNW" corresponds to any of the deep n-type wells $DNW_1$, $DNW_2$, $DNW_3$, ... Further, the broken lines in FIG. 24 correspond to the respective memory cells.

Here, the Macro_0 corresponds to the construction in which no deep well is included in a column group, and the Macro_17 corresponds to the construction in which the deep n-type well is formed throughout the entire column group.

On the other hand, the Macro_1 corresponds to the structure in which there is formed a deep n-type well having the size of one memory cell column in the row direction at a location offset from the left edge of the structure by one memory cell in the direction toward the interior such that the deep n-type well extends from the memory cell column MCC0 to the memory cell column MCC1. With the structure of the Macro_1, the deep n-type well DNW isolates the p-type well located across the boundary between the memory cell column MCC0 and the memory cell column MCC1 entirely from the p-type silicon substrate 11.

In the Macro_2, the deep n-type well DNW is moved in the right direction with a distance of one memory cell as compared with the Macro_1, and thus, the deep n-type well DNW extends from the memory cell column $MCC_1$ to the memory cell column $MCC_2$. With the structure of Macro_2, the p-type well located at the boundary of the memory cell columns $MCC_1$ and $MCC_2$ is isolated entirely from the p-type silicon substrate 11 by the deep n-type well DNW.

In the Macro_3, the deep n-type well DNW is moved further in the right direction with a distance of one memory cell as compared with the Macro_2, and thus, the deep n-type well DNW extends from the memory cell column $MCC_2$ to the memory cell column $MCC_3$. With the structure of the Mcro_3, the p-type well located at the boundary of the memory cell columns $MCC_2$ and $MCC_3$ is isolated entirely from the p-type silicon substrate 11 by the deep n-type well DNW.

In the Macro_4, the deep n-type well DNW is moved further in the right direction with a distance of one memory cell as compared with the Macro_3, and as a result, a part of the deep n-type well DNW of the size of half memory cell is formed underneath a half well of p-type located at the left edge of the memory cell column $MCC_3$ and isolates that half well from the p-type silicon substrate 11. Further, the remaining half memory cell of the deep n-type well DNW at the right edge of the same column group is now formed underneath the half well of p-type located at the right edge of the memory cell column $MCC_3$ and isolates the same from the silicon substrate 11.

Next, in the Macro_5, the deep n-type well DNW has a size of two memory cell columns in the row direction and is formed to extend from the right half of the memory cell column $MCC_0$ to the left half of the memory cell column $MCC_2$ while covering the entirety of the memory cell column $MCC_1$, and as a result, the p-type well formed across the boundary between the memory cell column $MCC_0$ and the memory cell column $MCC_1$ and the p-type well formed across the boundary between the memory cell column $MCC_1$ and the memory cell column $MCC_2$ are isolated completely from the p-type silicon substrate 11 by the deep n-type well DNW.

In the Macro_6, the deep n-type well of the Macro_5 is moved in the right direction by a distance of one memory cell and is formed to extend from the right half of the memory cell column $MCC_1$ to the left half of the memory cell column $MCC_3$ while covering the entirety of the memory cell column $MCC_2$, and as a result, the p-type well formed across the boundary between the memory cell column $MCC_1$ and the memory cell column $MCC_2$ and the p-type well formed across the boundary between the memory cell column $MCC_2$ and the memory cell column $MCC_3$ are isolated completely from the p-type silicon substrate 11 by the deep n-type well DNW.

In the Macro_7, the deep n-type well of the Macro_6 is moved in the right direction further by a distance of one memory cell and is formed to extend from the right half of the memory cell column $MCC_2$ to the right half of the memory cell column $MCC_0$ while covering the entirety of the memory cell column $MCC_2$, and as a result, the p-type well formed across the boundary between the memory cell column $MCC_2$ and the memory cell column $MCC_3$ and the p-type well formed across the boundary between the memory cell column $MCC_3$ and the memory cell column $MCC_0$ are isolated completely from the p-type silicon substrate 11 by the deep n-type well DNW.

In the Macro_8, the deep n-type well of the Macro_7 is moved in the right direction further by a distance of one memory cell and is formed to extend from the right half of the memory cell column $MCC_3$ to the left half of the memory cell column $MCC_2$ while covering the entirety of the memory cell column $MCC_0$, and as a result, the p-type well formed at the right edge of the memory cell column $MCC_3$ and the p-type well formed at the right edge of the memory cell column $MCC_0$ are isolated completely from the p-type silicon substrate 11 by the deep n-type well DNW.

Next, in the Macro_9, the deep n-type well DNW has a size of three memory cell columns in the row direction and is formed to extend from the right half of the memory cell column $MCC_0$ to the left half of the memory cell column $MCC_2$ while covering the entirety of the memory cell columns $MCC_2$ and $MCC_2$, and as a result, the p-type well formed across the boundary between the memory cell columns $MCC_0$ and $MCC_2$, the p-type well formed across the boundary between the memory cell columns $MCC_2$ and $MCC_2$ and the p-type well formed across the memory cell columns $MCC_2$ and $MCC_2$ are isolated completely from the p-type silicon substrate 11 by the deep n-type well DNW.

In the Macro_10, the deep n-type well of the Macro_9 is moved in the right direction further by a distance of two memory cells and is formed to extend from the right half of the memory cell column $MCC_2$ to the left half of the memory cell column $MCC_1$ while covering the entirety of the memory cell columns $MCC_3$ and $MCC_0$, and as a result, the p-type well formed across the boundary between the memory cell columns $MCC_2$ and $MCC_3$ the p-type well at the right edge of the memory cell column $MCC_3$ and the p-type well at the left edge of the memory cell column $MCC_0$ are isolated completely from the p-type silicon substrate 11 by the deep n-type well DNW.

In the Macro_11, the deep n-type well of the Macro_10 is moved in the left direction further by a distance of one memory cell and is formed to extend from the right half of the memory cell column $MCC_1$ to the left half of the memory cell column $MCC_0$ while covering the entirety of the memory cell columns $MCC_2$ and $MCC_3$, and as a result, the p-type well formed at he left edge of the memory cell column $MCC_{03}$ the p-type well formed across the boundary between the memory cell columns $MCC_1$ and $MCC_2$, the p-type well formed across the boundary between the memory cell columns $MCC_2$ and $MCC_3$ and the p-type well at the right edge of the memory cell column $MCC_3$ are isolated completely from the p-type silicon substrate 11 by the deep n-type well DNW.

In the Macro_12, the deep n-type well of the Macro_10 is moved in the right direction by a distance of one memory cell and is formed to extend from the right half of the memory cell column $MCC_3$ to the left half of the memory cell column $MCC_2$ while covering the entirety of the memory cell columns $MCC_0$ and $MCC_1$, and as a result, the p-type well formed at he left edge of the memory cell column $MCC_0$, the p-type well formed across the boundary between the memory cell columns $MCC_0$ and $MCC_1$, the p-type well formed across the boundary between the memory cell columns $MCC_1$ and $MCC_2$ and the p-type well at the right edge of the memory cell column $MCC_3$ are isolated completely from the p-type silicon substrate 11 by the deep n-type well DNW.

In the Macro_13, there are formed deep n-type wells DNW of the size of one memory cell column in the row direction respectively at the boundary between the memory cell column $MCC_0$ and $MCC_1$ and at the boundary between the memory cell column $MCC_2$ and $MCC_3$ with a separation of one memory cell column, and thus, the p-type wells formed at the respective boundaries are isolated from the respective deep n-type wells DNW from the p-type silicon substrate 11 completely.

In Macro_14, the deep n-type well is formed across the boundary between the memory cell columns $MCC_1$ and $MCC_2$ and also at the left half of the memory cell column $MCC_0$ and the right half of the memory cell column $MCC_3$, and thus, the p-type well formed across the boundary between the memory cell columns $MCC_1$ and $MCC_2$ and the p-type wells formed respectively at the left half of the memory cell column $MCC_0$ and at the right half of the memory cell column $MCC_3$ are isolated from the p-type silicon substrate by the deep n-type well DNW.

The Macro_15 corresponds to the case in which the deep n-type well DNW at the right edge of the Macro_14 is eliminated, while the Macro_16 corresponds to the case in which the deep n-type sell DNW at the left edge of the Macro_14 is eliminated.

By combining these macros, it is possible to construct the SRAMS having various constructions for the column groups $CG_1$, $CG_2$, $CG_3$, $CG_4$ . . . . Even in these cases, one of the p-type wells included in the foregoing column groups are isolated from the p-type silicon substrate by the deep n-type wells formed right underneath, and thus, it is possible to block the propagation of the soft error caused in the p-type well in the SRAMs of such a construction even though it is not possible to disconnect all of the soft error propagation paths. Thereby, resistance of the SRAMs against soft errors is improved. Further, with the present embodiment, the deep n-type wells do not extend over a plurality of column groups, and as a result, it becomes possible to improve the resistance of the SRAMs against the soft errors that are caused as a result of propagation of these deep n-type wells.

While it is possible to consider 324 combinations (=18×18) for the combination of these macros between two adjacent columns, the construction in which the Macro_0 and the Macro are aligned corresponds to the comparative example of FIG. 9A and has to be eliminated. Further, the combination of the Macro_17 and the Macro_17 are equivalent of the construction of FIG. 9B and has to be eliminated. Further, the arrangement in which the Macro_11 is disposed at the right side of the Macro_12 has to be eliminated in view of the fact that such an arrangement results in the construction in which the size of the deep n-type well in the row direction exceeds one column group. Thus, the possible total number of combinations of the macros conceivable with the present embodiment becomes 321.

While explanation is not attempted for all of these combinations, an example will be considered here in which the Macro_2 and Macro_11 are arbitrarily combined. In the construction in which the memory cell columns $MCC_0$-$MCC_3$ are selected consecutively in each of the column groups $CG_1$ and $CG_2$ as in the case of ordinary column selection circuit, it will be noted that, in the event the memory cell column $MCC_2$ is selected in the column selection circuit $CS_1$, the memory cell column $MCC_2$ is selected in the column selection circuit $CS_2$. Here, it will be noted that the p-type well constituting the memory cell column $MCC_2$ in the column group $CG_2$ is isolated from the p-type silicon substrate 11 by the deep n-type well $DNW_3$, and thus, there occurs no propagation of the effect of charged particles caused in one of the p-type wells to the other p-type well. Further, because the size of the deep n-type well $DNW_3$ in the row direction does not exceed the size of three memory cell columns, the effect of the impinged charged particles into the n-type well of the memory cell column $MCC_2$ in the column group $CG_2$ does not propagate to the n-type well of the memory cell column $MCG_2$ of the column group $CG_1$.

Thus, while the construction of FIG. 25 cannot block the propagation of the soft error completely, the construction is still effective for improving the resistance of the SRAM against the soft error.

Further in the embodiment of FIG. 25, it should be noted that the isolation of the p-type well by the deep n-type well $DNW_3$ in the memory cell columns $MCC_2$ and $MCC_3$ is maintained even when the combination of the bit lines BL0-BL3 and further the memory cell columns $MCC_0$-$MCC_3$ selected in correspondence thereto is changed arbitrarily.

FIG. 26 represents such combination of the bit lines $BL_0$-$BL_3$ and the memory cell columns $MCC_0$-$MCC_3$ selected in correspondence thereto for the case in which one column group includes four memory cell columns.

Referring to FIG. 26, there appear 24 combinations WIRE0-WIRE23 in this case, and thus there are in all 7704 combinations (=321×24) when this 24 combinations is taken into consideration.

Here, it should be noted that the embodiment explained with reference to FIGS. 17-19 corresponds to the case in which the Macro_9 of FIG. 24 is used in each of the column groups $CG_1$-$CG_4$ and the construction of WIRE0 of FIG. 26 is used in the column groups $CG_1$ and $CG_3$ and the construction of WIRE7 of FIG. 26 is used in the column groups $CG_2$ and $CG_4$. In this case, propagation of soft error can be blocked for every propagation path as explained previously.

Further, it should be noted that the embodiment explained with reference to FIGS. 20A and 20B corresponds to the case in which the Macro_9 of FIG. 24 is used in each of the column groups $CG_1$-$CG_4$ and the construction of WIRE0 of FIG. 26 is used in the column groups $CG_1$ and $CG_3$ and the construction of WIRE10 of FIG. 26 is used in the column groups $CG_2$ and $CG_4$. In this case, too, propagation of soft error can be blocked for every propagation path as explained previously.

Further, it should be noted that the embodiment explained with reference to FIGS. 21A and 21B corresponds to the case in which the Macro_10 of FIG. 24 is used in each of the column groups $CG_1$-$CG_4$ and the construction of WIRE0 of FIG. 26 is used in the column groups $CG_1$ and $CG_3$ and the construction of WIRE7 of FIG. 26 is used in the column groups $CG_2$ and $CG_4$. In this case, too, propagation of soft error can be blocked for every propagation path as explained previously.

Further, the foregoing explanation holds even when the p-type and n-type are interchanged.

While the present invention has been explained for preferred embodiments, the present invention is not limited to such specific embodiments and various variations and modifications may be made within the scope of the invention described in patent claims.

According to the foregoing aspect, it becomes possible, in the event there has been caused a soft error in the first conductivity type well of the first memory cell column of the first column group by an incoming radiation particle or the like, to prevent propagation of the soft error to another first conductivity type well of the second memory cell column of the second column group adjacent to the first column group and selected simultaneously with the first memory cell column of the first column group, by providing the deep well of second conductivity type. Further, even when there is caused a soft error in the second conductivity type well of the first memory cell column of the first column group, it becomes possible to prevent propagation of the soft error to another second conductivity type well of the second memory cell column in the second column group adjacent to the first column group and selected simultaneously with the first memory cell column of the first column group, via a path through the deep well of the second conductivity type, by forming the deep well of the second conductivity type to have a size in the row direction not exceeding a size of a column group. Thus, it becomes possible to improve the resistance against soft error in the static random access memory devices.

Thus, the present disclosures have been described herein with reference to preferred embodiments. While the present disclosures have been shown and described with particular examples, it should be understood that various changes and modifications may be made to the particular examples without departing from the scope of the broad spirit and scope of the present disclosures as defined in the claims.

All examples and conditional language used herein are intended for pedagogical purposes to aid the reader in understanding the principles of the disclosures and the concepts contributed by the inventor to furthering the art, and are to be construed as being without limitation to such specifically recited examples and conditions, nor does the organization of such examples in the specification relate to a showing of the superiority or inferiority of the disclosures. Although the embodiment of the present disclosures has been described in detail, it should be understood that various changes, substitutions, and alterations could be made hereto without departing from the spirit and scope of the disclosures.

What is claimed is:

1. A static random access memory comprising:
    a common well of a first conductivity type formed in a semiconductor substrate;
    a memory cell array formed in said common well and including a plurality of memory cells arranged in a row and column formation such that a group of memory cells aligned in a column direction and connected commonly to a bit line constitute a memory cell column, said plurality of memory cell columns forming a plurality of column groups each including therein a plurality of memory cell columns, said plurality of column groups being repeated in a row direction;
    a column selection circuit provided to each of said column groups, said column selection circuit being configured to be supplied with a part of address data and selecting consecutively a specific memory cell from said column group corresponding thereto;
    in each of said plurality of memory cell columns of said memory cell array, there extends a second conductivity type well of a second conductivity type opposite to said first conductivity type for those MOS transistors having a source region and a drain region of said first conductivity type and there extends a first conductivity type well of said first conductivity type for those MOS transistors having a source region and a drain region of said second conductivity type, such that said second conductivity type well and said first conductivity type well extend adjacent with each other in said column direction, in first and second column groups that are adjacent with each other, one of the first conductivity type well of said first memory cell column selected by said first column group and the first conductivity type well of said second memory cell column selected at the same time by said second column group, is isolated from said common well by a deep well of said second conductivity type, said deep well of said second conductivity type being formed deeper than any of said first conductivity type well and said second conductivity type well, said deep well of said second conductivity type has a size not exceeding a size of a column group in said row direction.

2. The static random access memory as claimed in claim 1, wherein said deep well of said second conductivity type is formed with respect to an adjacent deep well of said second conductivity type with a separation not exceeding said size of a column group in said row direction.

3. The static random access memory as claimed in claim 2, wherein said deep well of said second conductivity type has a size in said row direction larger than a size in which a size of two memory cells in said row direction is subtracted from said size of a column group in said row direction.

4. The static random access memory as claimed in claim 3, wherein said deep well of said second conductivity type is included within said column group corresponding thereto when viewed from a direction perpendicular to a surface of said semiconductor substrate.

5. The static random access memory as claimed in claim 3, wherein said deep well of said second conductivity type is formed to extend from a column group to an adjacent column group when viewed from a direction perpendicular to a surface of said semiconductor substrate.

6. The static random access memory as claimed in claim 3, wherein said plurality of column groups include first column groups and second column groups arranged alternately in said memory cell array, each of said first column groups includes a first column selection circuit as said column selection circuit for said first column group, each of said first column selection circuits selects consecutively a plurality of memory cell columns formed consecutively on said semiconductor substrate from a first edge to a second edge of said first column group in said row direction, and each of said second column groups includes a second column selection circuit as said column selection circuit for said second column group, each of said second column selection circuits selects a plurality of memory cell columns formed on said semiconductor substrate consecutively from a first edge to a second edge of said second column group with a sequence different from a sequence said first column selection circuit.

7. The static random access memory as claimed in claim 6, wherein, in the event said first column selection circuit selects a memory cell column at an edge of a first deep well formed of said deep well of said second conductivity type right underneath said first column group, said second column selection circuit selects, instead of selecting a memory cell column at an edge of a second deep well formed of said deep well of said second conductivity type right underneath said second column group, a memory cell column located at an inner side of said memory cell column at said edge of said second deep well, when viewed from said second deep well.

8. The static random access memory as claimed in claim 6, wherein, in the event said first column selection circuit selects a memory cell column at an edge of a first deep well formed of said deep well of said second conductivity type right underneath said first column group, said second column selection circuit selects, instead of selecting a memory cell column at an edge of a second deep well formed of said deep well of said second conductivity type right underneath said second column group, a memory cell column located at an inner side of and next to said memory cell column at said edge of said second deep well, when viewed from said second deep well.

9. The static random access memory as claimed in claim 6, wherein, in the event said first column selection circuit selects a memory cell column at an edge of a first deep well formed of said deep well of said second conductivity type right underneath said first column group, said second column selection circuit selects, instead of selecting a memory cell column at an edge of a second deep well formed of said deep well of said second conductivity type right underneath said second column group, a memory cell column located at an inner side of said memory cell column at said edge of said second deep well and offset therefrom by two memory cells, when viewed from said second deep well.

10. The static random access memory as claimed in claim 1, wherein said deep well of said second conductivity type has a size equal to said size of a column group in said row direction, and wherein said deep well of said second conductivity type and an adjacent deep well of said second conductivity type are formed with a separation in said row direction equal to said size of a column group.

11. The static random access memory as claimed in claim 10, wherein said deep well of said second conductivity type is formed across a boundary between said first and second column groups.

12. The static random access memory claimed in claim 10, wherein said deep well of said second conductivity type is formed with a first edge and an opposite edge respectively in coincidence with a first edge and an opposite edge of a column group corresponding to said deep well of said second conductivity type.

13. The static random access memory as claimed in claim 1, wherein said deep well of said second conductivity type is formed, in each of said column groups that are repeated alternately in said row direction, right underneath said first conductivity type well, said deep well of said second conductivity type being formed with a separation from an adjacent deep well of said second conductivity type.

14. The random access memory as claimed in claim 13, wherein each of said deep n-type well of said second conductivity type is formed with a size not exceeding a size of a memory cell column in said row direction.

15. The static random access memory as set forth in claim 1, wherein, in each of said plurality of column groups, said column selection circuit selects consecutively a plurality of memory cell columns aligned on said semiconductor substrate from a first edge to a second edge of a column group corresponding thereto in said row direction.

16. The static random access memory as claimed in claim 1, wherein each of said column groups includes therein at least four memory cell columns.

17. The static random access memory as claimed in claim 1, wherein there is conducted error detection or error correction based on a signal selected by said column selection circuit.

* * * * *